US006499081B1

(12) United States Patent
Nataraj et al.

(10) Patent No.: US 6,499,081 B1
(45) Date of Patent: Dec. 24, 2002

(54) METHOD AND APPARATUS FOR DETERMINING A LONGEST PREFIX MATCH IN A SEGMENTED CONTENT ADDRESSABLE MEMORY DEVICE

(75) Inventors: Bindiganavale S. Nataraj, Cupertino, CA (US); Sandeep Khanna, Santa Clara, CA (US); Varadarajan Srinivasan, Los Altos Hills, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/439,834

(22) Filed: Nov. 12, 1999

Related U.S. Application Data

(63) Continuation-in-part of application No. 09/338,452, filed on Jun. 22, 1999, which is a continuation-in-part of application No. 09/256,268, filed on Feb. 23, 1999, now abandoned, and a continuation-in-part of application No. 09/255,494, filed on Feb. 23, 1999, now abandoned, and a continuation-in-part of application No. 09/255,497, filed on Feb. 23, 1999, now abandoned.

(51) Int. Cl.[7] .............................................. G06F 12/04

(52) U.S. Cl. .................. 711/108; 711/173; 365/189.07; 365/49; 710/49

(58) Field of Search ................................ 711/108, 173; 365/49, 195, 189.07; 710/49

(56) References Cited

U.S. PATENT DOCUMENTS

| 3,257,646 A | 6/1966 | Roth |
| 3,353,159 A | 11/1967 | Lee, III |
| 3,602,899 A | 8/1971 | Lindquist |
| 3,675,211 A | 7/1972 | Raviv |

(List continued on next page.)

FOREIGN PATENT DOCUMENTS

| EP | 0660332 A1 | 6/1995 |
| EP | 0944093 A1 | 9/1999 |
| JP | 08167295 | 6/1996 |
| WO | WO98/12651 | 3/1998 |
| WO | WO 99/31581 | 6/1999 |

OTHER PUBLICATIONS

Pankaj Gupta, et al. "Routing Lookups in Hardware at Memory Access Speeds," *Proc. Infocom* (Apr. 1998), 8 pgs.
Kobayashi, Masayoshi et al., "A 50 Mpps Longest Prefix Match Search Engine IC for Multi–gigabit IP Forwarding", The Institute of Electronics Information and Communication.

(List continued on next page.)

*Primary Examiner*—B. James Peikari
(74) *Attorney, Agent, or Firm*—Blakely, Sokoloff, Taylor & Zafman, LLP

(57) ABSTRACT

A method and apparatus for determining a longest prefix match in a segmented content addressable memory (CAM) device. The CAM device includes multiple CAM array blocks that each may be arbitrarily loaded with CIDR addresses. For one embodiment, each CAM array is a ternary CAM array that includes CAM cells storing CAM data, mask cells storing prefix mask data for the corresponding CAM cells, a CAM match line for indicating a match between a search key and the CAM data (as masked by the prefix mask data), and prefix logic circuits for comparing the logical state of the CAM match line with the prefix mask data. The prefix logic circuits determine the longest prefix in each CAM array block from among CAM entries that match the search key. The longest prefixes from each block are provided to compare circuitry that determines which of the longest prefixes is the longest for the entire CAM device. A block select circuit selects the CAM array block that stores the longest prefix for the entire CAM device for comparison with the prefix mask data in that CAM array block. The CAM index or address of the matching location may then be output from the CAM device. By restricting the search of the device-level longest prefix to only one CAM array block, power drawn by this comparison is reduced over searching all CAM array blocks in parallel.

37 Claims, 33 Drawing Sheets

U.S. PATENT DOCUMENTS

| | | |
|---|---|---|
| 3,685,020 A | 8/1972 | Meade |
| 3,868,642 A | 2/1975 | Sachs |
| 4,112,502 A | 9/1978 | Scheuneman |
| 4,244,033 A | 1/1981 | Hattori |
| 4,472,805 A | 9/1984 | Wacyk |
| 4,523,301 A | 6/1985 | Kadota |
| 4,646,271 A | 2/1987 | Uchiyama |
| 4,656,626 A | 4/1987 | Yudichak |
| 4,670,858 A | 6/1987 | Almy |
| 4,747,080 A | 5/1988 | Yamada |
| 4,758,982 A | 7/1988 | Price |
| 4,780,845 A | 10/1988 | Threewitt |
| 4,785,398 A | 11/1988 | Joyce |
| 4,791,606 A | 12/1988 | Threewitt |
| 4,813,002 A | 3/1989 | Joyce |
| 4,845,668 A | 7/1989 | Sano |
| 4,903,234 A | 2/1990 | Sakuraba |
| 4,928,260 A | 5/1990 | Chuang |
| 4,958,377 A | 9/1990 | Takahashi |
| 4,959,811 A | 9/1990 | Szczepanek |
| 4,975,873 A | 12/1990 | Nakabayashi |
| 4,996,666 A | 2/1991 | Duluk, Jr. |
| 5,010,516 A | 4/1991 | Oates |
| 5,014,195 A | 5/1991 | Farrell |
| 5,036,486 A | 7/1991 | Noguchi |
| 5,051,948 A | 9/1991 | Watabe |
| 5,053,991 A | 10/1991 | Burrows ..................... 365/49 |
| 5,107,501 A | 4/1992 | Zorian |
| 5,111,427 A | 5/1992 | Kobayashi |
| 5,226,005 A | 7/1993 | Lee |
| 5,239,642 A | 8/1993 | Gutierrez |
| 5,265,100 A | 11/1993 | McClure |
| 5,319,590 A | 6/1994 | Montoye |
| 5,319,763 A | 6/1994 | Ho |
| 5,383,146 A | 1/1995 | Threewitt |
| 5,396,449 A | 3/1995 | Atallah et al. |
| 5,414,704 A | 5/1995 | Spinney |
| 5,422,838 A | 6/1995 | Lin |
| 5,440,709 A | 8/1995 | Edgar |
| 5,440,715 A | 8/1995 | Wyland |
| 5,446,685 A | 8/1995 | Holst |
| 5,454,094 A | 9/1995 | Montove |
| 5,455,576 A | 10/1995 | Clark, II |
| 5,469,161 A | 11/1995 | Bezek |
| 5,475,825 A | 12/1995 | Yonezawa |
| 5,485,418 A | 1/1996 | Hiraki |
| 5,490,102 A | 2/1996 | Jubran |
| 5,491,703 A | 2/1996 | Barnaby |
| 5,513,134 A | 4/1996 | Cooperman |
| 5,517,441 A | 5/1996 | Dietz |
| 5,598,115 A | 1/1997 | Holst |
| 5,642,114 A | 6/1997 | Komoto |
| 5,642,322 A | 6/1997 | Yoneda |
| 5,646,878 A | 7/1997 | Samra |
| 5,649,149 A | 7/1997 | Stormon |
| 5,699,288 A | 12/1997 | Kim et al. |
| 5,706,224 A | 1/1998 | Srinivasan |
| 5,745,488 A | 4/1998 | Thompson |
| 5,818,786 A | 10/1998 | Yoneda |
| 5,818,873 A | 10/1998 | Wall |
| 5,841,874 A * | 11/1998 | Kempke et al. .............. 380/50 |
| 5,860,085 A | 1/1999 | Stormon |
| 5,870,324 A | 2/1999 | Helwig et al. |
| 5,893,931 A | 4/1999 | Peng |
| 5,920,886 A | 7/1999 | Feldmeier |
| 5,930,359 A | 7/1999 | Kempke |
| 5,933,363 A | 8/1999 | Shindo |
| 5,940,852 A | 8/1999 | Rangasayee |
| 5,949,696 A | 9/1999 | Threewit |
| 5,949,734 A | 9/1999 | Matano ................. 365/230.03 |
| 6,000,008 A | 12/1999 | Simcoe |
| 6,006,306 A | 12/1999 | Haywood |
| 6,011,795 A | 1/2000 | Varghese et al. ............ 370/392 |
| 6,044,005 A * | 3/2000 | Gibson et al. ................. 365/49 |
| 6,065,064 A | 5/2000 | Satoh et al. ................. 709/249 |
| 6,081,440 A | 6/2000 | Washburn et al. ............ 365/49 |
| 6,108,227 A | 8/2000 | Voelkel |
| 6,144,574 A | 11/2000 | Kobayashi et al. |
| 6,181,698 B1 | 1/2001 | Hariguchi |
| 6,237,061 B1 * | 5/2001 | Srinivasan et al. ......... 711/108 |
| 6,266,262 B1 | 7/2001 | Washburn |
| 6,289,414 B1 * | 9/2001 | Feldmeier et al. .......... 711/108 |

OTHER PUBLICATIONS

Engineers, Technical Report of IEICE, IN08–119 (1998–11), 15 pages.

Kobayashi, Masayoshi et al., "A 50 Mpps Longest Prefix Match Search Engine LSI for Multi–gigabit IP Forwarding", The Institute of Electronics Information and Communication.

Engineers, Technical Report of IEICE, IN08–119 (1998–11), pp. 7–12.

Motorola Semiconductor Technical Data, "Advance Information 16K × 64 CAM", MCM69C432, Jan. 1996, pp. 4 pages.

GEC Plessey Semiconductors, "P2800 Multi–port Content Addressable Memory", Functional Product Specification GPS–FPS–2800–12, Jan. 1996, pp. 1–102.

Advanced Micro Devices, "Final Am99C10A 256 × 48 Content Addressable Memory" Publication No. 08125, Rev. G, Dec. 1992, pp. 1–21.

Music Semiconductors, "MU9C2480 Lancam Preliminary Data Sheet", Aug. 25, 1995, pp. 1–24.

GEC Plessey Semiconductors Preliminary Information, "P2800 2K × 64 Bit Multiport Content Addressable Memory", Feb. 1997, pp. 1–15.

Music Semiconductors, "The MU9C1480 Lancam Handbook", Rev. 3, Nov. 1994, pp. 1–1 through 7–12.

Music Semiconductors, "MU9C1480 Lancam" Advance Information, Mar. 22, 1990, pp. 1–11.

KLSI, "Address Processor", KE5B064H series–Dual Port and Fixed Table Type–, Version 1.0.1, published approximately late 1995 or early 1996, pp. 1–1 through 14–1.

KLSI, "KE5B064A1 Address Processor", Version 2.0.2, published approximately late 1995 or early 1996, pp. 1–1 through 12–1.

Music Semiconductors, "MuAA™ CAM Family" Advance Information, Feb. 24, 1998, Rev. 0, pp. 1–16.

Soo–ik Chae et al., "Content–Addressable Memory forVLSI Pattern Inspection", IEEE Journal of Solid State Circuits, vol. 23, No. 1, Feb. 1988, pp. 74–78.

Yong–Chul Shin et al., "A Special–Purpose Content Addressable Memory Chip for Real–Time Image Processing", IEEE Journal of Solid–State Circuits, vol. 27, No. 5, May 1992, pp. 737–744.

Sergio R. Ramirez–Chavez, "Encoding Don't Cares in Static and Dynamic Content–Addressable Memories", Transaction Briefs, IEEE Transactions on Circuits and System–II: Analog and Digital Signal Processing, vol. 39, No. 8, Aug. 1992, pp. 575–578.

Ian N. Robinson, Hewlett–Packard Laboratories, "Pattern–Addressable Memory", Jun. 1992, pp. 20–30.

Keikichi Tamaru, "The Trend of Functional Memory Development", Invited Paper Special Issue on LSI Memories, IEICE Trans. Electron, vol. E76–C, No. 11, Nov. 1993, pp. 1545–1554.

Hiroshi Kadota et al., "An 8kbit Content–Addressable and Reentrant Memory", IEEE Journal of Solid–State Circuits, vol. SC–20, No. 5, Oct. 1985, pp. 951–956.

Simon R. Jones et al., "A 9–kbit Associative Memory for High speed Parallel Processing Applications", IEEE Journal of Solid–State Circuits, vol. 23, No. 2, Apr. 1988, pp. 543–548.

Anthony J. McAuley et al., "A Self–Testing Reconfigurable CAM", IEEE Journal of Solid State Circuits, vol. 26, No. 3, Mar. 1991, pp. 257–261.

Landrock et al., "Associative Storage Module", IBM Technical Disclosure Bulletin, vol. 25, No. 5, Oct. 1982, pp. 2341–2342.

Masao Akata, "A Scheduling Content–Addressable Memory for ATM Space–Division Switch Control", IEEE International Solid–State Circuits Conference, Feb. 1991, New York.

Ghose et al., "Response Pipelined CAM Chips: The First Generation and Beyond", $7^{th}$ International conference on VLSI Design, Jan. 1994, pp. 365–368.

Kobayashi M. et al., "A Processor Based High–Speed Longest Prefix Match Search Engine", IEEE Workshop on High Performance Switching and Routing, p.(s) 233–239, 2001.

Kobayashi M. et al. "A Longest Prefix Match Search Engine For Multi–Gigabit IP Processing", IEEE International Conference on Communications, vol. 3, p.(s) 1360–1364. 2000.

Takeshi Ogura et al., "A 4kbit Associative Memory LSI", IEEE Journel of Solid–State Circuits, vol. SC–20, No. 6, Dec. 1985, pp. 1277–1281.

Hayashi, T. et al., "High–Speed Table Lookup Engine For Ipv6 Longest Prefix Match", Global Telecommunications Conference, vol. 2, p.(s) 1576–1581, 1999.

Huang et al., "a Novel IP–Routing Lookup Scheme and Hardware Architecture For Multigigabit Switching Routers", IEEE Journal Selected Areas in Communications, pp(s) 1093–1104, Jun. 1999.

Huang et al., "A Fast IP Routing Lookup Scheme For Gigabit Switching Routers", Eighteenth Annual Joint Conference of the IEEE Computer and Communications Societies, vol. 3, pp(s) 1429–1436, 1999.r.

High Speed Address Search Engine, Document No. S13450EJ3V0PF00 ($3^{rd}$ edition), published Feb. 1999, ©NEC Corporation, 2 pages.

Japanese Patent Abstract, Publication No. 04021997 A, published Jan. 24, 1992, 1 page.

Japanese Patent Abstract, Publication No. 05182472 A, published Jul. 23, 1993, 1 page.

Mosaid, The Next Generation of Content Addressable Memories, Mosaid Technologies Incorporated, Sep. 1999, 8 pages.

C. C. Wang and I. H. Horng, Realization of Bidirection Associative Memory Using a Pseudo–Parallel Searching Approach, 1995 IEEE International Conference on Neural Networks, vol. 3, pp. 1502–1507, Dec. 1995.

* cited by examiner

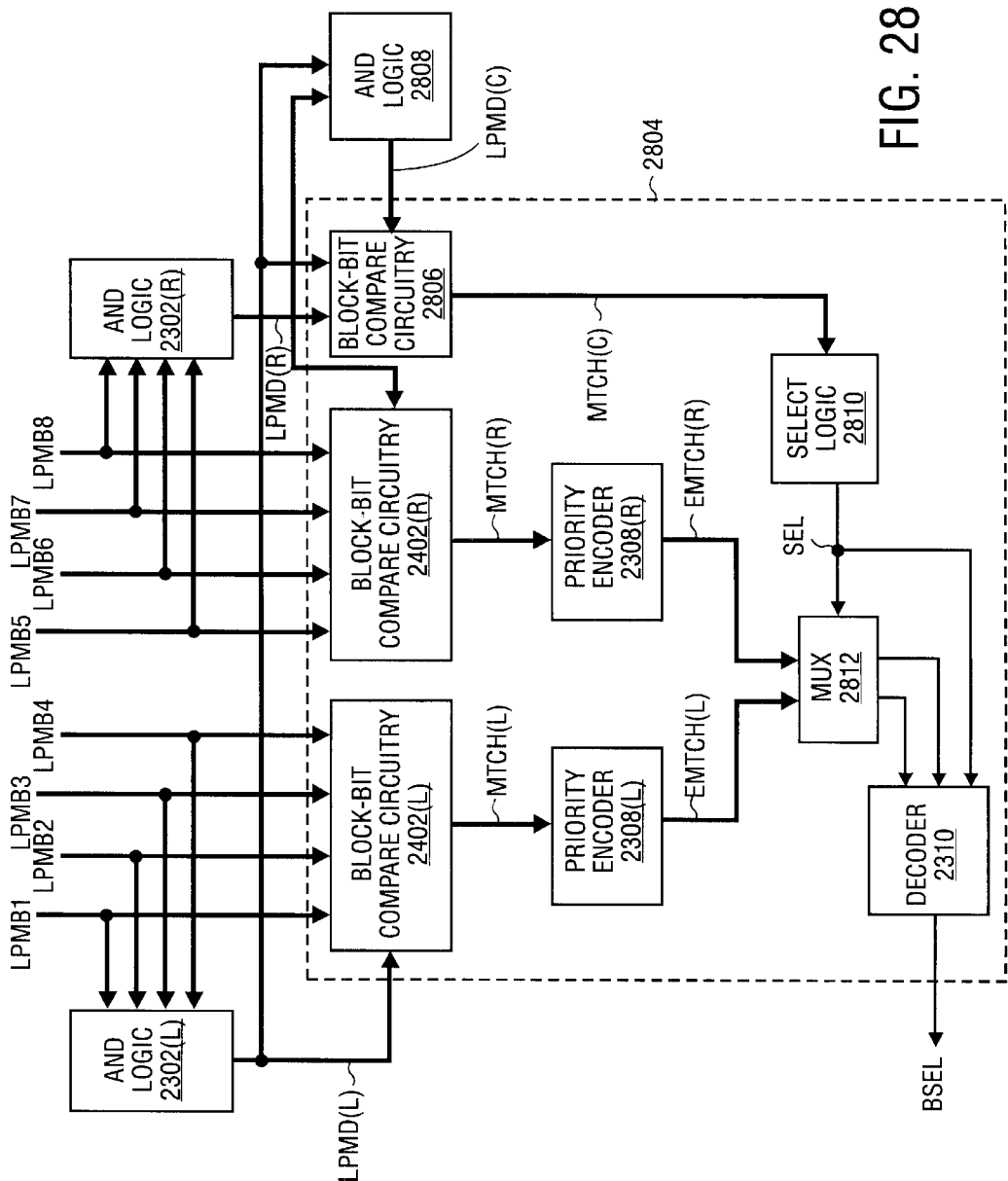

METHOD AND APPARATUS FOR DETERMINING A LONGEST PREFIX MATCH IN A SEGMENTED CONTENT ADDRESSABLE MEMORY DEVICE

CROSS-REFERENCE TO RELATED APPLICATIONS

This application is a continuation-in-part of, and claims the benefit of, co-pending U.S. application Ser. No. 09/338,452 filed on Jun. 22, 1999 and entitled "METHOD AND APPARATUS FOR DETERMINING A LONGEST PREFIX MATCH IN A CONTENT ADDRESSABLE MEMORY DEVICE," which is a continuation-in-part of, and claims the benefit of, U.S. application Ser. No.:09/256,268 filed on Feb. 23, 1999 and entitled "METHOD AND APPARATUS FOR DETERMINING A LONGEST PREFIX MATCH IN A CONTENT ADDRESSABLE MEMORY DEVICE", now abandoned, Ser. No. 09/255,494 filed on Feb. 23, 1999 and entitled "METHOD AND APPARATUS FOR DETERMINING A LONGEST PREFIX MATCH IN A DEPTH CASCASED CONTENT ADDRESSABLE MEMORY SYSTEM", now abandoned, and Ser. No. 09/255,497 filed on Feb. 23, 1999 and entitled "TERNARY CONTENT ADDRESSABLE MEMORY CELL", now abandoned.

FIELD OF THE INVENTION

The present invention relates generally to content addressable memory (CAM) devices.

BACKGROUND

The Internet Protocol (IP) is used to relay packets of information in the Internet. IPv4 is a common addressing scheme that includes a 32-bit binary address represented in dotted decimal notation of the form M.N.O.P where M, N, O, and P are decimal values ranging from 0 to 255. The 32-bit address is segmented into Network and Host address fields and can be implemented in a classfull or classless model. In the classfull model, the IPv4 address is segmented into Class A, B, and C addresses each having a number of the 32 bits designated for the Network address field and the remainder of the 32 bits designated for the Host address field. The classfull scheme has generally resulted in wasted addresses and large IP address tables.

In the Classless Inter Domain Routing (CIDR) scheme, the traditional classfull segmentation is replaced with an IP address that has a generalized network prefix that generally ranges from 13 to 27 bits of the 32-bit IPv4 address. The network prefix or mask indicates the number of left-most contiguous bits in the IP address that are used to filter an IP address in a routing table. That is, the network prefix indicates the number of higher-order or left-most contiguous bits in the IP address that participate in an address comparison with the routing table. A CIDR address is typically written as the IPv4 address followed by "/Z" where Z indicates the prefix length in decimal notation. An IPv4 address followed by the prefix length /Z will hereafter be referred to as a "CIDR address".

Routing table entries typically include the IP addresses and their corresponding prefixes. FIG. 1 shows a routing table having five CIDR addresses where an "X" entry indicates that these bits do not participate in a search with a search key. Any search key whose most significant eight bits have the decimal equivalent of 168 will potentially match all of the entries. For example, 168.0.0.0/8, 168.64.0.0/12, and 168.69.0.0/16 all match the search key of 168.69.43.100. However, it is desirable that a search would yield 168.69.0.0/16 as this entry has the largest number of unmasked most significant bits that match the search key.

Routing table entries are typically stored in a CAM device that can rapidly perform a search against the search key to locate the longest matching CIDR address. As there may be multiple matching entries, CAM devices typically include a priority encoder that selects a matching entry that has the lowest logical or numerical address in the CAM array. For example, if a CAM device stores the table of FIG. 1 in a prearranged order such that 168.69.62.0/24 is stored in a lower logical address than 168.0.0.0/8 (as shown in FIG. 1), then the CAM device would correctly indicate the longest matching CIDR address as 168.69.0.0/16. If, however, the entries were stored in an arbitrary manner as indicated in FIG. 2, then the CAM device would incorrectly indicate a match of 168.64.0.0/12 as this entry is located at a lower logical address than 168.69.0.0/16 and 168.0.0.0/8. 168.64.0.0/12 is not, however, the longest matching CIDR address. Thus, CIDR addresses are generally pre-sorted or prearranged prior to entry into a CAM device such that the CIDR address with the longest network prefix is located in the lowest logical address of the CAM device, and the CIDR address with the shortest network prefix is located in the highest logical address of the CAM device.

A considerable amount of time is generally required to prearrange all of the CIDR address entries prior to loading the entries into a CAM device. Additionally, a considerable amount of time and overhead is also generally required to maintain the order of the routing table when entries are deleted or overwritten, or when new entries are to be added. A typical routine for updating the table includes a bubble sorting algorithm that generally takes many clock cycles to read the entries in the table, compare the entries, and then reload the table. Another approach segments the CAM array into separately addressable hierarchical blocks that each store entries associated only with certain prefixes. However, this approach has the disadvantages of wasting unused CAM locations, and of limiting the number of entries into any one block. This approach also requires that the CAM array be loaded with CIDR addresses in a prearranged fashion.

SUMMARY OF THE INVENTION

A method and apparatus for determining a longest prefix match in a content addressable memory (CAM) device is described. The CAM device includes a CAM array that may be arbitrarily loaded with CIDR addresses that are not prearranged prior to their entry into the CAM device. For one embodiment, the CAM array is a ternary CAM array that includes CAM cells storing CAM data, mask cells storing prefix mask data for the corresponding CAM cells, a CAM match line for indicating a match between a search key and the CAM data (as masked by the prefix mask data), prefix match lines, and prefix logic circuits for comparing the CAM match line with the prefix mask data. The prefix logic circuits determine the longest prefix among the CAM locations that match the search key, regardless of where the matching locations are logically located in the CAM array. The longest prefix is then compared against the prefix mask data stored in the mask cells to determine the location in the CAM array that stores the CIDR address corresponding to the longest prefix. The CAM index or address of the matching CIDR address may then be output from the CAM device. Additionally and/or alternatively, additional or associated data stored at the CAM index may be accessed. The additional or associated data may be, for example, routing information for the stored CIDR address.

A method and apparatus for determining a longest prefix match in a segmented content addressable memory (CAM) device is also described. The CAM device includes multiple CAM array blocks that each may be arbitrarily loaded with CIDR addresses. For one embodiment, each CAM array is a ternary CAM array that includes CAM cells storing CAM data, mask cells storing prefix mask data for the corresponding CAM cells, a CAM match line for indicating a match between a search key and the CAM data (as masked by the prefix mask data), and prefix logic circuits for comparing the logical state of the CAM match line with the prefix mask data. The prefix logic circuits determine the longest prefix in each CAM array block from among CAM entries that match the search key. The longest prefixes from each block are provided to compare circuitry that determines which of the longest prefixes is the longest for the entire CAM device. A block select circuit selects the CAM array block that stores the longest prefix for the entire CAM device for comparison with the prefix mask data in that CAM array block. The CAM index or address of the matching location may then be output from the CAM device. By restricting the search of the device-level longest prefix to only one CAM array block, power drawn by this comparison is reduced over searching all CAM array blocks in parallel.

Other objects, features, and advantages of the present invention will be apparent from the accompanying drawings and from the detailed description, which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 28 is a block diagram of another embodiment of two groups of longest prefix match circuitry and block select circuitry of FIG. 24.

DETAILED DESCRIPTION

Figure 1:
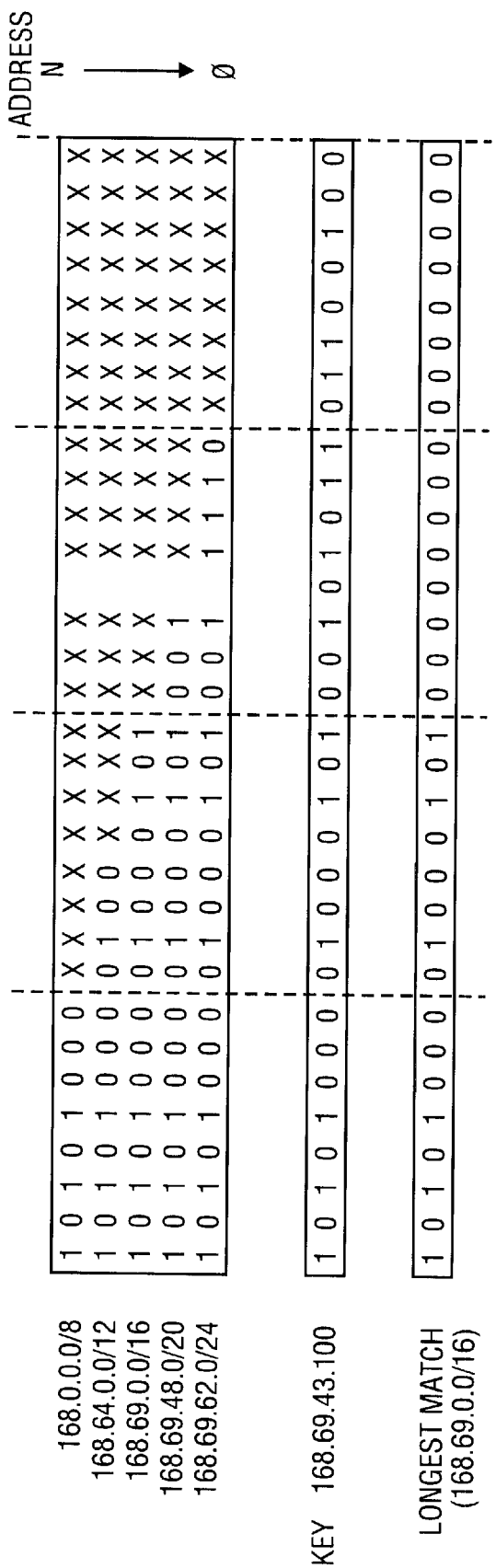
FIG. 1 illustrates pre-sorted CIDR addresses in a routing table.
Figure 2:
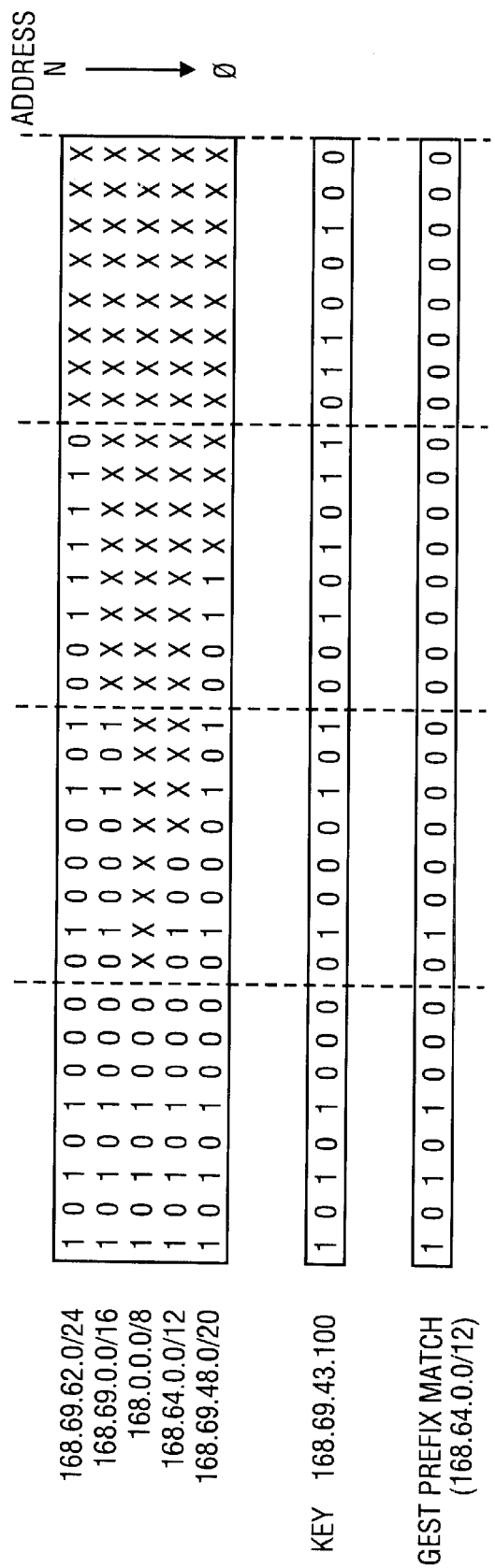
FIG. 2 illustrates unsorted CIDR addresses in a routing table.

In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicates that the signal is an active low signal. Each of the active low signals may be changed to active high signals as generally known in the art.

A method and apparatus for determining a longest prefix match in a content addressable memory (CAM) device is described. The CAM device includes a CAM array that may be arbitrarily loaded with CIDR addresses that are not prearranged prior to their entry into the CAM device. This may save considerable amounts of time and overhead in initially loading and subsequently updating the CAM array. For one embodiment, the CAM array is a ternary CAM array that includes CAM cells storing CAM data, mask cells storing prefix mask data for the corresponding CAM cells, a CAM match line for indicating a match between a search key and the CAM data (as masked by the prefix mask data), prefix match lines, and prefix logic circuits for comparing the CAM match line with the prefix mask data. The prefix logic circuits determine the longest prefix among the CAM locations that match the search key, regardless of where the matching locations are logically located in the CAM array. The longest prefix is then compared against the prefix mask data stored in the mask cells to determine the location in the CAM array that stores the CIDR address corresponding to the longest prefix. The CAM index or address of the matching CIDR address may then be output from the CAM device. Additionally and/or alternatively, additional or associated data stored at the CAM index may be accessed. The additional or associated data may be, for example, routing information for the stored CIDR address.

The CAM device of the present invention may also perform a search or compare operation for a CIDR address that has the longest matching prefix data significantly faster than conventional CAM devices. The CAM device of the present invention may not need internal or external logic to pre-sort the CIDR addresses, and may not need to re-sort the CIDR address entries when new addresses are added or deleted from the CAM array. As will be described in more detail below, each new CIDR address may be added at the next free address or any other designated address. Additionally, no space in the CAM array is wasted segmenting the CAM array into pre-sorted prefix blocks.

For another embodiment, the CAM array is segmented into a number of CAM array blocks. Prefix logic circuits determine the longest prefix in each CAM array block from among CAM entries that match the search key. For one embodiment, the longest prefix for each CAM array block is then compared with the prefix mask data in that block and the match results provided to a priority encoder to determine the highest priority matching address. For another embodiment, the longest prefixes from each block are provided to compare circuitry that determines which of the longest prefixes is the longest for the entire CAM device. A block select circuit selects the CAM array block that stores the longest prefix for the entire CAM device for comparison with the prefix mask data in that CAM array block. The CAM index or address of the matching location may then be output from the CAM device. By restricting the search of the device-level longest prefix to only one CAM array block, power drawn by this comparison is reduced over searching all CAM array blocks in parallel.

Figure 3:
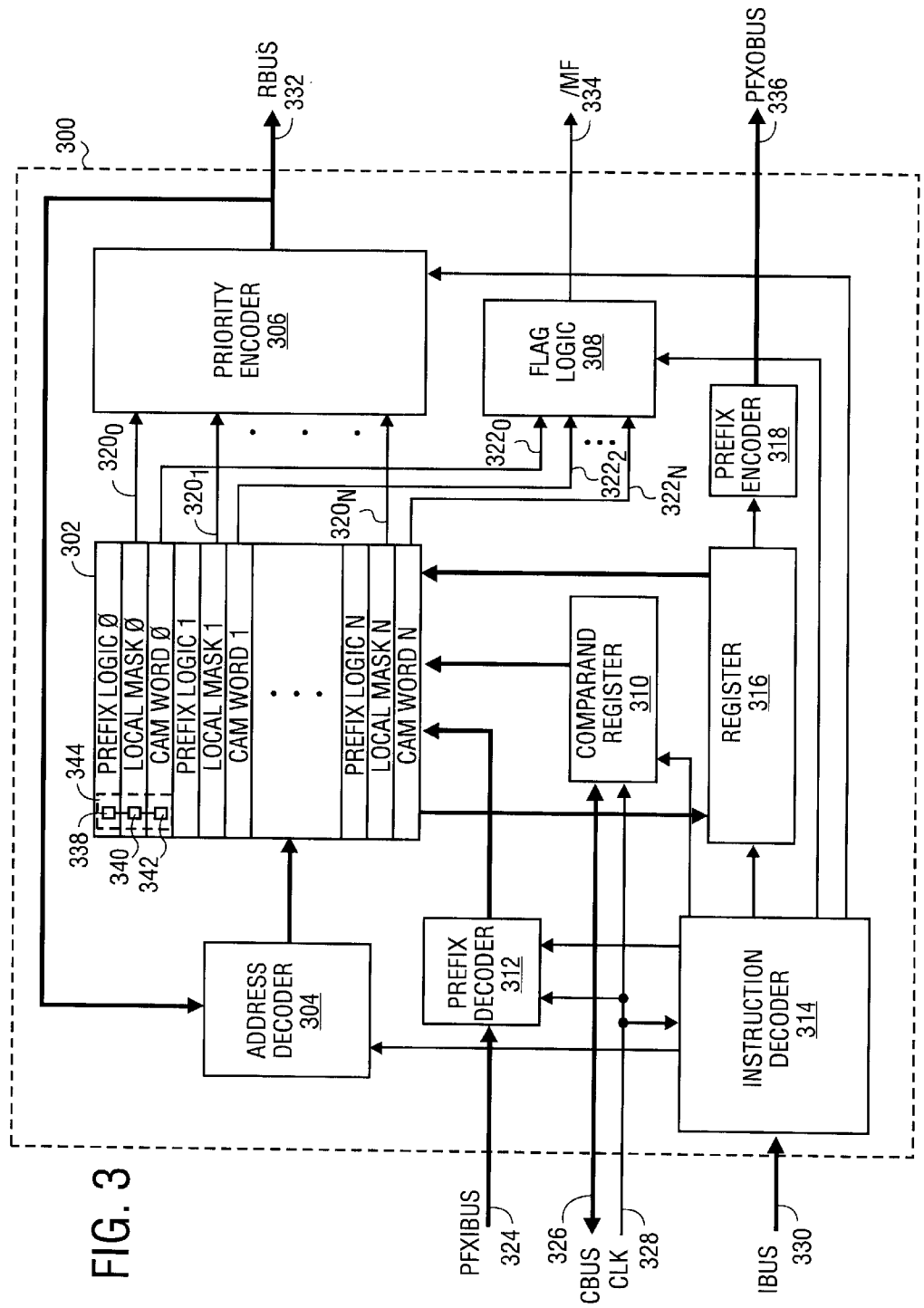
FIG. 3 is a block diagram of one embodiment of a CAM device according to the present invention.

FIG. 3 shows CAM device 300 that is one embodiment of the present invention. CAM 300 is a synchronous ternary CAM device that performs its operations in response to an external clock signal CLK on line 328. It will be appreciated, however, that alternative embodiments of the present invention may be implemented in asynchronous CAM devices.

CAM 300 includes CAM array 302, address decoder 304, priority encoder 306, flag logic 308, comparand register 310, prefix decoder 312, instruction decoder 314, register 316, and prefix encoder 318.

CAM array 302 is a ternary CAM array that can effectively store three states of information, namely: a logic one state, a logic zero state, and a don't care state for search or compare operations. CAM array 302 includes CAM words 0 to N, corresponding local mask words 0 to N, and corresponding prefix logic circuits 0 to N, wherein N is any integer value.

CAM words 0 to N are each capable of storing an IPv4 address (or other address) that may be received by CAM 300 comparand bus CBUS 326. For other embodiments, the CAM words may store other address information or any other data. Each CAM word may include any number and any type of CAM memory cells 342. Each CAM memory cell 342 may include a memory cell and compare logic.

Each CAM word 0 to N is coupled to a CAM match line $322_0$ to $322_N$, respectively. The CAM match lines indicate whether comparand data (provided on CBUS 326 or stored in comparand register 310) match data stored in CAM words 0 to N. CAM match lines $322_0$ to $322_N$ are provided to flag logic 308 which generates a match flag signal /MF on line 334 indicating whether a match has occurred. Additional flags such as a multiple match flag may also be generated by flag logic 308. Flag logic 308 may also be incorporated into priority encoder 306.

Each CAM word 0 to N has an associated local mask word 0 to N that stores prefix mask data for the CAM word. For other embodiments, any other mask data may be stored in local mask words 0 to N. In contrast to global mask registers that mask entire columns of CAM cells, the local mask words include local mask cells 340 that mask individual CAM cells 342 of a corresponding CAM word on a bit-by-bit basis. The local mask cells may include memory cells for storing mask data. Each local mask word may include as many local mask cells 340 as there are corresponding CAM cells 342. For an alternative embodiment, there may be only as many local mask cells 340 as are required for masking corresponding CAM cells 342. For example, there may be less local mask cells 340 than CAM cells 342 if each of the CAM cell 342 will need not need to be masked. This situation may occur, for example, if only 13 to 27 bits of the address stored in CAM cells 342 are masked when implementing a CIDR scheme, then the first 12 bits and/or remaining 5 bits may not need corresponding local mask cells.

When a CIDR address is supplied to CAM 300 for a write operation, the IPv4 address is supplied on CBUS 326 and the prefix data is supplied on PFXIBUS 324. The prefix data may be generated by external control logic that may be found, for example, in a router incorporating CAM 300. The prefix data may be encoded onto PFXIBUS so as to reduce the number of the signal lines required for PFXIBUS 324. The encoded prefix data may be decoded by prefix decoder 312 and supplied as prefix mask data to the local mask words. Thus, if each local mask word has $2^n$ bits, then PFXIBUS 324 may carry n encoded bits of prefix data to be decoded by prefix decoder 324. For one example, a CIDR address with a binary encoded prefix of 11000 (24 decimal) may be supplied on PFXIBUS 324. The encoded prefix may be decoded by prefix decoder 312 into 11111111 11111111 11111111 00000000 such that the 24 left-most contiguous bits are logic ones and the 8 right-most contiguous bits are logic zeros. Prefix decoder 312 (or other logic) may then logically complement this data to form prefix mask data of 00000000 00000000 00000000 11111111 such that the 24 left-most contiguous bits are logic zeros, and the 8 right-most contiguous bits are logic ones. This prefix mask data can then be loaded into a local mask word for a given CAM word that stores a corresponding address. A logic zero in a local mask cell 340 indicates that the address bit stored in the corresponding CAM cell 342 is not masked. For an alternative embodiment, prefix decoder 312 may not logically complement the mask data prior to loading it into the local mask cells.

The encoded prefix data may be supplied on PFXIBUS 324 simultaneously with the corresponding address supplied on CBUS 326 such that they may be concurrently written to their respective local mask words and CAM words in CAM array 302. The encoded prefix data may also be supplied to CAM 300 at a different time from the corresponding address. For another embodiment, the encoded prefix data may be multiplexed on CBUS 326 with the address data. For yet another embodiment, prefix decoder 312 may be omitted and the prefix data may be supplied to CAM 300 in an unencoded format to be loaded into a local mask word.

Each CAM cell/local mask cell pair also has a corresponding prefix logic circuit 338 that logically compares the local mask data with the logical state of an associated CAM match line. Thus, each CAM cell 342/local mask cell 340/prefix logic circuit 338 group may be considered a ternary CAM cell or a mask-per-bit CAM cell 344. As will be further illustrated below, the prefix logic determines the longest prefix from among all of the CAM words that match a search key or comparand data (provided from comparand register 310 or directly from the comparand bus CBUS 326). The longest prefix is the prefix mask data that has the largest number of left-most (higher-order) contiguous logic zero bits stored in a local mask word for a CAM location that stores an address matching the comparand data. The prefix logic circuits determine the longest prefix among the matching addresses regardless of the location of the matching addresses in CAM array 302. No pre-sorting or prearranging of the addresses stored in CAM array 302 is required.

Once the longest prefix is determined, it may be stored in register 316 and provided to prefix encoder 318. Prefix encoder 318 may encode the longest prefix (e.g., of up to $2^n$ bits) and output the encoded prefix (e.g., of n bits) onto prefix output bus PFXOBUS 336. When the prefix mask data is stored with logic zeros in the left-most bits, prefix encoder 318 may first complement the longest prefix and then encode the data into a binary number, hexadecimal number, or a number in any other format. For an alternative embodiment, prefix encoder 318 does not first logically complement the prefix data.

For another embodiment, register 316 may be omitted and the longest prefix provided directly to prefix encoder 318. For yet another embodiment, prefix encoder 318 may be omitted and an unencoded longest prefix may be output to PFXOBUS 336. For still another embodiment, PFXOBUS 336 may be omitted and the longest prefix output on RBUS 332 or not output from CAM 300 at all.

For one embodiment, the encoded prefix data output by prefix encoder 318 may also be used to generate an exact match flag when the match flag is asserted (i.e., there is at least one match) and the encoded prefix data indicates that no CAM cell is masked at the highest priority matching location.

Each local mask word 0 to N is coupled to a mask match line $320_0$ to $320_N$, respectively. The mask match lines indicate whether the longest prefix stored in register 316 matches the prefix data stored in a particular local mask word. Priority encoder 306 receives the mask match lines $320_0$ to $320_N$ and generates an index or a match address of the location in CAM array 302 that stores the address associated with the longest prefix determined by the prefix logic circuits.

Figure 4:
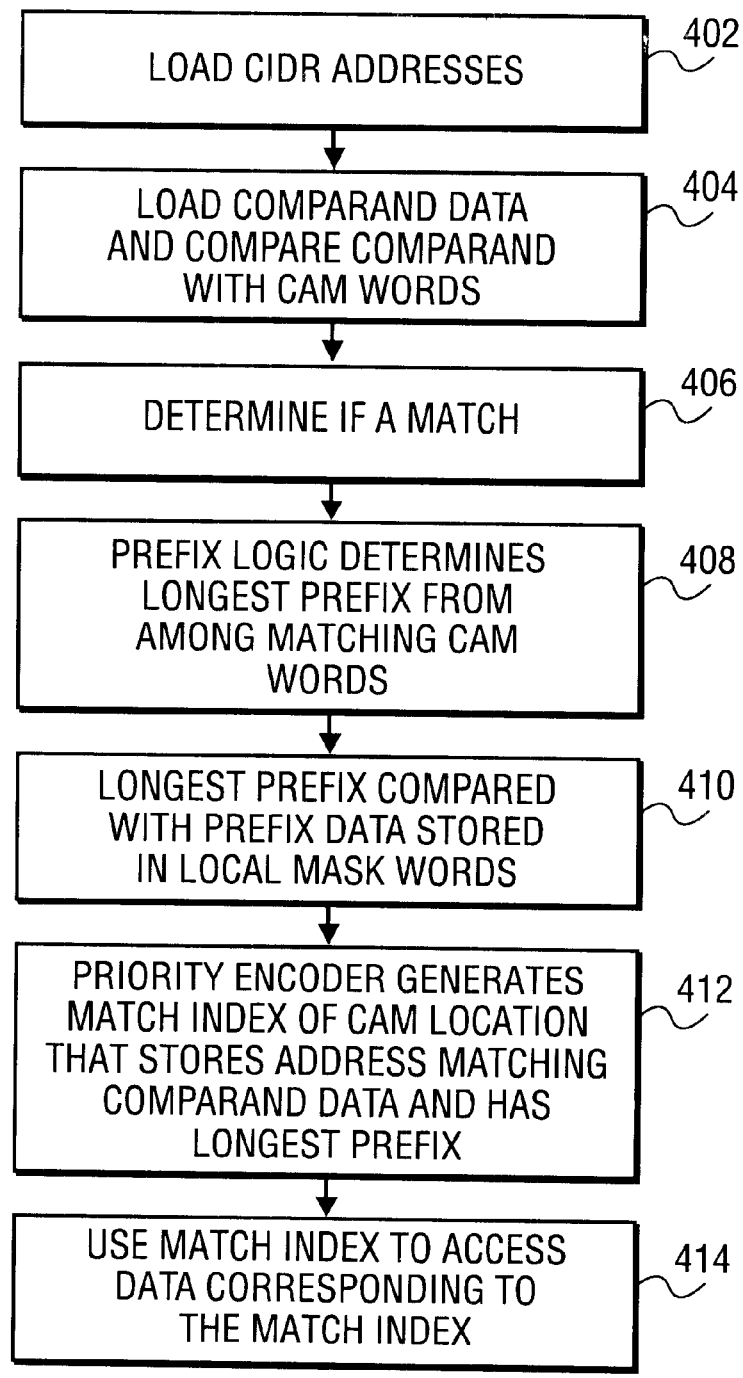
FIG. 4 is flow chart of one embodiment of operating the ternary the CAM device of FIG. 3.

The general operation of a CAM 300 to determine the location of a matching CIDR address that has the longest prefix is illustrated in FIG. 4. Initially, at step 402, the IP addresses and corresponding prefix masks of CIDR addresses are loaded into the CAM words and local mask words, respectively, of CAM array 302. The addresses and prefixes may be arbitrarily loaded into CAM array 302 without pre-sorting or prearranging the addresses by prefix length or any other predetermined algorithm. Additionally, CAM array 302 may be updated at any time by adding or deleting addresses and/or their prefix masks without having to re-sort or rearrange CAM array 302. New addresses may simply be added to the next free address or any other location in CAM array 302. Similarly, addresses may be retired or deleted without regard to rearranging or condensing the remaining entries in CAM array 302.

At step 404, a compare instruction is loaded into instruction decoder 314 and CAM 300 is instructed to compare comparand data provided on CBUS 326 (or in comparand register 310) with the addresses stored in CAM array 302. The comparison is masked on a bit-by-bit basis by the prefix mask data stored in the local mask words. At step 406, CAM 300 determines if there is a match and CAM match lines $322_0$–$322_N$ are driven to appropriate states. The match flag signal may also be generated on line 334 at step 406.

At step 408, the prefix logic circuits compare CAM match lines $322_0$–$322_N$ with the prefix mask data to determine the longest prefix among the matching CAM locations. The longest prefix is then provided to register 316 and may be output to PFXOBUS 336. At this time, the longest prefix is known, but the location in the CAM array of the address associated with the longest prefix is not known. At step 410, register 316 provides the longest prefix to CAM 302 to be compared with the prefix mask data stored in the local mask words. The local mask words then drive mask match lines $320_0$–$320_N$ with an indication of where the longest prefix is located in CAM array 302. At step 412, priority encoder 306 generates the match index of CAM array 302 at which the address and longest prefix of the matching CIDR address is located. The match index is provided to results bus RBUS 332. If more than one address has the same number of bits in its associated prefix mask that matches the longest prefix stored in register 316, then priority encoder 306 will select the location in CAM array 302 that has the lowest logical address. For an alternative embodiment, priority encoder may select the highest logical address or any other predetermined priority address.

At optional step 414, the match index may be used to access data associated with the selected address. The associated data may be stored in another memory device addressed by the match index on RBUS 332. For an alternative embodiment, the match index on RBUS 332 may be routed back to CAM array 302 by address decoder 304 to access associated data stored in additional memory cells along with the CAM word storing the selected address. The additional memory cells may be ternary or binary CAM cells, SRAM cells, or any other types of volatile or non-volatile memory cells. The additional memory cells may store routing information or the like. For another embodiment, the additional memory cells may be CAM cells that participate in comparisons operations with comparand data supplied to CAM array 302. The additional CAM cells may be coupled to CAM match lines $322_0$–$322_N$ and/or mask match lines $320_0$–$320_N$.

Figure 5:
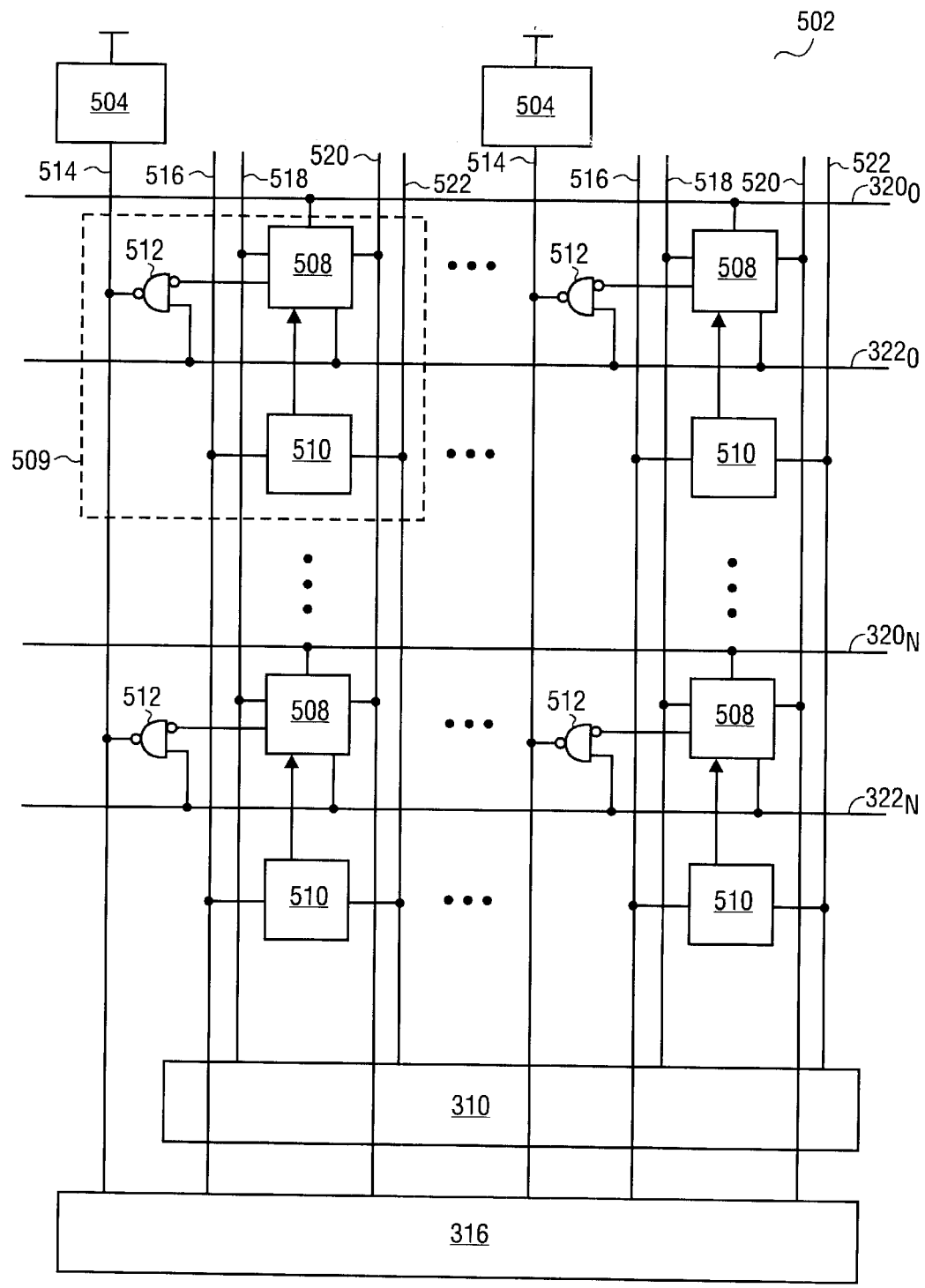
FIG. 5 is a block diagram of one embodiment of a ternary CAM array including mask cells, CAM cells, and prefix logic circuits.

FIG. 5 shows CAM array 502 that is one embodiment of CAM array 302 of FIG. 3. CAM array 502 includes N rows of ternary or mask-per-bit CAM cells 509. Each ternary CAM cell 509 includes a CAM cell 510 that stores one bit of an address (or other data), a local mask cell 508 that stores one bit of prefix mask data, and a prefix logic circuit 512. Each CAM cell 510 is coupled to data compare lines 516 and 522 that provide complementary comparand data from comparand register 310 to be compared with the addresses stored in CAM cells 510. For another embodiment, the comparand data provided on data compare lines 516 and 522 may not be complementary. For yet another embodiment, only one data compare line may be used.

The local mask cells 508 are each coupled to mask compare lines 518 and 520 that provide complementary data from register 316 for comparison with the prefix mask data stored in the local mask cells 508. For another embodiment, the data provided on mask compare lines 518 and 520 may not be complementary. For yet another embodiment, only one mask compare line may be used.

Local mask cells 508 are further coupled to mask match lines $320_0$–$320_N$ and, in this embodiment, to CAM match lines $322_0$–$322_N$. In other embodiments, CAM cells 510 may be coupled to the CAM match lines $322_0$–$322_N$. A prefix mask cell 508 is configured to mask a corresponding CAM cell when the prefix mask data stored in the mask cell is a logic one state, and to not mask a corresponding CAM cell when the prefix mask data stored in the mask cell is a logic zero state. The logical complement of this implementation may also be implemented with corresponding changes to the prefix logic circuits 512.

CAM array 502 also includes prefix logic circuits 512 that each comprise two-input NAND gates. Each NAND gate has a first input coupled to a CAM match line, and a second input to receive the logical complement of the prefix mask data from local mask cell 508. The output of each NAND gate is coupled to a prefix match line 514. The prefix match lines are provided to register 316. For other embodiments, prefix logic circuits 512 may be any other logic gate, complex logic gate, combination of logic gates, or other transistor circuit that drives one or more of the prefix match lines. The prefix match lines 514 may each be precharged towards a logic one state by precharge circuit 504. NAND gate 512 may be implemented, for example, as a CMOS logic gate in which the n-channel pull-down transistors are significantly stronger than the p-channel pull-up transistors.

For another embodiment, the CAM match lines $322_{0-N}$ may be buffered. The buffered CAM match lines may be coupled to an input of each of NAND gates 512.

Figure 6:
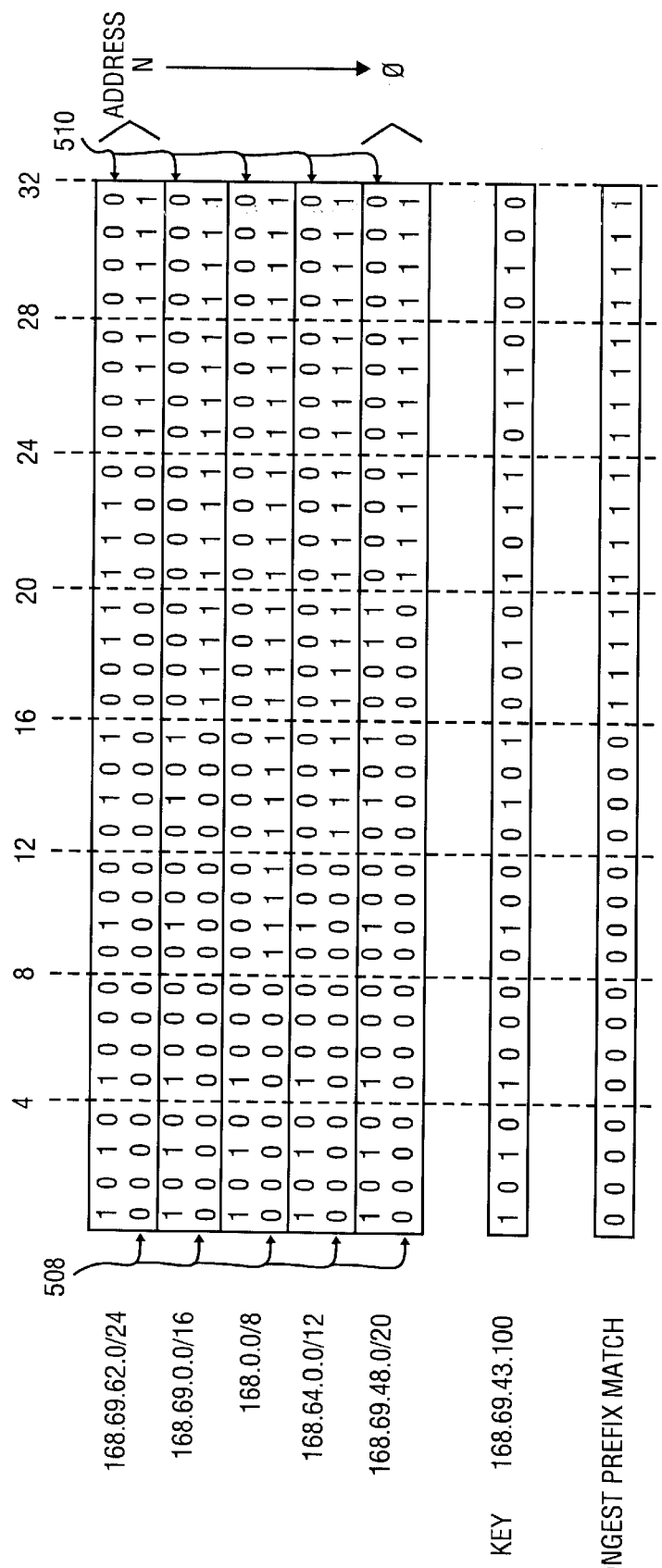
FIG. 6 illustrates CIDR addresses with network prefixes arbitrarily loaded into the ternary CAM array of FIG. 5.

The operation of CAM array 502 may be illustrated with respect to the flow chart of FIG. 4 and the exemplary routing table entries of FIG. 6 as follows. Initially, at step 402, CAM cells 510 are loaded with the five unsorted addresses and local mask cells 508 are loaded with the corresponding prefix mask data as shown in FIG. 6. The addresses are loaded such that 168.69.62.0/24 is loaded in a higher logical address than 168.69.48.0/20. The addresses and prefix mask data may be loaded through word lines and bit lines not shown so as not to obscure the teachings of FIG. 5. The prefix mask data stored in the local mask cells of FIG. 5 is configured to mask a corresponding CAM cell when the prefix mask data is a logic one state, and to not mask a corresponding CAM cell when the prefix mask data is a logic zero state. Since the network prefix of a CIDR address indicates the number of left-most contiguous bits in the CIDR address that will participate in a comparison, the prefix mask data stored in the local mask word for the entry of 168.69.62.0/24, for example, has 24 left-most contiguous logic zero bits and 8 more contiguous logic one bits.

In response to a compare instruction at step 404, comparand data or a search key of 168.69.43.100 is provided on data compare lines 516 and 522 and is compared with the addresses in CAM cells 510 (as masked by prefix mask data in local mask cells 508). At step 406, if the comparand data matches the CIDR address of a particular row of CAM cells, then the corresponding CAM match line will be asserted to a high logic state, for example, by a precharge circuit (not shown). If there is no match, then the corresponding CAM match line is pulled to a low logic state. The CAM match lines are provided to flag logic (e.g., flag logic 308) to generate a valid match flag signal such as match flag signal 334 in FIG. 3. In the example of FIG. 6, the CAM match lines associated with CIDR addresses 168.69.0.0/16, 168.0.0.0/8, and 168.64.0.0/12 would indicate a match, while the CAM match lines associated with the CIDR addresses 168.69.62.0/24 and 168.69.48.0/20 would not indicate a match.

NAND gates 512 then logically compare the state of the CAM match lines with the prefix mask data to determine the states of the prefix match lines 514. A prefix match line 514 will be driven to a logic zero state if (1) there is a match between a stored address and the comparand data, and (2) for that matching location in the CAM array, the corresponding CAM cell is unmasked by its associated local mask cell. Because each prefix match line is coupled to one column of CAM cells and local mask cells, once a prefix match line is pulled to a logic low state for one row of cells, that prefix match line is pulled low for all rows of cells.

The prefix match lines are latched into register 316 at step 408 and may be output from the CAM device. If there are no matching stored addresses, then the prefix match lines will all remain in a precharged high state and all logic ones will be latched into register 316. If there is only one matching stored address, then the prefix match lines will indicate the prefix mask data stored by the local mask cells at that CAM location. If, however, there are multiple matching CIDR addresses, then the prefix match lines will indicate the longest prefix among the matching stored addresses. As shown in the example of FIG. 6, the search key 168.69.43.100 matches three table entries, namely: 168.69.0.0/16, 168.0.0.0/8, and 168.64.0.0/12. The longest prefix is associated with entry 168.69.0.0/16. The prefix mask of 00000000 00000000 11111111 11111111 will be latched into register 316. Note that 168.69.0.0/16 is not located at a lower logical address than 168.0.0.0/8 or 168.64.0.0/12, but the prefix of 168.69.0.0/16 is still determined.

At this point, only the longest prefix is known, but the location within the CAM array of the stored address associated with the longest prefix is not known. At step 410, register 316 provides the longest prefix onto mask compare lines 518 and 520 to be compared with the prefix mask data stored in local mask cells 508. The results of the comparison are reflected on mask match lines $320_0$–$320_N$. In this example, this would correspond to the address at which entry 168.69.0.0/16 is located. At step 412, priority encoder 306 then determines the match index or CAM address at which the matching CIDR address is located with the longest prefix.

Figure 17:
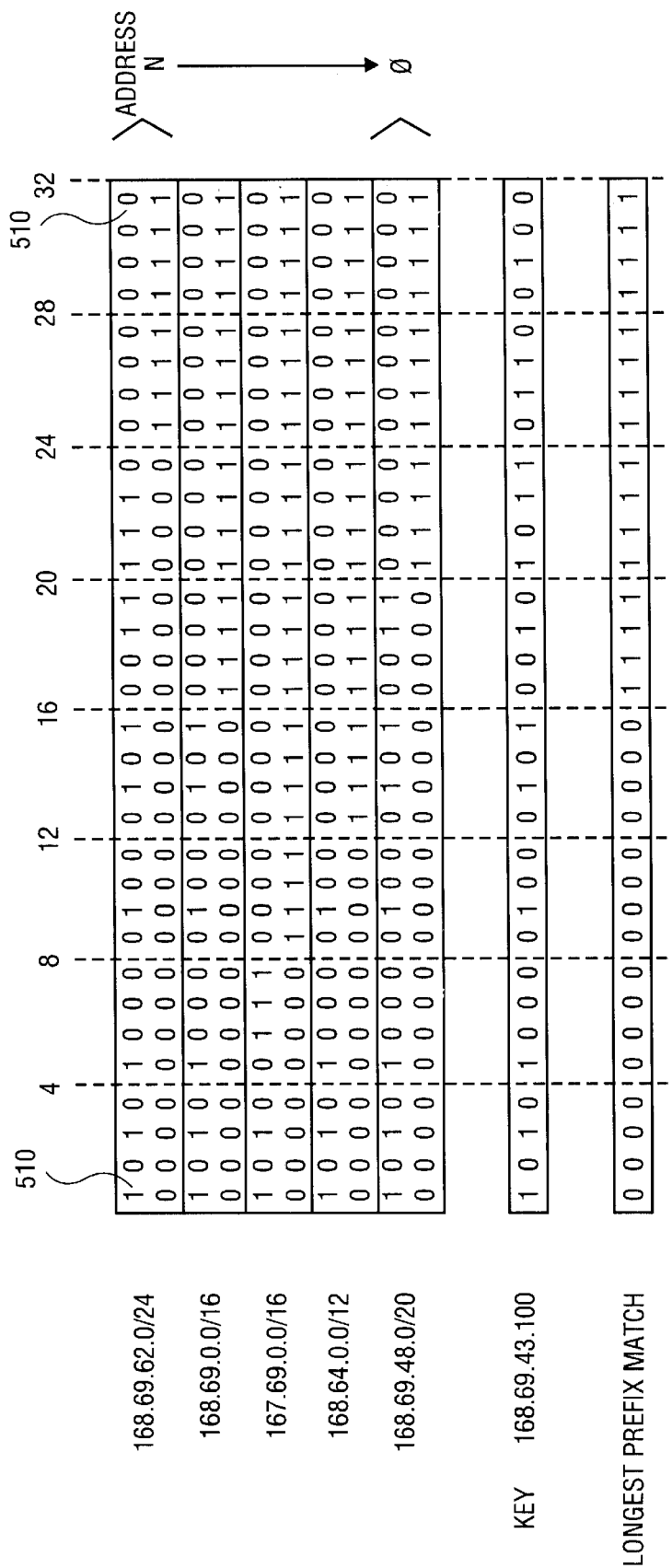
FIG. 17 illustrates CIDR addresses with network prefixes arbitrarily loaded into the ternary CAM array of FIG. 5.
Figure 18:
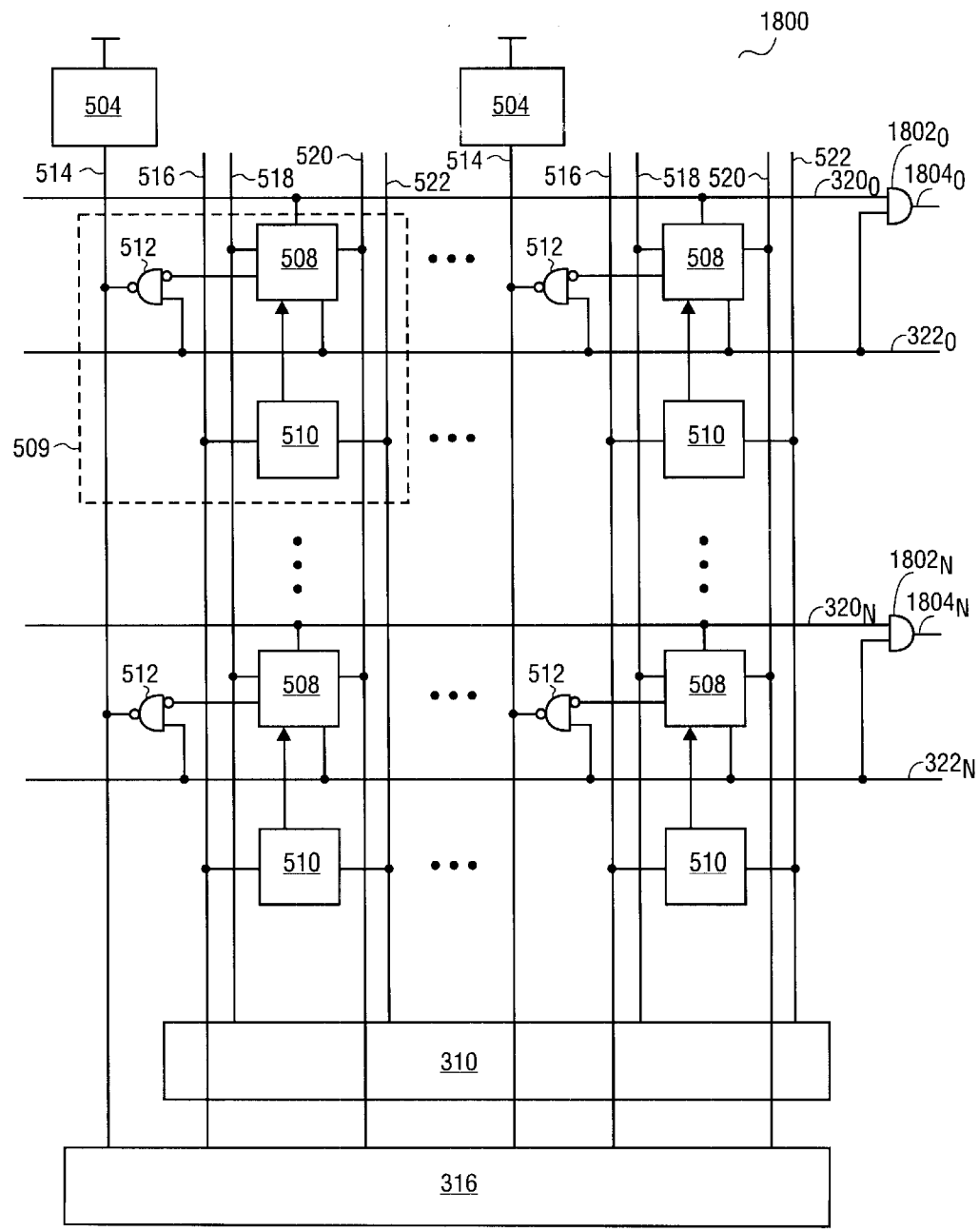
FIG. 18 is a block diagram of another embodiment of a ternary CAM array including mask cells, CAM cells, prefix logic circuits, and AND gates.

In another example, CAM array 502 may be loaded with table entries as shown in FIG. 17. In this example, steps 404 through 408 would still return 00000000 00000000 11111111 11111111 as the longest prefix associated with table entry 168.69.0.0/16. When this longest prefix is compared with the prefix mask data stored in local mask cells 508, both 168.69.0.0/16 and 167.69.0.0/16 would cause their corresponding mask match lines to be asserted indicating a match. This situation occurs when a non-matching IP address having the same prefix mask is stored at a lower table address than the matching IP address that has the longest prefix. CAM array 502 may be modified as shown by CAM array 1800 in FIG. 18 to include AND gates $1802_0$–$1802_N$. AND gates $1802_0$–$1802_N$ logically combine each pair of corresponding mask match lines $320_0$ and CAM match lines $322_0$. The outputs $1804_0$–$1804_N$ of AND gates $1802_0$–$1802_N$, respectively, may then be provided to priority encoder 306 to determine the address of the table entry that matches the comparand data and includes the longest prefix. In the example of FIG. 17, when the longest prefix of 00000000 00000000 11111111 11111111 is compared with local mask cells 508, the mask match lines associated with entries 168.69.0.0/16 and 167.69.0.0/16 would be asserted to a high logic state. Only the signal output by the AND gate $1802_x$ associated with table entry 168.69.0.0/16 would be asserted, however, because this entry has its associated CAM match line and mask match line asserted to high states indicating an unmasked match, while table entry 167.69.0.0/16 has its associated CAM match line deasserted to a low state indicating no match.

The CAM match lines and/or mask match lines may be registered or latched prior to providing the results on the respective match lines to AND gates $1802_0$–$1802_N$. This may be useful when operating CAM 1800 over multiple clock cycles.

For alternative embodiments, one or more AND and/or other logic gates (complex or otherwise) may be used in place of AND gates $1802_0$–$1802_N$. For example, an AND gate may be appropriate when a match condition of each of match lines $320_x$ and $322_x$ is indicated by a high state and priority encoder 306 anticipates receiving a match as a high state. One or more AND and/or other logic gates (e.g., OR, XOR, NAND, NOR, XNOR, inverters, etc.) may be used if one or more of the match mask lines or CAM match lines indicates a match as a low state, and/or if priority encoder 306 anticipates receiving a match as a low state.

Figure 15:
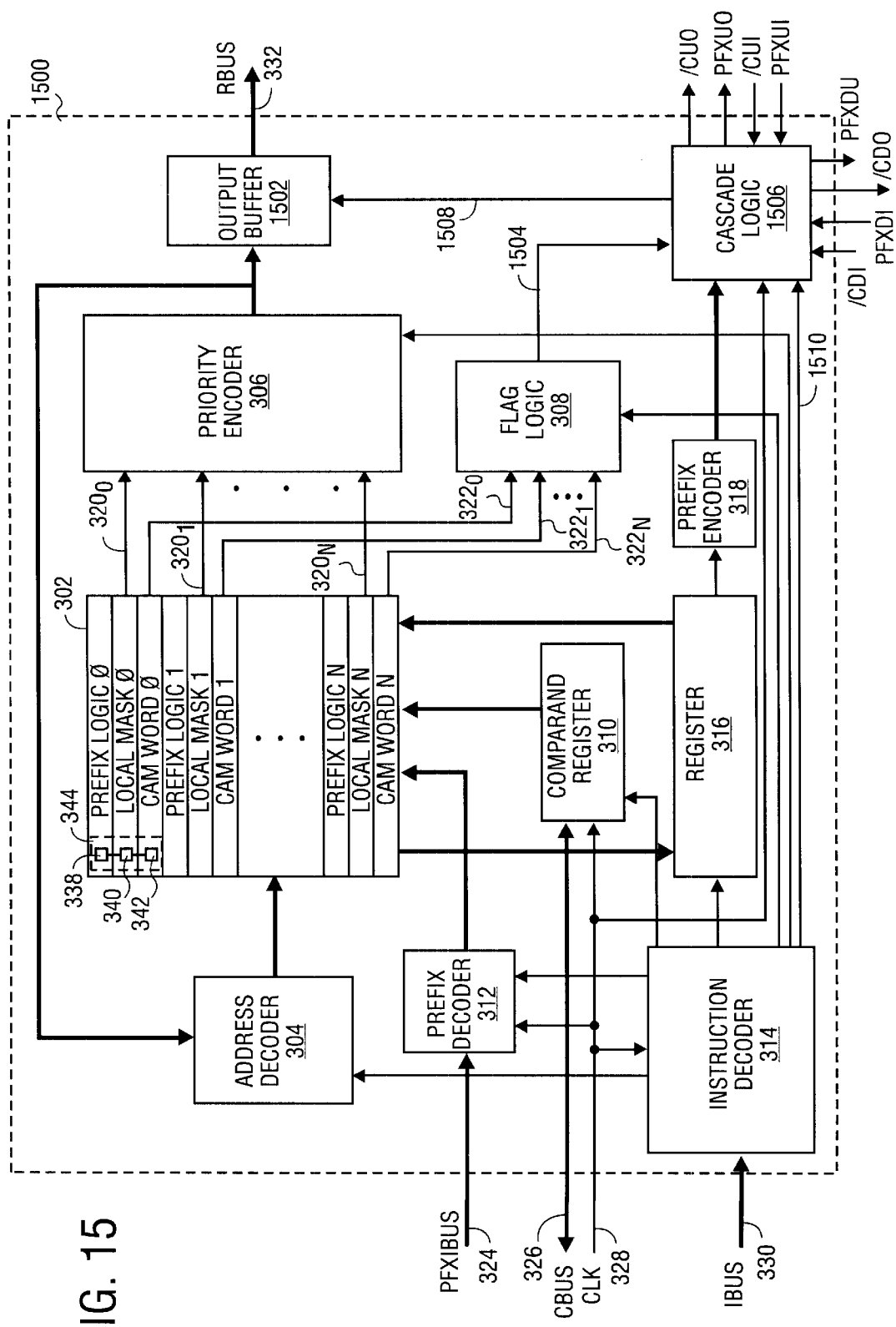
FIG. 15 is a block diagram of one embodiment of a CAM device including cascade logic.

The addition of a logic gate to logically combine pairs of mask match lines and CAM match lines may also be included in each of the other embodiments shown in FIGS. 8A, 8B, 9A, 9B, 10A, 10B, 10C, 11 and 12 for use in CAM device 300 of FIG. 3 and/or CAM device 1500 of FIG. 15.

Figure 7A:
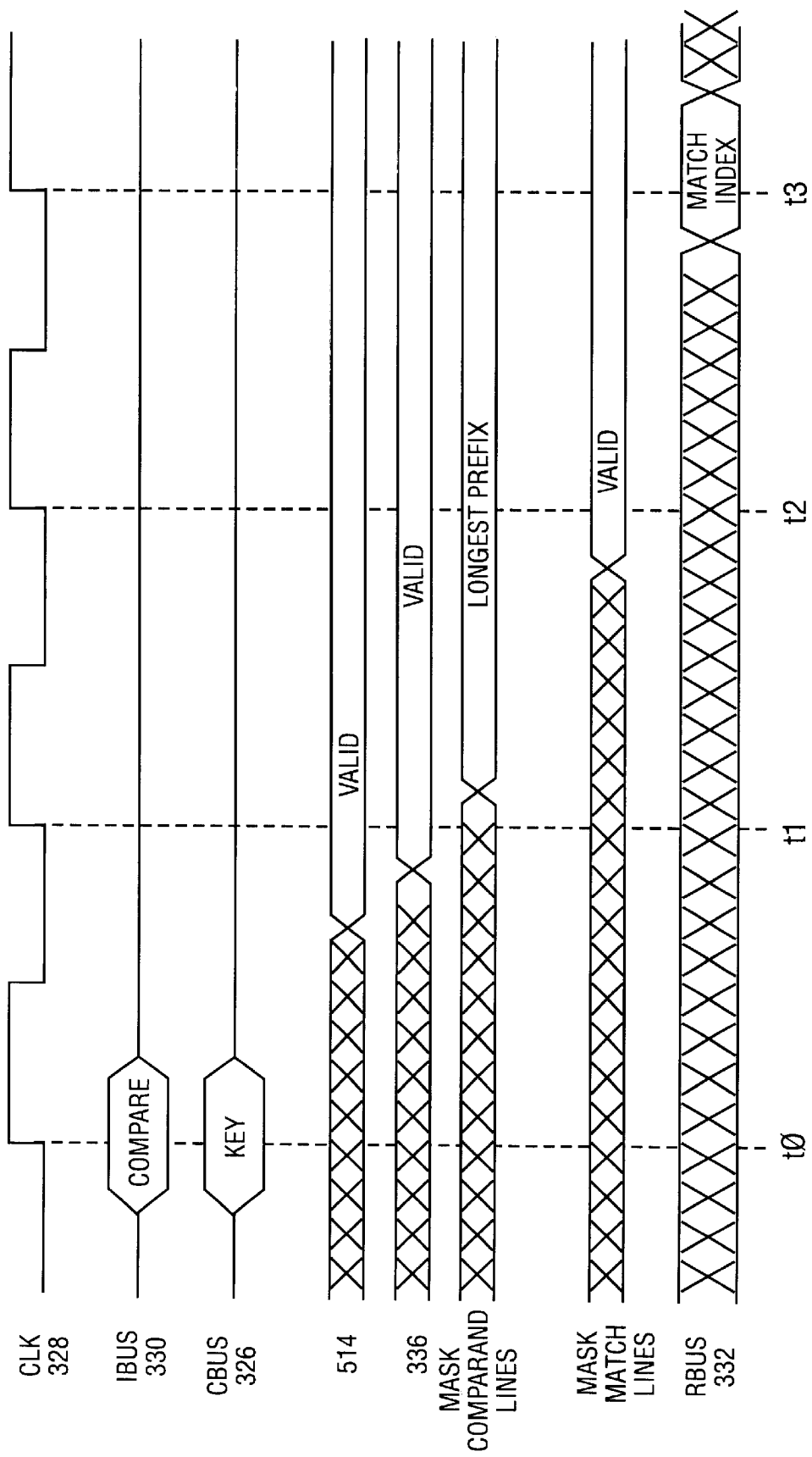
FIG. 7A is one embodiment of a timing diagram illustrating the operation of the ternary CAM array of FIG. 5.

A CAM device incorporating CAM array 502 (or CAM array 1800) may implement the process described above in a few number of clock cycles of clock 328. FIG. 7A shows one embodiment in which a compare operation for the longest prefix and its associated stored address may be performed in three clock cycles of CLK 328. At time t0, the compare instruction may be loaded into the CAM device along with comparand data. During a first clock cycle (t0 to t1), the comparand data may be compared with the addresses stored in the CAM cells and the results reflected on the CAM match lines $322_0$–$322_N$ and match flag signal line 334. Also during the first clock cycle, NAND gates 512 may determine the state of the prefix match lines such that the prefix match lines may be latched by register 316 and the longest prefix output to bus 336 by time t1. In a second clock cycle (t1 to t2), the longest prefix may be provided by register 316 to the mask compare lines 518 and 520 to be compared with the prefix mask data stored in the local mask cells 508. Prior to time t2, the results of the comparison may be reflected on the mask match lines $320_0$–$320_N$ and provided to priority encoder 306. At time t2, the priority encoder may latch the mask match lines (or outputs of AND gates $1802_0$–$1802_N$). By time t3, the priority encoder may provide the match index of the CIDR address stored in the CAM array to RBUS 332. Also by time t3, or in a subsequent clock cycle, data associated with the stored address may be output to RBUS 332. For one embodiment, the cycle time of CLK 328 may be from approximately 10 to 40 nanoseconds (ns). For other embodiments, other cycle times may be used.

In alternative embodiments, the comparison instruction illustrated in FIG. 7A may be completed in more or fewer clock cycles. For one example, the operations performed in the second and third clock cycles may be performed in a single clock cycle. In yet another embodiment, the entire operation may be performed in a single clock cycle.

Figure 7B:
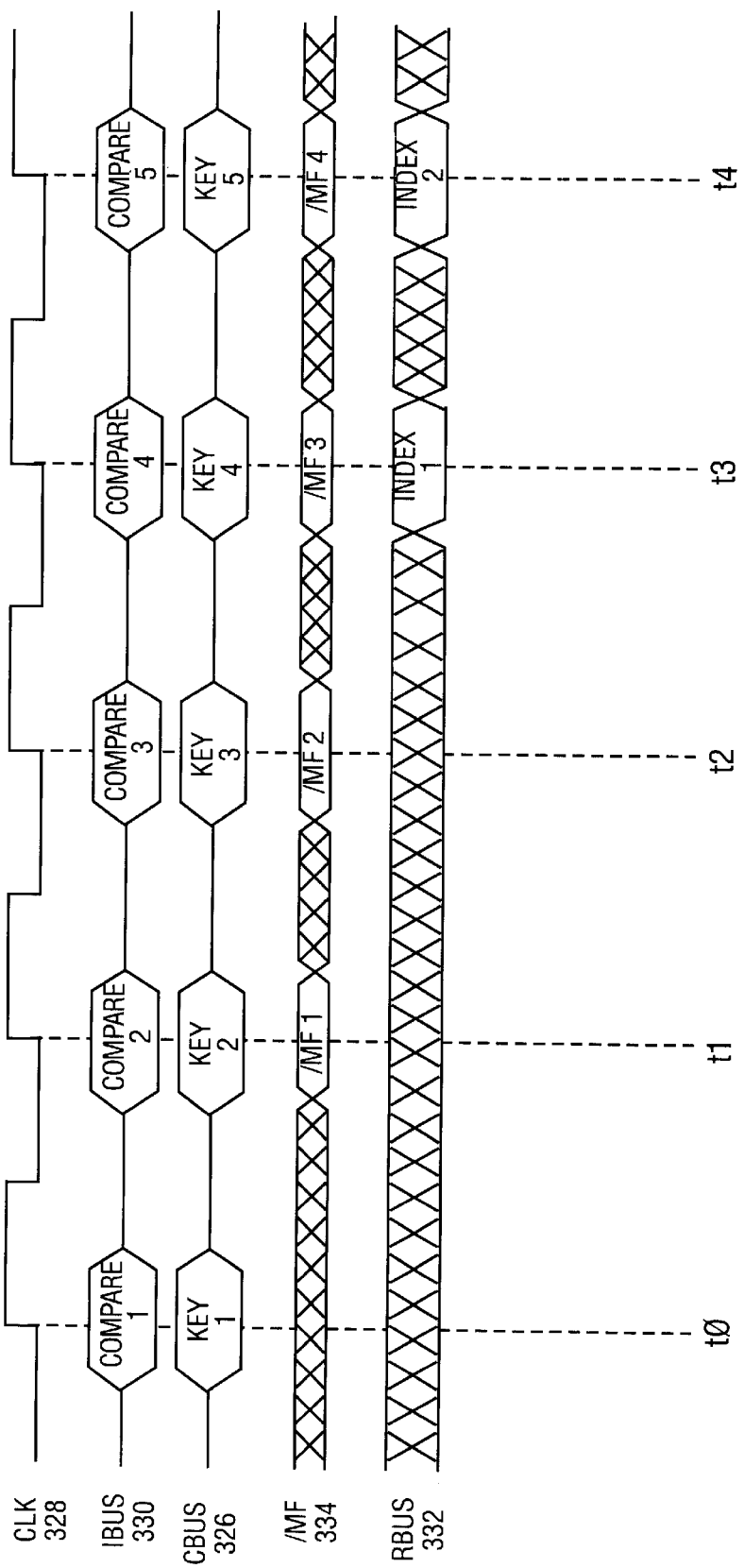
FIG. 7B is one embodiment of a timing diagram illustrating pipelining of instructions.

Because CAM array 502 includes multiple match lines and multiple sets of compare lines, CAM array 502 (or 1800) can also pipeline compare instructions to increase throughput. As shown in FIG. 7B, a first compare instruction and first comparand data can be loaded into the CAM device at time t0. During a first clock cycle (t0 to t1), the comparand data may be provided on data compare lines 516 and 522 to be compared with the addresses stored in the CAM cells, and the results reflected on the CAM match lines $322_0$–$322_N$ and match flag signal line 334. Also during the first clock cycle, NAND gates 512 may determine the states of the prefix match lines such that the prefix match lines may be latched by register 316 by time t1. At time t1, a second compare instruction and second comparand data can be loaded into the CAM device. During a second clock cycle (t1 to t2) the longest prefix determined during the first comparison is provided to the mask compare lines 518 and 520 to be compared with the prefix mask data stored in the local mask cells 508. At time t2, the priority encoder may latch the mask match lines (or outputs of AND gates $1802_0$–$1802_N$). By time t3, the priority encoder may provide to RBUS 332 the match index of the CIDR address in the CAM array corresponding to the first compare data. Also during the second clock cycle (t1 to t2), the second comparand data may be provided over the data compare lines 516 and 522 to be compared with the addresses stored in the CAM cells, and the results reflected on the CAM match lines $320_0$–$322_N$ and match flag signal line 334. Also during the second clock cycle, NAND gates 512 may determine the state of the prefix match lines such that the prefix match lines may be latched by register 316 by time t2. During a third clock cycle (t2 to t3), the longest prefix determined during the second comparison is provided to the mask compare lines 518 and 520 to be compared with the prefix mask data stored in the local mask cells 508. At time t3, the priority encoder may latch the mask match lines. By time t4, the priority encoder may provide to RBUS 332 the match index of the CIDR address in the CAM array corresponding to the second compare data. As described with respect to FIG. 7A, each pipelines instruction can also be executed in fewer clock cycles (e.g., one or two), or in more clock cycles.

Figure 8A:
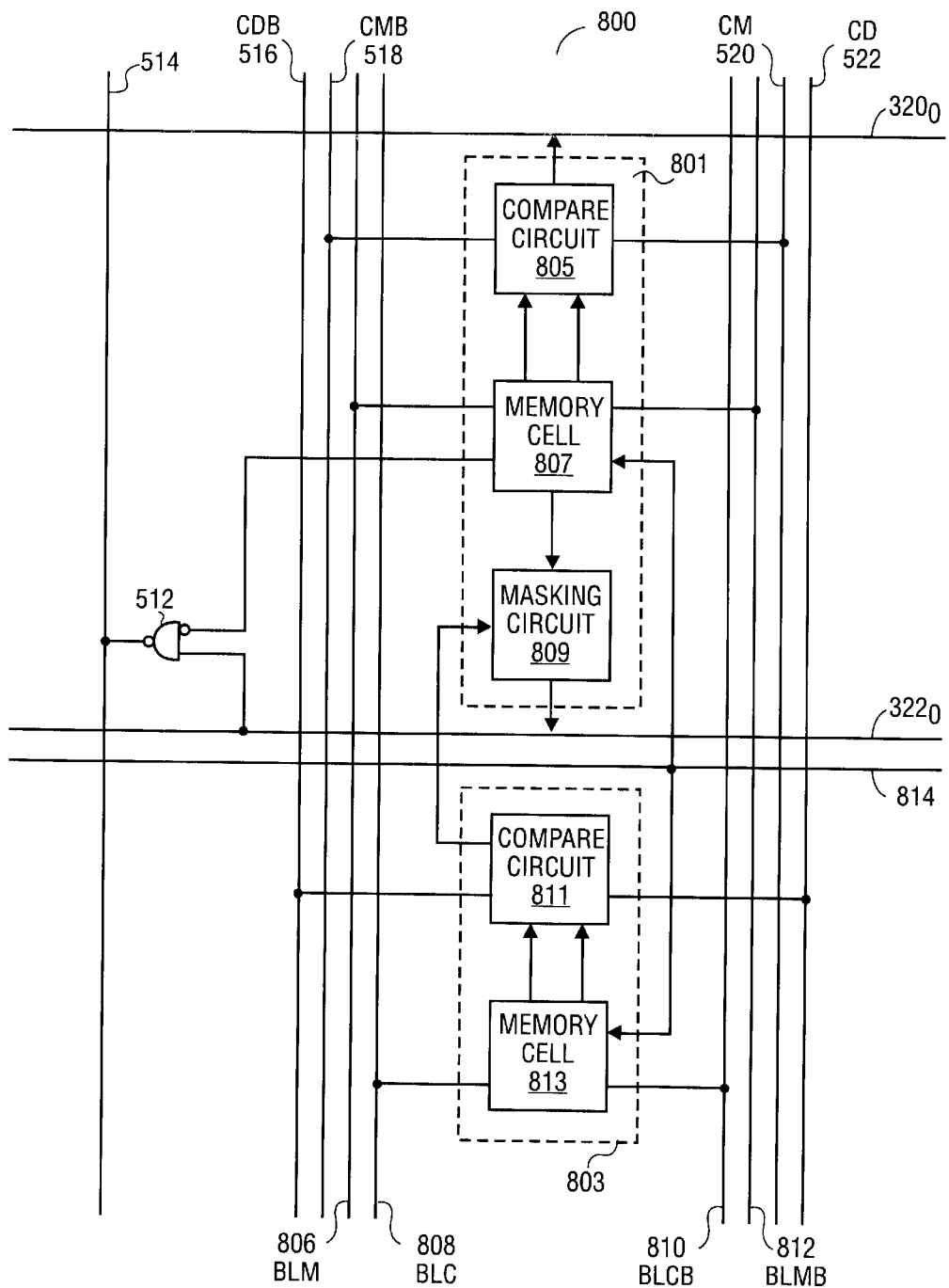
FIG. 8A is a block diagram of one embodiment of a ternary CAM cell.

FIG. 8A shows ternary or mask-per-bit CAM cell 800 that is one embodiment of ternary CAM cell 509 of FIG. 5. Ternary CAM cell 800 includes local mask cell 801 that is one embodiment of local mask cell 508, CAM cell 803 that is one embodiment of CAM cell 510, and NAND gate 512.

CAM cell 803 includes memory cell 813 and compare circuit 811. When word line 814 is selected, one bit of an IP address (or other data) may be read from or written to memory cell 813 from CAM bit lines BLC 808 and BLCB 810. For an alternative embodiment, only one CAM bit line may be required. Memory cell 813 may be any type of volatile or nonvolatile memory cell.

Compare circuit 811 compares the data stored in memory cell 813 with comparand data on data compare lines CDB 516 and CD 522, and the result is provided to masking circuit 809 of local mask cell 801. Compare circuit 811 may include any type of comparison circuitry or logic including an exclusive OR (XOR) gate. For an alternative embodiment, only one data compare line may be required.

Local mask cell 801 includes a memory cell 807 coupled to compare circuit 805 and masking circuit 809. Under the control of word line 814, one bit of prefix mask data can be read from or written to memory cell 807 via mask bit lines BLM 806 and BLMB 812. In alternative embodiments, only one mask bit line may be required. Memory cell 807 may be any type of volatile or nonvolatile memory cell.

If the prefix mask data stored in memory 807 indicates that ternary CAM cell 800 is unmasked, then masking circuit 809 enables the results from compare circuit 811 to determine the state of CAM match line $322_0$ (in conjunction with the other CAM cells coupled to CAM match line $322_0$). If, however, CAM cell 800 is masked, then masking circuit 809 does not allow the results from compare circuit 811 to determine the state of CAM match line $322_0$.

The prefix mask data stored in memory cell 807 is also provided to compare circuit 805 to be compared with mask comparand data (e.g., from register 306) on mask compare lines CMB 518 and CM 520. In response to the comparison, compare circuit 805 determines the state of mask match line $320_0$ (in conjunction with other CAM cells coupled to mask match line $320_0$).

Figure 8B:
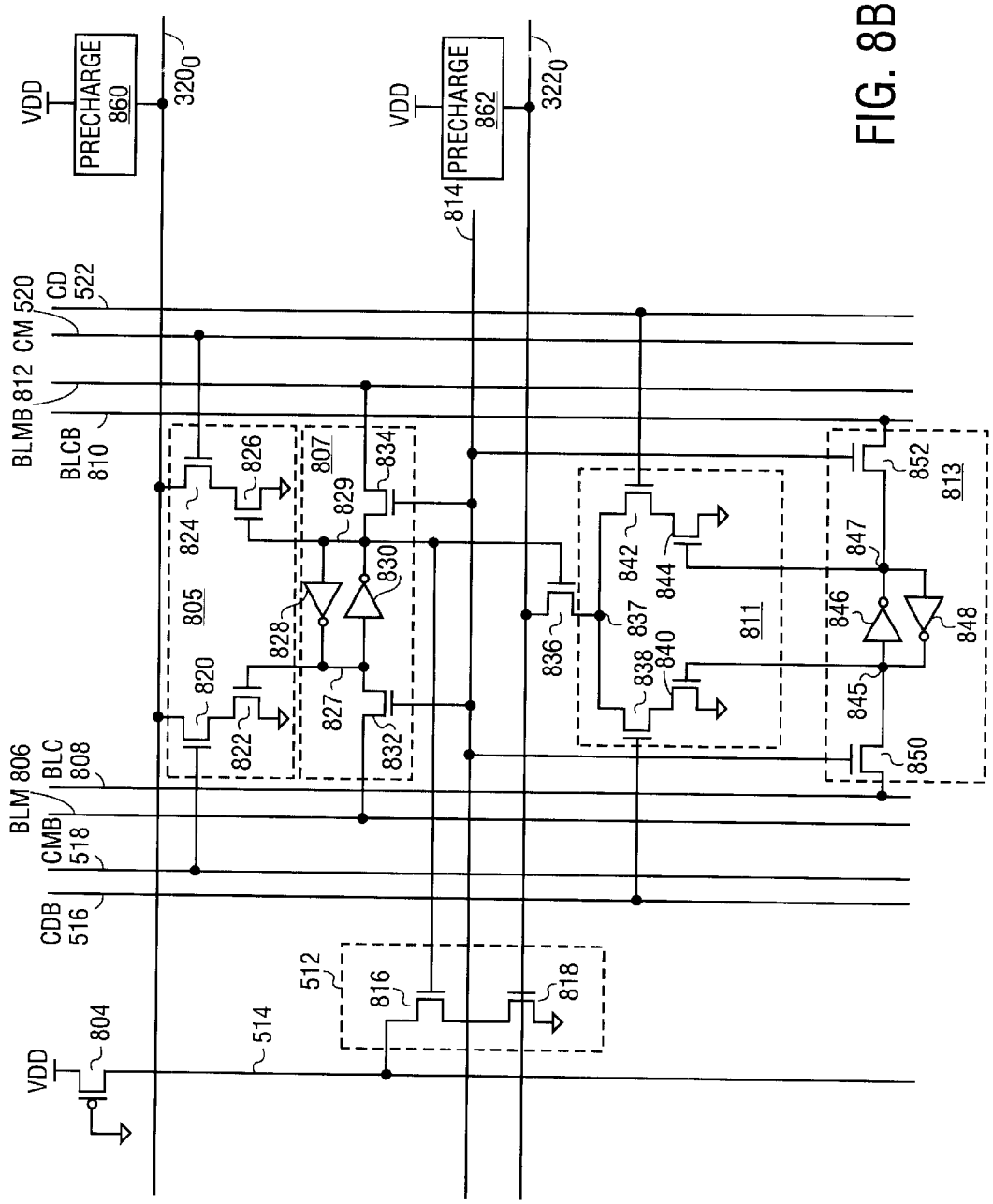
FIG. 8B is a circuit diagram of one embodiment of the ternary CAM cell of FIG. 8A.

FIG. 8B shows one embodiment of CAM cell 800 implemented at the transistor level. Other embodiments may be used. Memory cell 807 includes cross-coupled inverters 828 and 830 that store a bit of prefix mask data and its logical complement at nodes 827 and 829, respectively. The prefix mask data may be read from or written to mask bit lines BLM 806 and BLMB 812 via pass gates 832 and 834, respectively. Pass gates 832 and 834 may be controlled by word line 814.

Compare circuit 805 includes NMOS transistors 820, 822, 824, and 826 that compare the prefix mask data at nodes 827 and 829 with the longest prefix data provided on mask compare lines CMB 518 and CM 520. If there is a match, the logic state of mask match line 320 will be unaffected by compare circuit 805, and precharge circuit 860 may maintain mask match line $320_0$ at a logic one state if there are no other non-matching locations in the row. If there is no match, either transistor pair 820 and 822 or transistors pair 824 and 826 will pull mask match lines $320_0$ to a logic zero state. Transistor 820 has its drain coupled to mask match line $320_0$, its gate coupled to CMB 518, and its source coupled to the drain of transistor 822. Transistor 822 has its gate coupled to node 827 and its source coupled to ground. Transistor 824 has its drain coupled to mask match line $320_0$, its gate coupled to CM 520, and its source coupled to the drain of transistor 826. Transistor 826 has its gate coupled to node 829 and its source coupled to ground. Masking circuit 809 includes transistor 836 that has its gate coupled to node 829, its source coupled to CAM match line $322_0$, and its drain coupled to node 837.

Memory cell 813 includes cross-coupled inverters 846 and 848 that store a bit of an address and its logical complement at nodes 845 and 847, respectively. The address data may be read from or written to bit lines BLC 808 and BLCB 810 via pass gates 850 and 852, respectively. Pass gates 850 and 852 may also be controlled by word line 814. In an alternative embodiment, separate word lines may be used to control access to the memory cell of the local mask cell and the memory cell of the CAM cell. Additionally, to reduce the number of bit lines, BLM 806 and BLC 808 may be one bit line, and BLCB 810 and BLMB 812 may be one bit line. Compare circuit 811 includes NMOS transistors 838, 840, 842, and 844 that compare the data at nodes 845 and 847 with the comparand data or search key provided on data compare lines CDB 516 and CD 522. Transistor 838 has its drain coupled to node 837, its gate coupled to CDB 516, and its source coupled to the drain of transistor 840. Transistor 840 has its gate coupled to node 845 and its source coupled to ground. Transistor 842 has its drain coupled to node 837, its gate coupled to CD 522, and its source coupled to the drain of transistor 844. Transistor 844 has its gate coupled to node 847 and its source coupled to ground.

Prefix logic circuit 512 includes NMOS transistors 816 and 818 coupled in series between prefix match line 514 and ground. Transistor 816 has its drain coupled to prefix match line 514, its gate coupled to node 829, and its source coupled to the drain of transistor 818. Transistor 818 has its gate coupled to CAM match line $322_0$ and its source coupled to ground. Other embodiments may also include different configurations of transistors to implement the same or other logic gates.

Prefix match line 514 may be precharged towards a power supply voltage by PMOS transistor 804 which is always biased in an on state. For another embodiment, transistor 804 may be configured as a diode. Other means may be used to precharge the lines. For example, transistors 816 and 818 may be p-channel transistors with transistor 818 coupled to VDD and the logical complement of CAM match line $322_0$, transistor 816 coupled to node 827, and transistor 804 configured to precharge line 514 to a low state.

CAM match line $322_0$ will be pulled to a logic zero state if memory cell 813 is unmasked and the comparand data provided on data compare lines CDB 516 and CD 522 does not match the data stored in memory cell 813. The logic state of CAM match line $322_0$ will remain unaffected if (1) memory cell 813 is unmasked and the comparand data matches the data stored in memory cell 813, or if (2) the prefix mask data stored at node 827 is a logic one state (memory cell 813 masked). When CAM match line $322_0$ is in a logic one state and the prefix mask data at node 827 is low (node 829 high), then prefix match line 514 will be pulled to a low state indicating that the ternary CAM cell is unmasked and stores data in its CAM cell that matches the comparand data. Otherwise, the logic state of prefix match line 514 will remain unaffected by transistors 816 and 818.

Figure 9A:
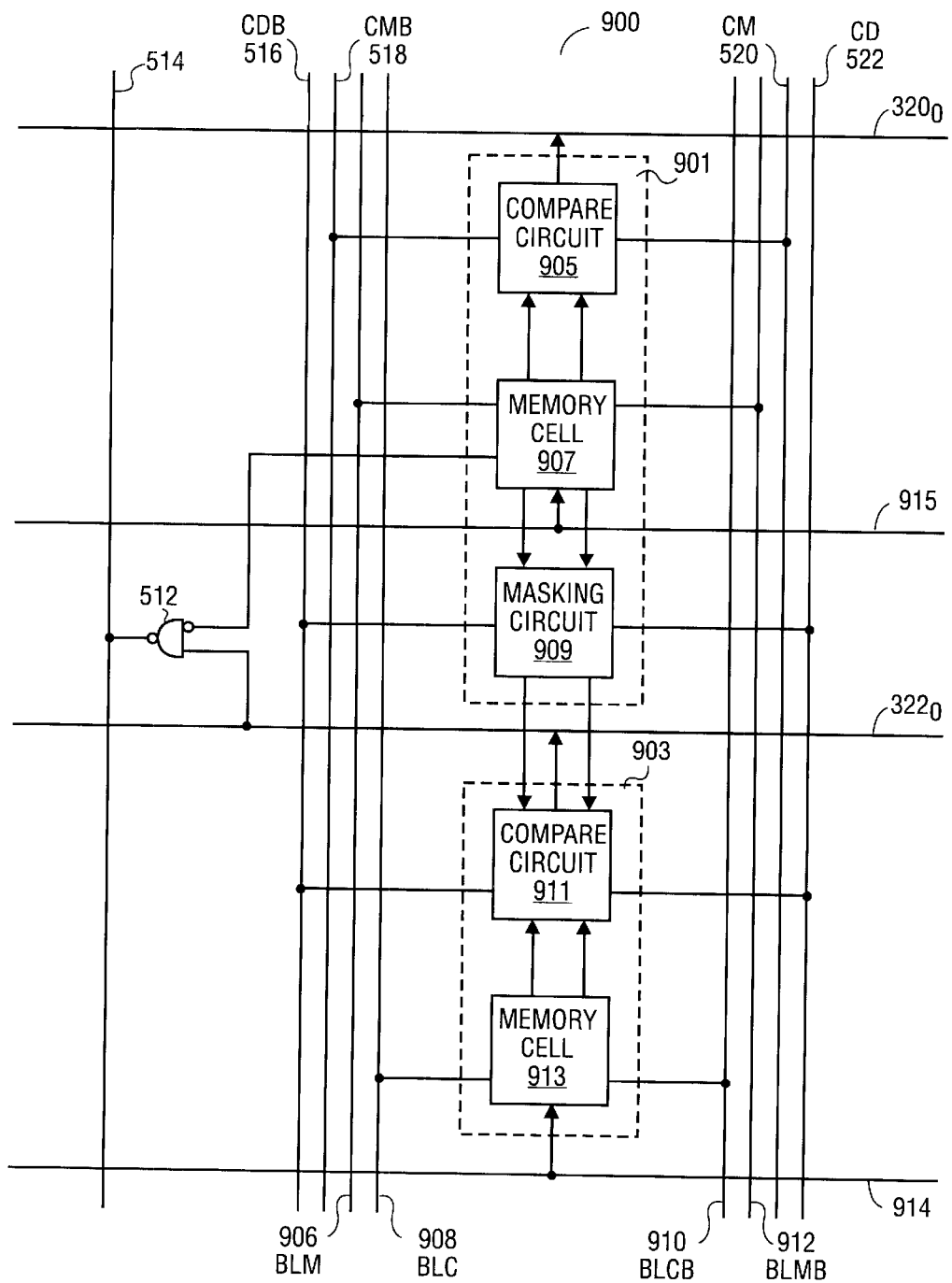
FIG. 9A is a block diagram of another embodiment of a ternary CAM cell.

FIG. 9A shows ternary or mask-per-bit CAM cell 900 that is another embodiment of ternary CAM cell 509 of FIG. 5. Ternary CAM cell 900 includes local mask cell 901 that is one embodiment of local mask cell 508, CAM cell 903 that is one embodiment of CAM cell 510, and NAND gate 512.

CAM cell 903 includes memory cell 913 and compare circuit 911. When word line 914 is selected, one bit of an IP address (or other data) may be read from or written to memory cell 913 from CAM bit lines BLC 908 and BLCB 910. For an alternative embodiment, only one CAM bit line may be required. Memory cell 913 may be any type of volatile or nonvolatile memory cell. Compare circuit 911 is coupled to memory cell 913 and may include any type of comparison circuitry or logic including an exclusive OR (XOR) gate.

Local mask cell 901 includes a memory cell 907 coupled to compare circuit 905 and masking circuit 909. Under the control of mask word line 915, one bit of prefix mask data can be read from or written to memory cell 907 via mask bit lines BLM 906 and BLMB 912. In alternative embodiments, only one mask bit line may be required. Memory cell 907 may be any type of volatile or nonvolatile memory cell.

Masking circuit 909 receives the prefix mask data stored in memory cell 907, and in response thereto determines whether the comparand data (from comparand register 310 or CBUS 326) on data compare lines CDB 516 and CB 522 or masked data is provided to compare circuit 911 for comparison with the data stored in memory cell 913. For example, when the prefix mask data stored in memory cell 907 indicates that the data in memory cell 913 should be masked during a comparison, masking circuit 909 provides masked data to compare circuit 911 such that compare circuit 911 indicates a match to CAM match line $322_0$. The masked data provided by masking circuit 909 to compare circuit 911 may be any predetermined data. For one embodiment, the masked data may be the same or the logical complement of the prefix mask data provided by memory cell 907 to masking circuit 909. When the prefix mask data stored in memory cell 907 indicates that the data stored in memory cell 913 should not be masked from a comparison with comparand data, masking circuit 909 provides the comparand data to compare circuit 911 to compare with the data stored in memory cell 913. Thus, in response to the prefix mask data stored in memory cell 907, masking circuit 909 provides either comparand data or masked data to compare circuit 911.

The prefix mask data stored in memory cell 907 is also provided to compare circuit 905 to be compared with mask comparand data (e.g., from register 306) on mask compare lines CMB 518 and CM 520. In response to the comparison, compare circuit 905 determines the state of mask match line $320_0$ (in conjunction with other CAM cells coupled to mask match line $320_0$).

Figure 9B:
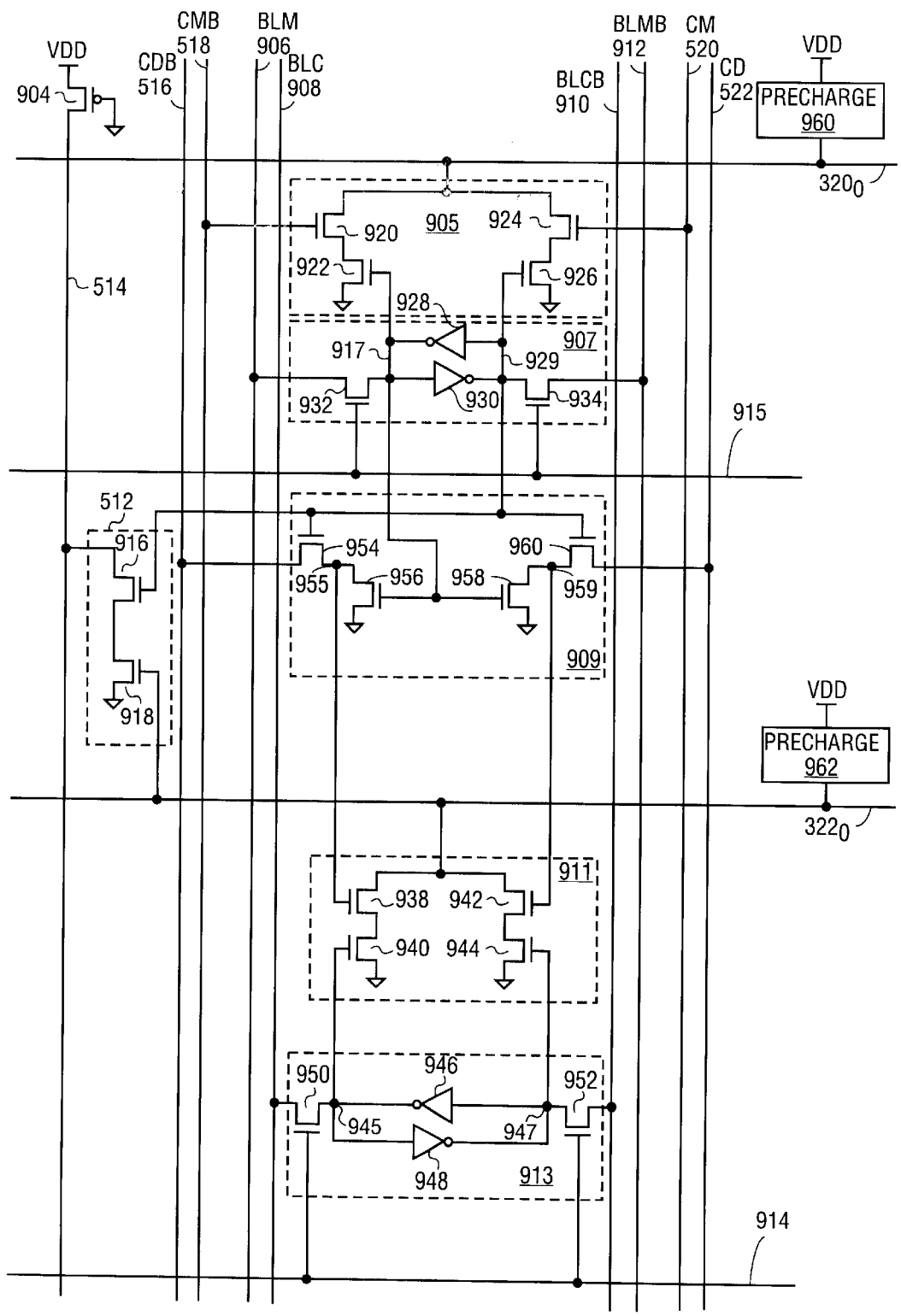
FIG. 9B is a circuit diagram of one embodiment of the ternary CAM cell of FIG. 9A.

FIG. 9B shows one embodiment of CAM cell 900 implemented at the transistor level. Other embodiments may be used. Memory cell 907 includes cross-coupled inverters 928 and 930 that store a bit of prefix mask data and its logical complement at nodes 927 and 929, respectively. The prefix mask data may be read from or written to mask bit lines BLM 906 and BLMB 912 via pass gates 932 and 934, respectively. Pass gates 932 and 934 may be controlled by mask word line 915.

Compare circuit 905 includes NMOS transistors 920, 922, 924, and 926 that compare the prefix mask data at nodes 927 and 929 with the longest prefix data provided on mask compare lines CMB 518 and CM 520. If there is a match, the logic state of mask match line 320 will be unaffected by compare circuit 905, and precharge circuit 960 may maintain mask match line $320_0$ at a logic one state if there are no other non-matching locations in the row. If there is no match, either transistor pair 920 and 922 or transistor pair 924 and 926 will pull mask match line $320_0$ to a logic zero state. Transistor 920 has its drain coupled to mask match line $320_0$, its gate coupled to CMB 518, and its source coupled to the drain of transistor 922. Transistor 922 has its gate coupled to node 927 and its source coupled to ground. Transistor 924 has its drain coupled to mask match line $320_0$, its gate coupled to CM 520, and its source coupled to the drain of transistor 926. Transistor 926 has its gate coupled to node 929 and its source coupled to ground.

Masking circuit 909 includes transistors 954, 956, 958, and 960. Transistor 954 has its drain coupled to CDB 16, its gate coupled to node 929, and its source coupled to node 955. Transistor 956 has its drain coupled to node 955, its gate coupled to node 927, and its source coupled to ground. Transistor 960 has its drain coupled to CD 522, its gate coupled to node 929, and its source coupled to node 959. Transistor 958 has its drain coupled to node 959, its gate coupled to node 927, and its source coupled to ground.

Memory cell 913 includes cross-coupled inverters 946 and 948 that store a bit of an address (or other data) and its logical complement at nodes 945 and 947, respectively. The address data may be read from or written to bit lines BLC 908 and BLCB 910 via pass gates 950 and 952, respectively. Pass gates 950 and 952 may also be controlled by word line 914. In an alternative embodiment, word line 914 and mask word line 915 may be connected together. Additionally, to reduce the number of bit lines, BLM 906 and BLC 908 may be one bit line, and/or BLMB 912 and BLCB 910 may be one bit line.

Compare circuit 911 includes NMOS transistors 938, 940, 942, and 944 that compare the data at nodes 945 and 947 with either masked data or comparand data provided by masking circuit 909 at nodes 955 and 959. Transistor 938 has its drain coupled to CAM match line $322_0$, its gate coupled to node 955, and its source coupled to the drain of transistor 940. Transistor 940 has its gate coupled to node 945 and its source coupled to ground. Transistor 942 has its drain coupled to CAM match line $322_0$, its gate coupled to node 959, and its source coupled to the drain of transistor 944. Transistor 944 has its gate coupled to node 947 and its source coupled to ground.

Prefix logic circuit 512 includes NMOS transistors 916 and 918 coupled in series between prefix match line 514 and ground. Transistor 916 has its drain coupled to prefix match line 514, its gate coupled to node 929, and its source coupled to the drain of transistor 918. Transistor 918 has its gate coupled to CAM match line $322_0$ and its source coupled to ground. Other embodiments may also include different configurations of transistors to implement the same or other logic gates.

Prefix match line 514 may be precharged towards a power supply voltage by PMOS transistor 904 which is always biased in an on state. For another embodiment, transistor 904 may be configured as a diode. Other means may be used to precharge the lines.

When the prefix mask data stored at node 927 of memory cell 907 is a logic one state indicating that masking is enabled, transistors 954 and 960 are off such that the comparand data is not provided to compare circuit 911. Additionally, transistors 956 and 958 pull nodes 955 and 959 to low logic states such that transistors 938 and 942 are off and the logic state of CAM match line $322_0$ is unaffected. Thus, when masking is enabled, masking circuit 909 provides masked data to compare circuit 911 such that the logic state of CAM match line $322_0$ remains unaffected. Also in this condition, the low logic state at node 929 will turn off transistor 916 such that the logic state of prefix match line 514 will remain unaffected by CAM match line $322_0$.

When the prefix mask data stored at node 927 of memory cell 907 is a logic zero state indicating that masking is disabled, transistors 954 and 960 are on and provide the comparand data on CDB 516 and CD 522 to transistors 938 and 942 of compare circuit 911. If the comparand data does not match the data stored in memory cell 913, one pair of transistors 938 and 940 or 942 and 944 will pull CAM match line $322_0$ to a low state. When CAM match line $322_0$ is in a low state, transistor 918 is off and the logic state of prefix match line 514 remains unaffected by CAM match line $322_0$. If the comparand data matches the data stored in memory cell 913, CAM match line $322_0$ will remain unaffected. When the comparand data matches the data stored in memory cell 913 and the prefix mask data stored at node 927 is low (unmasked), then transistors 916 and 918 are both turned on to pull prefix match line 514 to a logic zero state.

Figure 10A:
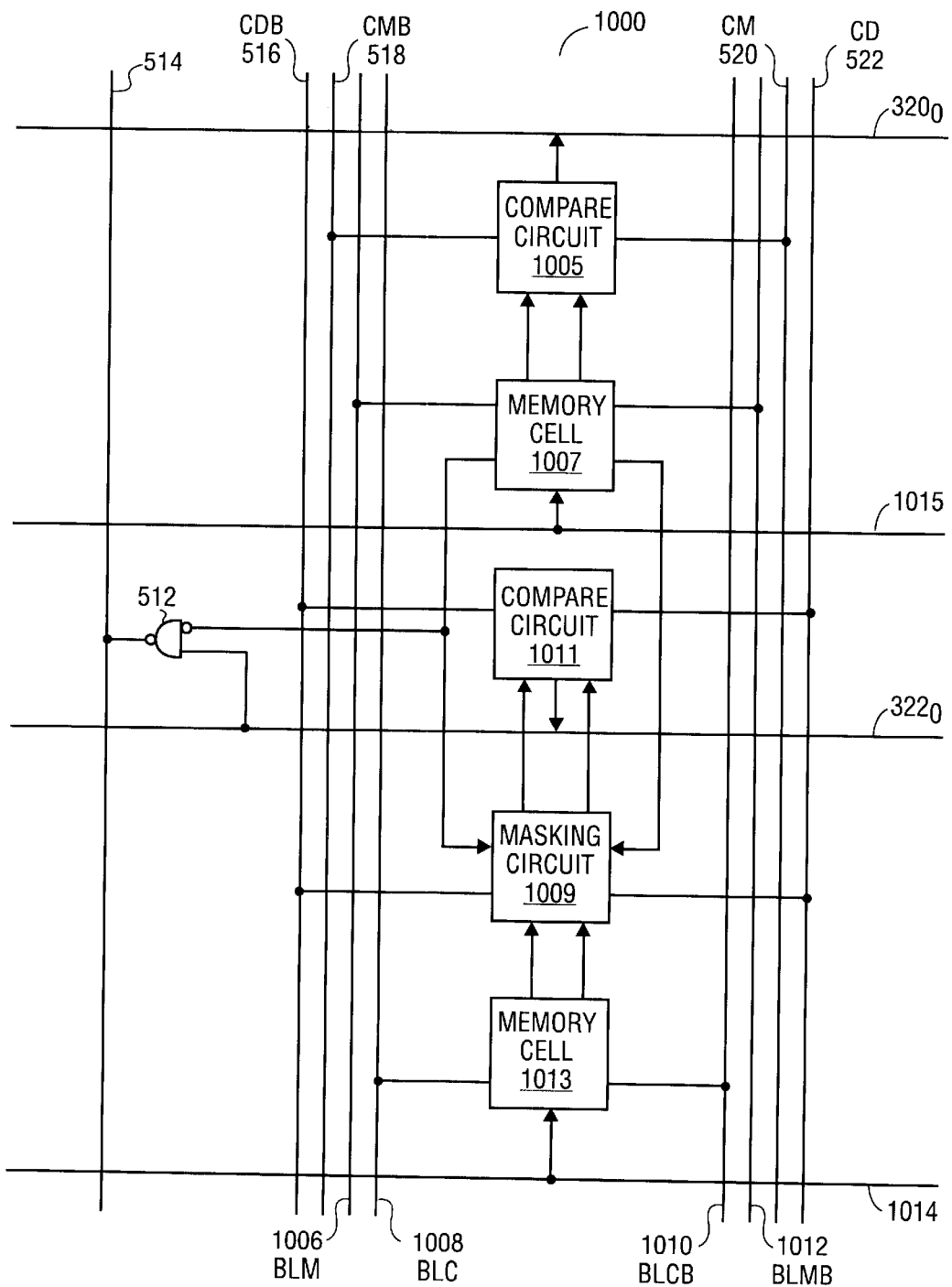
FIG. 10A is a block diagram of another embodiment of a ternary CAM cell.

FIG. 10A shows ternary or mask-per-bit CAM cell 1000 that is another embodiment of ternary CAM cell 509 of FIG. 5. Ternary CAM cell 1000 includes a CAM cell, a local mask cell, and NAND gate 512.

The CAM cell includes memory cell 1013 and compare circuit 1011. When word line 1014 is selected, one bit of an IP address (or other data) may be read from or written to memory cell 1013 from CAM bit lines BLC 1008 and BLCB 1010. For an alternative embodiment, only one CAM bit line may be required. Memory cell 1013 may be any type of volatile or nonvolatile memory cell. Compare circuit 1011 is coupled to memory cell 1013 and may include any type of comparison circuitry or logic including an exclusive OR (XOR) gate.

The local mask cell includes memory cell 1007 coupled to compare circuit 1005 and masking circuit 1009. Under the control of mask word line 1015, one bit of prefix mask data can be read from or written to memory cell 1007 via mask bit lines BLM 1006 and BLMB 1012. In alternative embodiments, only one mask bit line may be required. Memory cell 1007 may be any type of volatile or nonvolatile memory cell.

Masking circuit 1009 receives the prefix mask data stored in memory cell 1007, and in response thereto determines whether the address data stored in memory cell 1013 or masked data is provided to compare circuit 1011 for comparison with the comparand data provided on CDB 516 and CD 522. For example, when the prefix mask data stored in memory cell 1007 indicates that the data in memory cell 1013 should be masked during a comparison, masking circuit 1009 provides masked data to compare circuit 1011 such that compare circuit 1011 indicates a match to CAM match line $322_0$. The masked data provided by masking circuit 1009 to compare circuit 1011 may be any predetermined data. For one embodiment, the masked data may be the same or the logical complement of the prefix mask data provided by memory cell 1007 to masking circuit 1009. When the prefix mask data stored in memory cell 1007 indicates that the data stored in memory cell 1013 should not be masked from a comparison with comparand data, masking circuit 1009 provides the data stored in memory cell 1013 to compare circuit 1011 to compare with the comparand data. Thus, in response to the prefix mask data stored in memory cell 1007, masking circuit 1009 provides either address data or masked data to compare circuit 1011.

The prefix mask data stored in memory cell 1007 is also provided to compare circuit 1005 to be compared with mask comparand data (e.g., from register 306) on mask compare lines CMB 518 and CM 520. In response to the comparison, compare circuit 1005 determines the state of mask match line $320_0$ (in conjunction with other CAM cells coupled to mask match line $320_0$).

Figure 10B:
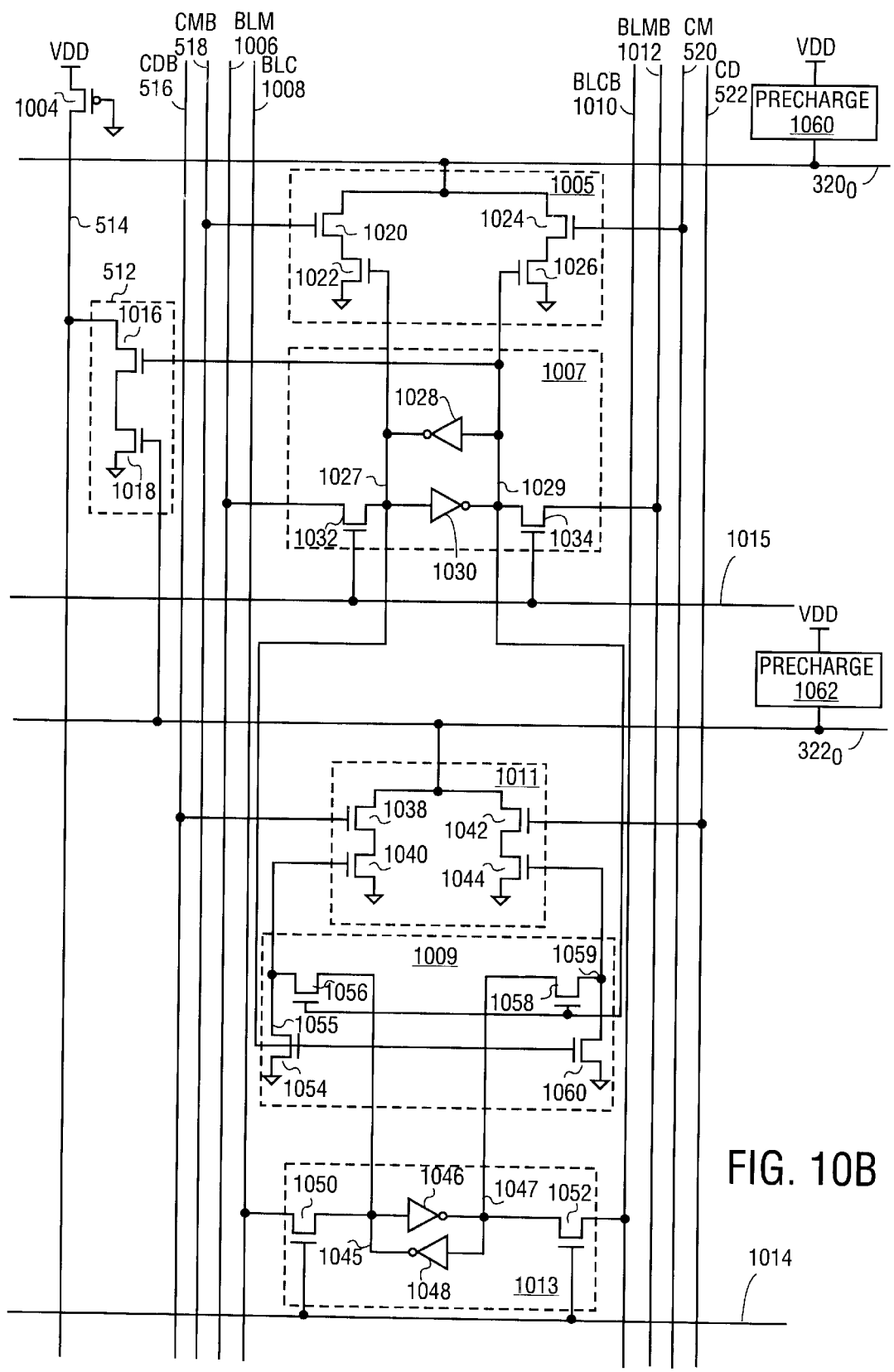
FIG. 10B is a circuit diagram of one embodiment of the ternary CAM cell of FIG. 10A.

FIG. 10B shows one embodiment of CAM cell 1000 implemented at the transistor level. Other embodiments may be used. Memory cell 1007 includes cross-coupled inverters 1028 and 1030 that store a bit of prefix mask data and its logical complement at nodes 1027 and 1029, respectively. The prefix mask data may be read from or written to mask bit lines BLM 1006 and BLMB 1012 via pass gates 1032 and 1034, respectively. Pass gates 1032 and 1034 may be controlled by mask word line 1015.

Compare circuit 1005 includes NMOS transistors 1020, 1022, 1024, and 1026 that compare the prefix mask data at nodes 1027 and 1029 with the longest prefix data provided on mask compare lines CMB 518 and CM 520. If there is a match, the logic state of mask match line $320_0$ will be unaffected by compare circuit 1005, and precharge circuit 1060 may maintain mask match line $320_0$ at a logic one state if there are no other non-matching locations in the row. If there is no match, either transistor pair 1020 and 1022 or transistor pair 1024 and 1026 will pull mask match line $320_0$ to a logic zero state. Transistor 1020 has its drain coupled to mask match line $320_0$, its gate coupled to CMB 518, and its source coupled to the drain of transistor 1022. Transistor 1022 has its gate coupled to node 1027 and its source coupled to ground. Transistor 1024 has its drain coupled to mask match line $320_0$, its gate coupled to CM 520, and its source coupled to the drain of transistor 1026. Transistor 1026 has its gate coupled to node 1029 and its source coupled to ground.

Masking circuit 1009 includes transistors 1054, 1056, 1058, and 1060. Transistor 1054 has its drain coupled to node 1055, its gate coupled to node 1027, and its source coupled to ground. Transistor 1056 has its drain coupled to node 1055, its gate coupled to node 1029, and its source coupled to node 1045 of memory cell 1013. Transistor 1060 has its drain coupled to node 1059, its gate coupled to node 1027, and its source coupled to ground. Transistor 1058 has its drain coupled to node 1059, its gate coupled to node 1029, and its source coupled to node 1047 of memory cell 1013.

Memory cell 1013 includes cross-coupled inverters 1046 and 1048 that store a bit of an address (or other data) and its logical complement at nodes 1045 and 1047, respectively. The address data may be read from or written to bit lines BLC 1008 and BLCB 1010 via pass gates 1050 and 1052, respectively. Pass gates 1050 and 1052 may also be controlled by word line 1014. In an alternative embodiment, word line 1014 and mask word line 1015 may be connected together. Additionally, to reduce the number of bit lines, BLM 1006 and BLC 1008 may be one bit line, and/or BLMB 1012 and BLCB 1010 may be one bit line.

Compare circuit 1011 includes NMOS transistors 1038, 1040, 1042, and 1044 that compare comparand data on lines CDB 516 and CD 522 with either masked data or the data at node 1045 and 1047 provided by masking circuit 1009 at nodes 1055 and 1059. Transistor 1038 has its drain coupled to CAM match line $322_0$, its gate coupled to CDB 516, and its source coupled to the drain of transistor 1040. Transistor 1040 has its gate coupled to node 1055 and its source coupled to ground. Transistor 1042 has its drain coupled to CAM match line $322_0$, its gate coupled to CD 522, and its source coupled to the drain of transistor 1044. Transistor 1044 has its gate coupled to node 1059 and its source coupled to ground.

Prefix logic circuit 512 includes NMOS transistors 1016 and 1018 coupled in series between prefix match line 514 and ground. Transistor 1016 has its drain coupled to prefix match line 514, its gate coupled to node 1029, and its source coupled to the drain of transistor 1018. Transistor 1018 has its gate coupled to CAM match line $322_0$ and its source coupled to ground. Other embodiments may also include different configurations of transistors to implement the same or other logic gates.

Prefix match line 514 may be precharged towards a power supply voltage by PMOS transistor 1004 which is always biased in an on state. For another embodiment, transistor 1004 may be configured as a diode. Other means may be used to precharge the lines.

When the prefix mask data stored at node 1027 of memory cell 1007 is a logic one state indicating that masking is enabled, transistors 1056 and 1058 are off such that the comparand data is not provided to compare circuit 1011. Additionally, transistors 1054 and 1060 pull nodes 1055 and 1059 to low logic states such that transistors 1040 and 1044 are off and the logic state of CAM match line $322_0$ remains unaffected. Thus, when masking is enabled, masking circuit 1009 provides masked data to compare circuit 1011 such that the logic state of CAM match line $322_0$ remains unaffected. Also in this condition, the low logic state at node 1029 will turn off transistor 1016 such that the logic state of prefix match line 514 will remain unaffected by CAM match line $322_0$.

When the prefix mask data stored at node 1027 of memory cell 1007 is a logic zero state indicating that masking is disabled, transistors 1056 and 1058 are on and provide the data at nodes 1045 and 1047 to transistors 1040 and 1044, respectively, of compare circuit 1011. If the comparand data does not match the data stored in memory cell 1013, one pair of transistors 1038 and 1040 or 1042 and 1044 will pull CAM match line $322_0$ to a low state. When CAM match line $322_0$ is in a low state, transistor 1018 is off and the logic state of prefix match line 514 remains unaffected by CAM match line $322_0$. If the comparand data matches the data stored in memory cell 1013, CAM match line $322_0$ will remain at a logic one state. When the comparand data matches the data stored in memory cell 1013 and the prefix mask data stored at node 1027 is low (unmasked), then transistors 1016 and 1018 are both turned on to pull prefix match line 514 to a logic zero state.

Figure 10C:
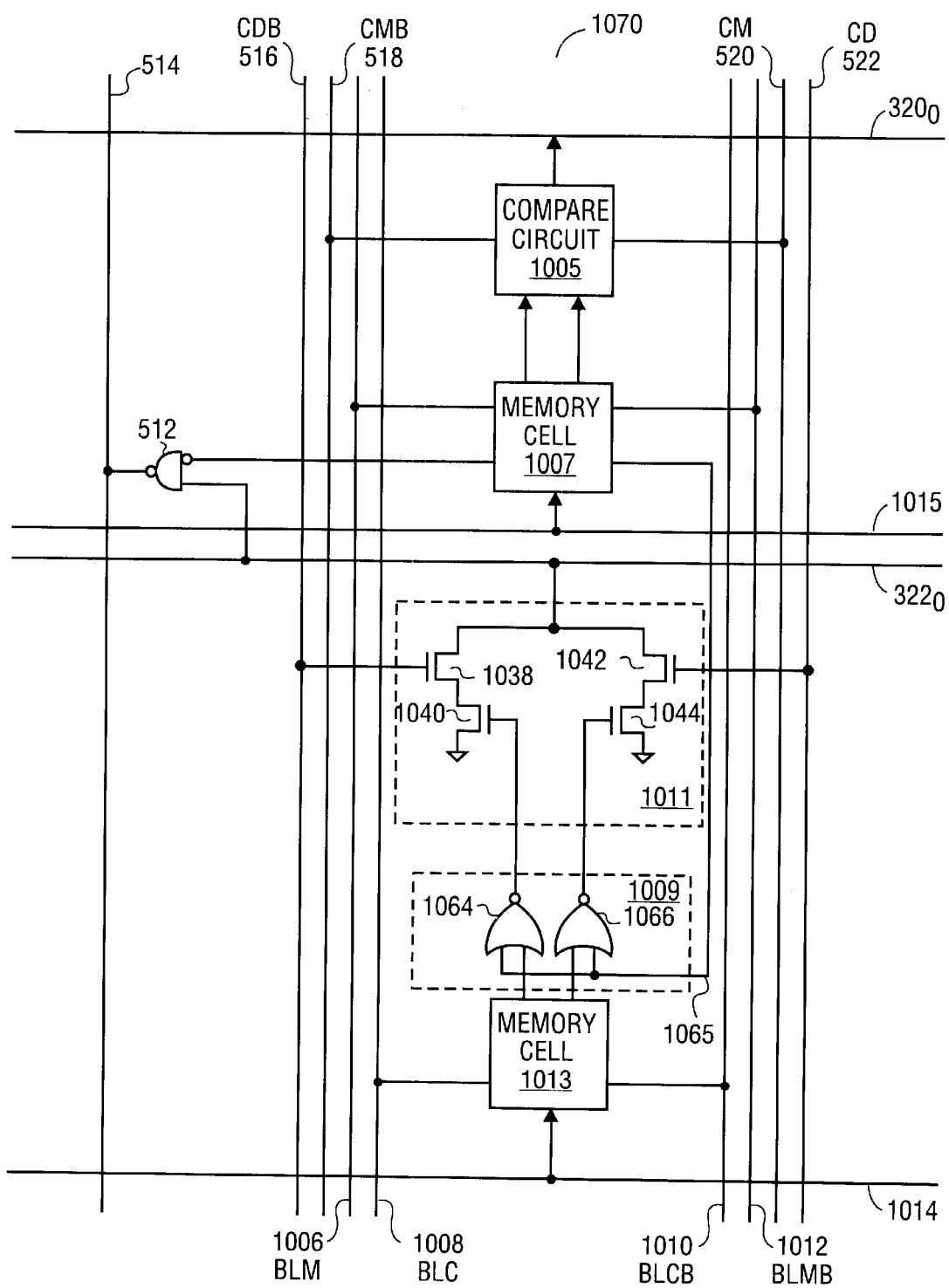
FIG. 10C is a logic diagram of another embodiment of the ternary CAM cell of FIG. 10A.

FIG. 10C shows ternary CAM cell 1070 that is another embodiment of CAM cell 1000 of FIG. 10A. Ternary CAM cell 1070 includes the same circuitry as in FIG. 10B for compare circuit 1011, but masking circuit 1009 includes two NOR gates 1064 and 1066. NOR gates 1064 and 1066 provide either masked data or the data stored in memory cell 1013 to transistors 1040 and 1044 in response to the prefix mask data stored in memory cell 1007. The prefix mask data may be provided to NOR gate 1064 and 1066 on one or more signal lines 1065. NOR gate 1064 has a first input coupled to line 1065, a second input to receive data stored in memory cell 1013, and an output coupled to the gate of transistor 1040. NOR gate 1066 has a first input coupled to line 1065, a second input to receive complementary data stored in memory cell 1013, and an output coupled to the gate of transistor 1044. When the prefix mask data is a logic zero on signal line 1065, masking is disabled and the logical complement of the data stored in memory cell 1013 is provided to compare circuit 1011 by NOR gates 1064 and 1066 to be compared with the comparand data on CDB 516 and CD 522. When the prefix mask data is a logic one on signal line 1065, masking is enabled and the masked data is provided to compare circuit 1011 such that CAM match line $322_0$ will not be discharged. For other embodiments, one or more other logic gates may be used in place of NOR gates 1064 and 1066.

Figure 11:
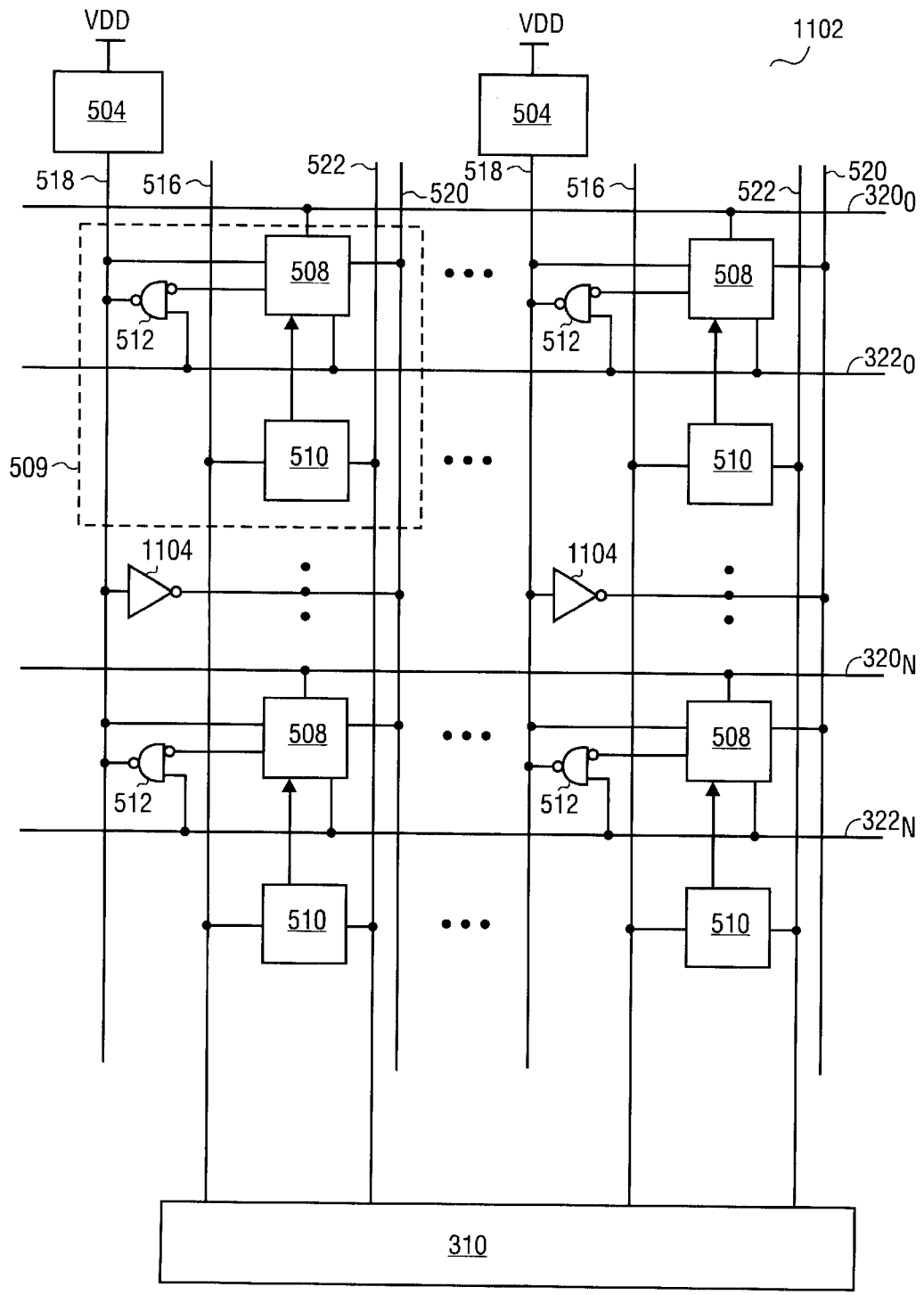
FIG. 11 is a block diagram of another embodiment of a ternary CAM array including mask cells, CAM cells, and prefix logic circuits.

FIG. 11 shows CAM array 902 that is an alternative embodiment of CAM array 502. As described above, CAM array 502 of FIG. 5 includes prefix match lines that provide the longest prefix to register 316. The longest prefix is then provided to mask compare lines 518 and 520 to be compared with the prefix mask data stored in the local mask words. CAM array 1102 does not include the prefix match lines 514 and may not use register 316. Instead, the prefix logic circuits 512 provide the result of the comparison of the prefix mask data and the CAM match lines directly to mask compare lines 518 and 520. Inverters 1104 may be coupled between mask compare line 518 and 520 to drive mask compare lines 520. This may save additional time from latching the longest prefix into a register and then driving the mask compare lines from the register. For example, the longest prefix may be valid by time t1 in FIG. 7A. Register 316 may be included to capture the longest prefix from lines 518 and/or 520. The longest prefix may still be output to prefix encoder 318 and/or PFXOBUS 336. The implementations of CAM array 502 shown in FIGS. 8A, 8B, 9A, 9B, 10A, 10B, and 10C can all be modified as shown in FIG. 11 to remove the prefix match lines 514 and have the prefix logic circuits directly drive the mask compare lines 518 and 520. Also, as indicated above, one or more logic gates may be added as in FIG. 18 to logically combine the logic states of each pair of match lines $320_x$ and $322_x$, and provide the result of this logical combination to priority encoder 306.

Figure 12:
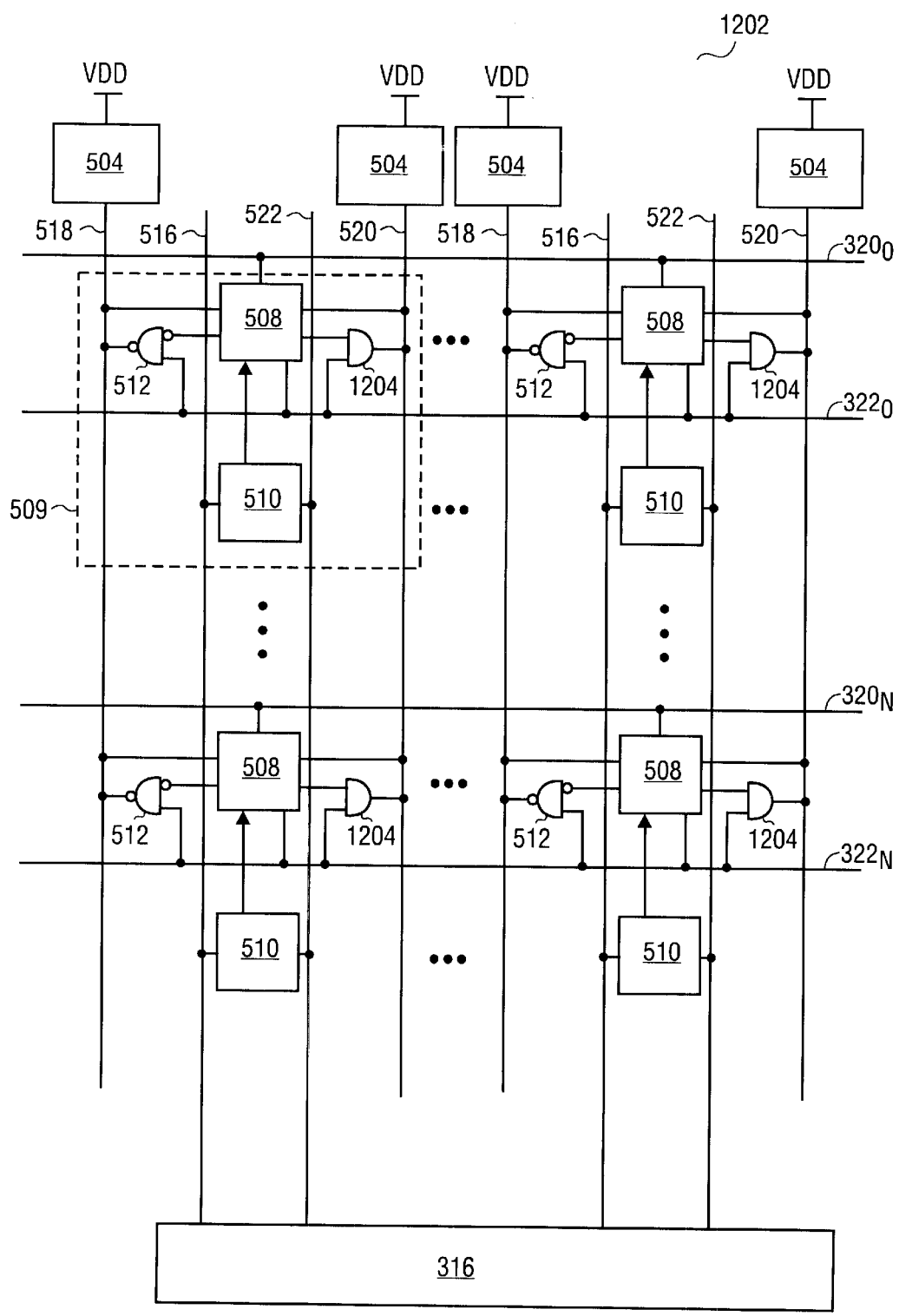
FIG. 12 is a block diagram of another embodiment of a ternary CAM array including mask cells, CAM cells, and prefix logic circuits.

FIG. 12 shows CAM array 1202 that is another alternative embodiment of CAM array 502. Like CAM array 1102, CAM array 1202 does not include the prefix match lines 514 and may not use register 316. Instead, the prefix logic circuits 512 provide the result of the comparison of the prefix mask data and the CAM match lines directly to mask compare lines 518 and 520. Instead of inverters 1104 to drive mask compare lines 520 as in CAM array 1102, AND gates 1204 are provided to compare CAM match lines $320_0$–$320_N$ with the prefix mask data stored in local mask cells 508. This may save additional time from latching the longest prefix into a register and then driving the mask compare lines from the register. Register 316 may be included to capture the longest prefix from lines 518 and/or 520. The longest prefix may still be output to prefix encoder 318 and/or PFXOBUS 336. The implementations of CAM array 502 shown in FIGS. 8A, 8B, 9A, 9B, 10A, 10B, and 10C can all be modified as shown in FIG. 12 to remove the prefix match lines 514 and have the prefix logic circuits directly drive the mask compare lines 518 and 520. Also, as indicated above, one or more logic gates may be added as in FIG. 18 to logically combine the logic states of each pair of match lines $320_x$ and $322_x$, and provide the result of this logical combination to priority encoder 306.

As described above, CAM device 300 can implement a search for a CIDR address that has the longest matching prefix without having to pre-sort or prearrange the CIDR address or prefix entries in the CAM array. CAM device 300 may also be included in a CAM system that has multiple CAM devices connected in a depth cascade configuration. Depth cascading of CAM devices effectively results in generating a CAM device that has a larger number of memory locations.

Figure 13:
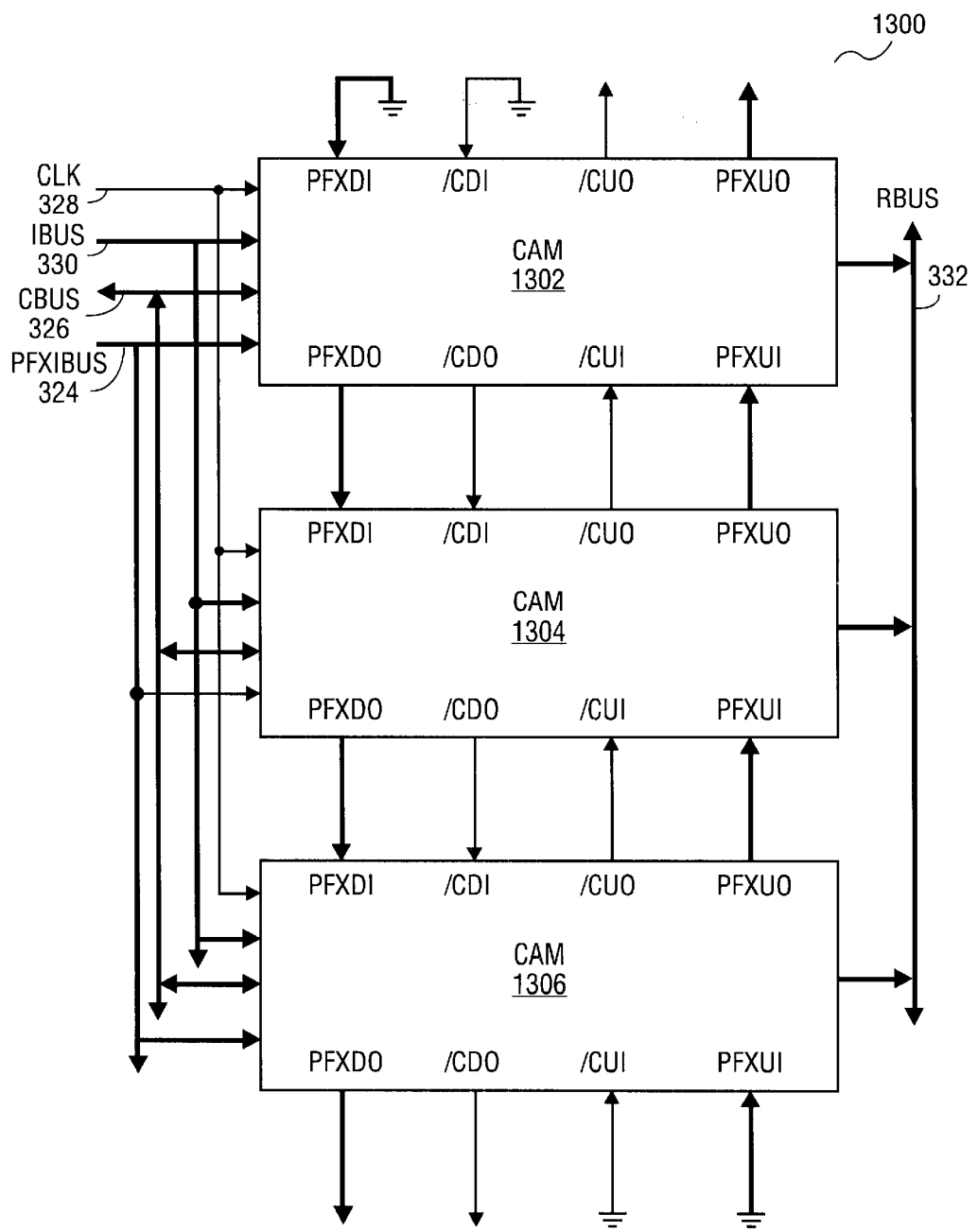
FIG. 13 is a block diagram of one embodiment of cascading CAM devices that store CIDR addresses.

FIG. 13 shows a CAM system 1300 that includes three CAM devices 1302, 1304, and 1306 interconnected in a depth cascade configuration. CIDR addresses may be arbitrarily stored in CAM devices 1302–1306 without initially pre-sorting or prearranging the entries, or rearranging or condensing the entries when old entries are retired or overwritten and new entries are added to any of the CAM devices. The CAM device that includes a matching address with the longest prefix for the entire CAM system 1300 may be determined as will be described in more detail below. Additionally, the CAM device that includes a matching address with the longest prefix for system 1300 may be determined regardless of the number of locations filled or occupied in each CAM device (i.e., one or more of CAM devices 1302–1306 may be full, empty, or partially full).

Any number of CAMs may be depth cascaded as shown in FIG. 13. The total memory size of system 1300 is larger than the individual memory sizes of each of CAMs 1302–1306. For example, if each CAM device is a 4 k×64 CAM device, then system 1300 may operate as a 12 k×64 CAM device. Any size of CAM devices may be used in the present invention. Also, CAMs of different widths may be depth cascaded together. Additionally, system 1300 may be formed from stand-alone CAM devices, or may be formed from integrated circuits on a common substrate.

Each CAM device receives in parallel clock signal CLK 328, comparand data and an addresses from CBUS 326, prefix data from PFXIBUS 324, and instructions from IBUS 330. For alternative embodiments, CBUS 326 and IBUS 330 may be the same bus. For yet another embodiment, CBUS 326 and PFXIBUS 324 may be the same bus. Other input signals may also be simultaneously provided to each of CAMs 1302–1306 including word enable signals, reset signals, chip enable signals, and the like. CAMs 1302–1306 may also output data to RBUS 332. RBUS 332 may not be coupled to each of CAM device. Also, each CAM device may output its own longest prefix data to a common (or not a common) PFXOBUS as in FIG. 3. Each CAM device 1302–1306 may include the circuitry shown in FIGS. 3, 5, 8A, 8B, 9A, 9B, 10A, 10B, 10C, 11, 12, and/or 18.

CAM devices 1302–1306 may each include a cascade down input /CDI, a cascade down output /CDO, a cascade up input /CUI, a cascade up output /CUO, prefix down inputs PFXDI, prefix down outputs PFXDO, prefix up inputs PFXUI, and prefix up outputs PFXUO. The PFXDO and PFXUO outputs provide longest prefix data like that provided on PFXOBUS 336 of CAM 300 of FIG. 3. The cascade up and down outputs provide signals that indicate when prefix data provided on the PFXDO and PFXUO outputs are valid. For other embodiments, the cascade inputs and outputs may be omitted and CLK 328 or match flag up and down signals may be used to validate the prefix outputs. Additional outputs or inputs such as full flag up and down pins may also be included.

Each CAM device generally has its /CDO output coupled to the /CDI input of the next device, its /CUO output coupled to the /CUI of the previous device, its /CDI input coupled to the /CDO of the previous device, its /CUI input coupled to the /CUO of the next device, its PFXDO outputs coupled to the PFXDI inputs of the next device, its PFXDI inputs coupled to the PFXDO outputs of the previous device, its PFXUI inputs coupled to the PFXUO outputs of the next device, and its PFXUO outputs coupled to the PFXUI inputs of the previous device. The term "previous device" refers to the CAM device that has the next higher (or lower) priority addresses relative to the current device. For example, CAM 1302 may be the "previous device" for CAM 1304. Similarly, the term "next device" refers to the CAM device that has the next lower (or higher) priority addresses relative to the current device. For example, CAM 1306 may be the "next device" for CAM 1304.

CAM 1302 may be designated as the highest priority CAM device by coupling its /CDI input and PFXDI inputs to a first power supply voltage (e.g., ground or approximately zero volts). The PFXDI inputs are coupled to ground because this indicates that there is no higher priority CAM device that has an address that matches a search key or comparand data. For another embodiment, the PFXDI inputs of CAM 1302 may be coupled to all logic one states (e.g., power supply VDD) to indicate that no higher priority CAM device has an address that matches a search key or comparand data.

The highest priority CAM device 1302 may have the lowest logical or numerical addresses of, for example, zero to X. The next highest priority CAM device 1304 may have addresses X+1 to N, and the lowest priority CAM device 1306 may have the highest logical addresses N+1 to M, where system 1300 has a total of M CAM words available for storage. CAM 1306 may be designated as the lowest priority CAM device by coupling its /CUI input and PFXUI inputs to ground. The logic zero states indicate that there is no lower priority CAM device with CAM cells that have an addresses that matches a search key or comparand data. For another embodiment, the PFXUI inputs of CAM 1306 may be coupled to all logic one states (e.g., power supply VDD) to indicate that no lower priority CAM device has an address that matches a search key or comparand data. For alternative embodiments, CAM 1302 may have the lowest priority addresses, and CAM 1306 may have the highest priority addresses.

The operation of system 1300 is as follows. Initially, one or more of CAM devices 1302–1306 is loaded with addresses and corresponding prefix mask data. In response to a compare instruction provided on IBUS 330 and comparand data provided on CBUS 326 (or stored in comparand register 310), each CAM device 1302–1306 compares the comparand data with the addresses stored in its CAM array. The prefix logic circuits in each CAM array then determine the longest prefix for any matching addresses. The longest prefix in each CAM device may then be encoded by prefix encoder 318 for output from the CAM device. The longest prefix in each CAM device is then compared with the longest prefix output from all previous devices (as provided by its previous device) and all next devices (as provided by its next device). If the longest prefix from the previous device is greater than or equal to the longest prefix of the current device, then the current device outputs the longest prefix of the previous device to its PFXDO outputs. If the longest prefix from the previous device is less than the longest prefix in the current device, then the current device outputs its own longest prefix to its PFXDO outputs. Similarly, if the longest prefix from the next device is greater than the longest prefix in the current device, then the current device outputs the longest prefix of the next device to its PFXUO outputs. If the longest prefix from the next device is less than or equal to the longest prefix in the current device, then the current device outputs its own longest prefix to its PFXUO outputs. By simultaneously comparing prefixes both down and up through system 1300, each CAM device can determine whether it has the longest prefix in the entire system. When a device has the longest prefix for the system, it may take control of RBUS 332 and output the match index of the location in its CAM array that stores a matching CIDR address corresponding to the longest prefix of the system. All other CAM devices will not be able to control RBUS 332.

Figure 14:
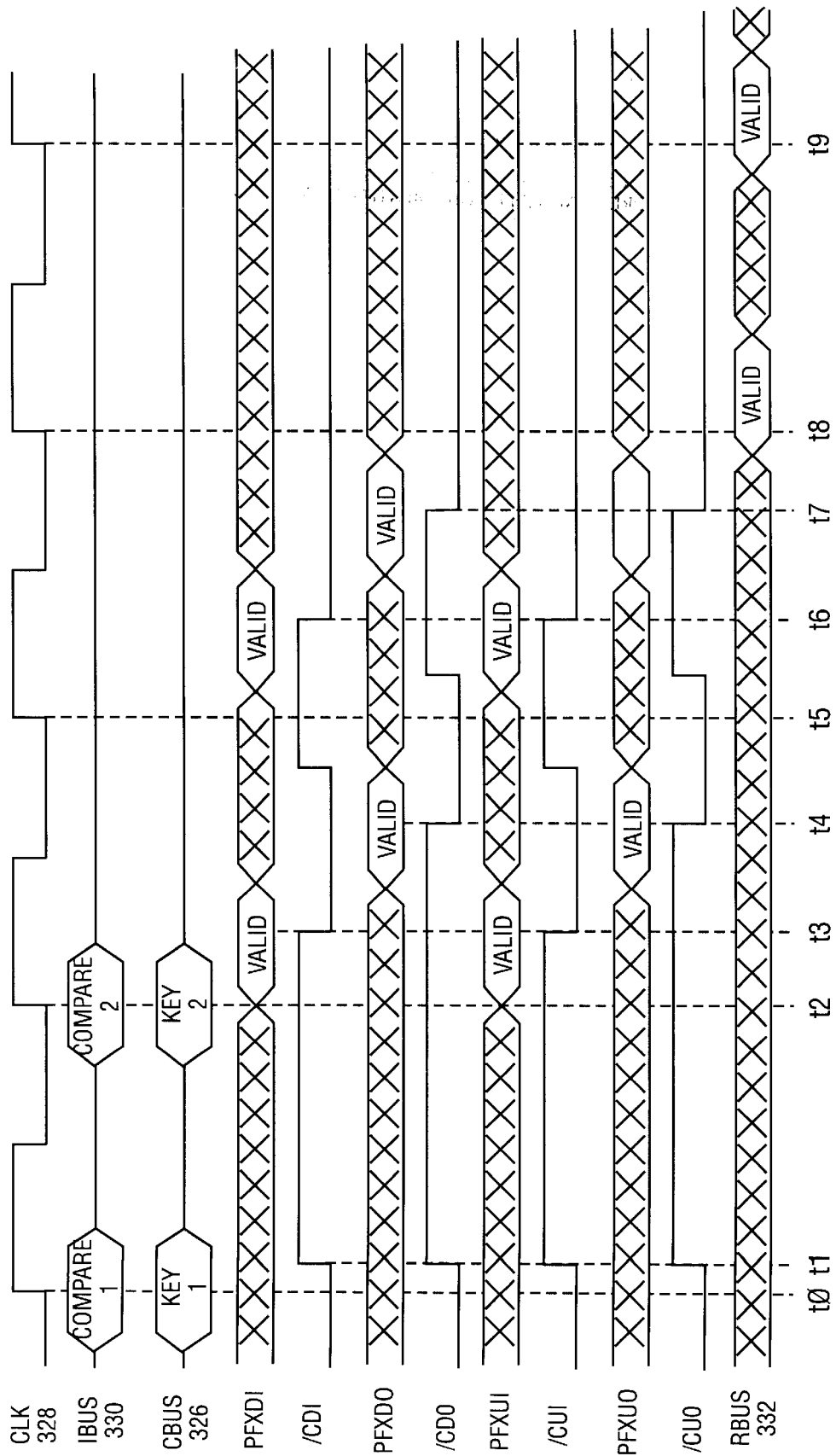
FIG. 14 is a timing diagram of the operation of one of the CAM devices of FIG. 13.

The operation of system 1300 may be further illustrated with the aid of the illustrative timing diagram of FIG. 14. FIG. 14 shows the signals that may be generated or received by CAM 1304. Each of CAMs 1302 and 1306 may operate in a similar manner. At time t0, CLK 328 transitions to a high logic state and each CAM device 1302–1306 compares the comparand data (or search key) on CBUS 326 (or stored in comparand registers 310) with the addresses stored in its CAM array. The prefix logic circuits in each CAM array then determine the longest prefix among the matching addresses in each CAM array. The longest prefix in each CAM device may then be encoded by prefix encoder 318 for output from the CAM device.

At time t1, each CAM deasserts its /CDO and /CUO outputs to high states. When CAM 1304 detects that its /CDI input is deasserted by CAM 1302, CAM 1304 is disabled from asserting its /CDO output to a low logic state and from taking control of RBUS 332. CAM 1302 may continue to deassert its /CDO output for a predetermined amount of time (i.e., until time t3) sufficient for CAM 1302 to provide its encoded longest prefix to the PFXDI inputs of CAM 1304 (starting at time t2). Thus, CAM 1302 asserts its /CDO output when valid encoded longest prefix data of CAM 1302 is present on its PFXDO outputs. In response to the assertion of its /CDI input, CAM 1304 loads the encoded prefix data from CAM 1302 and compares it with its own longest prefix. If the longest prefix from CAM 1302 is greater than or equal to the longest prefix of CAM 1304, then CAM 1304 outputs the prefix from CAM 1302 to its PFXDO outputs. If the longest prefix of CAM 1304 is greater than the longest prefix of CAM 1302, then CAM 1304 outputs its own prefix to its PFXDO outputs. At time t4, CAM 1304 then asserts its /CDO to indicate that the encoded longest prefix is valid on the PFXDO outputs.

Similarly, when CAM 1304 detects that its /CUI input is deasserted by CAM 1306, CAM 1304 is disabled from asserting its /CUO output to a low logic state and from taking control of RBUS 332. CAM 1306 may continue to deassert its /CUO output for a predetermined amount of time (i.e., until time t3) sufficient for CAM 1306 to provide its encoded longest prefix to the PFXUI inputs of CAM 1304 (starting at time t2). Thus, CAM 1306 asserts its /CUO input when valid encoded longest prefix data of CAM 1306 is present on its PFXUO outputs. In response to the assertion of its /CUI input, CAM 1304 loads the encoded prefix data from CAM 1306 and compares it with its own longest prefix. If the longest prefix from CAM 1306 is greater than the longest prefix of CAM 1304, then CAM 1304 outputs the prefix from CAM 1306 to its PFXUO outputs. If the longest prefix of CAM 1304 is greater than or equal to the longest prefix of CAM 1306, then CAM 1304 outputs its own prefix to its PFXUO outputs. At time t4, CAM 1304 then asserts its /CUO to indicate that the encoded longest prefix is valid on the PFXUO outputs. For alternative embodiments, the /CU and /CD signals may occur at different times relative to each other.

Assuming that CAM device 1304 has the longest prefix for system 1300, it may determine the matching index for the location in its own CAM array storing the matching address corresponding to the longest prefix. The match index may be output by time t8.

For an alternative embodiment in which the cascade inputs and outputs (i.e., /CDI, /CDO, /CUI, and /CUO) are omitted, the longest prefix data output on the PFXUO and PFXDO outputs may be continuously generated by each CAM device (e.g., from combinatorial logic) such that each CAM device does not need to wait for a validating signal to know when the data on the PFXDI and PFXUI inputs are valid. In this embodiment, so long as the data on the PFXDI and PFXUI inputs are valid by time t5 (or any other predetermined time), then the longest prefix for system 1300 can be accurately determined and the matching index associated with the longest prefix output by time t8 (or any other time).

As shown in FIG. 14, system 1300 may also pipeline instructions such that a second compare instruction may be loaded at time t2 and second match index output to RBUS 332 by time t9.

For an alternative embodiment, the compare operation, longest prefix determination, and output of an address associated with the longest prefix may be accomplished in a single clock cycle (e.g., t0 to t1). In this embodiment, multiple validating or timing signals /CDI-/CDO and /CUI-/CUO may be required to validate or time when the match flag, longest prefix, and RBUS data are output as valid from a CAM particular device.

FIG. 15 shows CAM device 1500 that is one embodiment of CAM devices 1302–1306. CAM 1500 is CAM device 300 that includes cascade logic 1506. Cascade logic 1506 is coupled to the /CDI, /CUI, PFXDI, and PFXUI inputs and to the /CDO, /CUO, PFXDO, and PFXUO outputs. For another embodiment, the cascade inputs and outputs (i.e., /CDI, /CDO, /CUI, and /CUO) may be omitted and thus not coupled to cascade logic 1506.

Cascade logic 1506 may receive a signal on line 1510 from instruction decoder 316 indicating that a compare operation will be performed by CAM 1500. Cascade logic 1506 may also receive an internal match flag signal on line 1504 from flag logic 308 indicating whether CAM 1500 has an address that matches a search key. Cascade logic 1506 compares the prefix data on its PFXDI and PFXUI inputs with its internal longest prefix data, and drives the appropriate longest prefix data to its PFXDO and PFXUO outputs. If CAM 1500 has the longest prefix for the system, then its may send a signal on line 1508 to allow output buffer 1502 to drive match index data onto RBUS 332.

Figure 16:
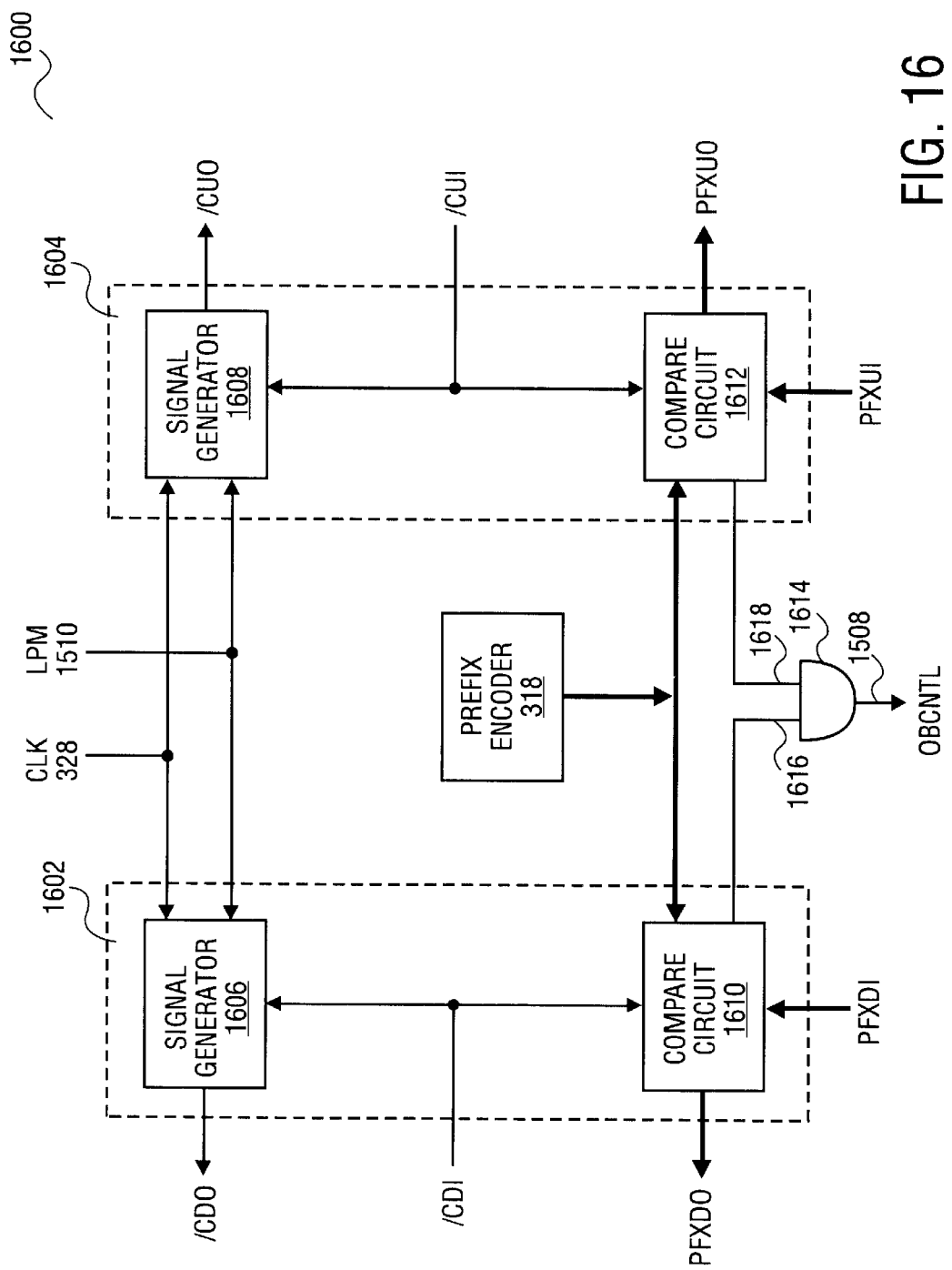
FIG. 16 is a block diagram of one embodiment of the cascade logic of FIG. 15.

FIG. 16 is a block diagram of cascade logic 1600 that is one embodiment of cascade logic 1506 of FIG. 15. Cascade logic 1600 includes cascade down logic 1602 and cascade up logic 1604. Cascade down logic 1602 generates signals for the /CDO and PFXDO outputs in response to /CDI, PFXDI inputs, and other internal signals (e.g., LPM and the output of prefix encoder 318). Cascade up logic 1604 generates signals on the /CUO and PFXUO outputs in response to /CUI, PFXUI inputs, and other internal signals (e.g., LPM and the output of prefix encoder 318). Other embodiments of cascade logic 1506 may be used.

Cascade down logic 1602 includes signal generator 1606 and compare circuit 1610. Signal generator 1606 receives CLK 326 and an LPM signal on line 1510 from instruction decoder 316. The LPM signal indicates that a compare instruction is to be performed by CAM 1500. Signal generator 1606 will assert /CDO to a low logic state after /CDI is asserted to a low logic state and when the data on the PFXDO outputs is valid. Signal generator 1606 may be any logic circuit that performs this function. For an alternative embodiment, LPM may be omitted and signal generator 1606 may generate /CDO in response to CLK 328 only. Compare circuit 1610 compares the prefix from prefix encoder 318 with the prefix from the PFXDI inputs. If the prefix output by prefix encoder 318 is less than or equal to the prefix on the PFXDI inputs, then compare circuit 1610 outputs the prefix from the PFXDI inputs to the PFXDO outputs. If, however, the prefix from prefix encoder 318 is greater than the prefix from the PFXDI inputs, then compare circuit 1610 outputs the prefix from prefix encoder 318 to the PFXDO outputs, and compare circuit 1610 also asserts line 1616 to a high state.

Cascade up logic 1604 includes signal generator 1608 and compare circuit 1612. Signal generator 1608 receives CLK 326 and an LPM signal on line 1510 from instruction decoder 316. Signal generator 1608 will assert /CUO to a low logic state after /CUI is asserted to a low logic state and when the data on the PFXUO outputs is valid. Signal generator 1608 may be any logic circuit that performs this function. For an alternative embodiment, LPM may be omitted and signal generator 1608 may generate /CUO in response to CLK 328 only. Compare circuit 1612 compares the prefix from prefix encoder 318 with the prefix from the PFXUI inputs. If the prefix output by prefix encoder 318 is greater than the prefix on the PFXUI inputs, then compare circuit 1612 outputs the prefix from the PFXUI inputs to the PFXUO outputs. If, however, the prefix from prefix encoder 318 is less than or equal to the prefix from the PFXUI inputs, then compare circuit 1612 outputs the prefix from prefix encoder 318 to the PFXUO outputs, and compare circuit 1612 also asserts line 1618 to a high state. When signal lines 1616 and 1618 are both at logic high states, then AND gate 1614 will drive OBCNTL on line 1508 to a high state to enable output buffer 1502 to drive data (e.g., a match index and/or associated data) to RBUS 332.

For an alternative embodiment in which the cascade inputs (/CDI and /CUI) and cascade outputs (/CDO and /CUO) are omitted, signal generators 1606 and 1608 may also be omitted. For yet another embodiment in which multiple /CDI-/CDO and /CUI-/CUO pins are included, multiple pairs of signal generators may also be included.

As described above, a single CAM device 300 of FIG. 3 can implement a search for a CIDR address that has the longest matching prefix. Additionally, multiple CAM devices 300 can be connected to form a depth cascaded CAM system and determine amongst themselves which of the CAM devices has the longest matching prefix for the entire CAM system. CAM device 300 can also have its CAM array 302 segmented or partitioned into a number of CAM array blocks each having a portion of the total number of available CAM entries. The prefix logic circuits determine the longest prefix in each CAM array block from among CAM entries that match the search key ("the block prefix"). The block prefix is then compared with the prefix mask data in its respective block and the match results provided to priority encoder 306 to determine the highest priority matching address in the entire CAM array.

For another embodiment, the block prefixes are provided to compare circuitry that determines which of the block prefixes is the longest for the entire CAM device. That is, the compare circuitry determines which of the block prefixes has the largest number of contiguous higher-order prefix mask bits set to a no mask state. A block select circuit then selects the CAM array block that stores the longest prefix for the entire CAM device for comparison with the prefix mask data in that CAM array block. The CAM index or address of the matching location may then be output from the CAM device. By restricting the search of the device-level longest prefix to only one CAM array block, power drawn during this comparison is reduced over searching all CAM array blocks in parallel. If there are n CAM array blocks, then power drawn due to this comparison is reduced to $1/n^{th}$ of that when all CAM array blocks are searched in parallel.

Figure 19:
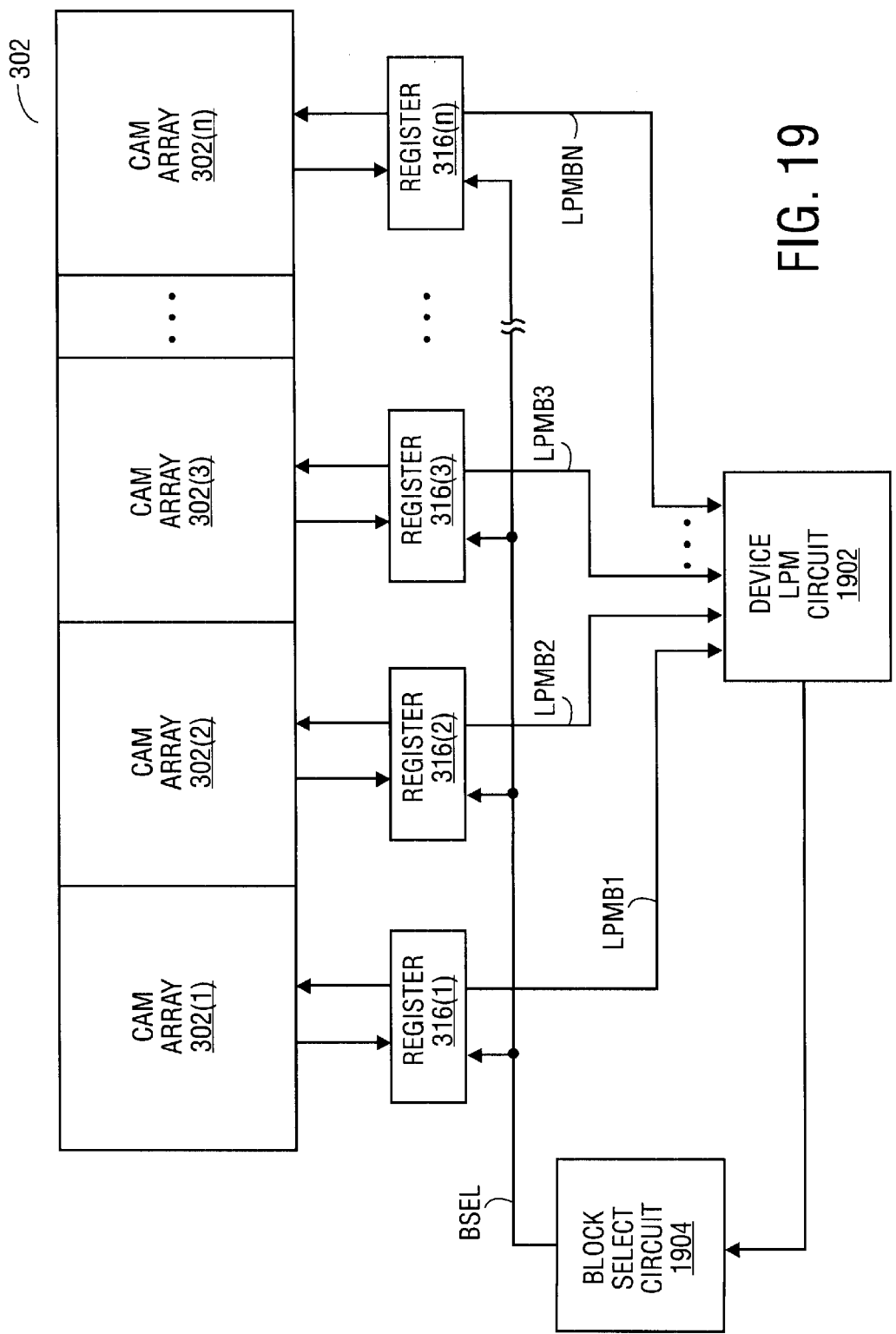
FIG. 19 is a block diagram of one embodiment of ternary CAM array segmented into a plurality of array blocks, longest prefix match circuitry for the entire ternary CAM array and block select circuitry.

FIG. 19 shows one embodiment for performing a longest prefix match function in a segmented CAM array 302 using the compare and block select circuitry. CAM array 302 is segmented into n CAM array blocks 302 (1) to 302 (n), where n is any number. Each CAM array block has a number of ternary CAM rows that include prefix logic circuits, local mask words, and CAM words. The rows may also include one or more other binary or ternary CAM cells. The CAM array blocks may each have any number of rows of ternary CAM cells including the same number or different numbers. CAM array block 302(1) is the highest priority CAM array block, block 302(2) is the next highest CAM array block, and block 302(n) is the lowest priority CAM array block. For example, block 302(1) has addresses 0 to X, block 302(1) has addresses X+1 to Y, and so on, with block 302(n) having the final block of addresses, where X and Y are any numbers. The relative priorities of the addresses are designated to resolve multiple match conditions of the block prefixes during a compare operation. The mask match lines associated with each block are provided to priority encoder 306.

The general operation to determine the location of a matching CIDR address in one of the CAM array blocks 302(1) to 302(n) that has the longest prefix for the entire CAM array 302 is as follows. Initially, the IP addresses and corresponding prefix masks of CIDR addresses are loaded into the CAM words and local mask words, respectively, of blocks 302(1) through 302(n). The addresses and prefixes may be arbitrarily loaded into any of the blocks without pre-sorting or prearranging the addresses by prefix length or any other predetermined algorithm. Additionally, the blocks may be updated at any time by adding or deleting addresses and/or their prefix masks without having to re-sort or rearrange CAM array 302. New addresses may simply be added to the next free address or any other location in CAM array 302. Similarly, addresses may be invalidated or deleted without regard to rearranging or condensing the remaining entries in CAM array 302 or any one of the CAM array blocks.

A compare instruction causes comparand data to be compared with the CIDR addresses stored in each of the CAM array blocks. The comparisons are masked on a bit-by-bit basis by the prefix mask data stored in each of the local mask words. The prefix logic circuits determine the block prefixes in each CAM array block and provide the block prefixes LPMB1–LPMBn to registers 316(1) through 316(n). For other embodiments, registers 316 are not used. Registers 316 provide the block prefixes to device longest prefix match (LPM) circuit 1902 that logically compares or combines the block prefixes with each other to determine which of the block prefixes is the longest for the entire CAM array 302("the longest block prefix"). That is, circuit 1902 determines which of the block prefixes has the largest number of contiguous higher-order prefix mask bits set to a no mask state.

Circuit 1902 provides to block select circuit 1904 an indication of which CAM array block stores the longest block prefix. In response, block select circuit 1904 provides block select signals BSEL to registers 316(1)–316(n). The block select signals select which register 316 outputs its block prefix to its respective CAM array block for comparison with the prefix mask data stored in the rows of local mask cells of that CAM array block. The results will be reflected on the mask match lines and encoded by priority encoder 306 to determine the CAM index or address of the matching location. Thus, the search between the longest block prefix and the prefix mask data is restricted to a single CAM array block. This can reduce power drawn or dissipated during this comparison operation to $1/n^{th}$ of that when all CAM array blocks are searched simultaneously.

For another embodiment, LPM circuit 1902 may determine the longest block prefix for array 302. The longest block prefix is then provided to block select circuit 1904 together with each of LPMB1–LPMBn. Block select circuit 1904 compares the longest block prefix with block prefixes LPMB1–LPMBn and generates the BSEL signals to select one CAM array block to compare the longest block prefix with its prefix mask data.

Circuit 1902 may also output the longest block prefix directly to the CAM array blocks or to one or more registers other than registers 316. For example, the longest block prefix may be provided to data drivers of each CAM array block, and the block select signals BSEL may control whether the longest block prefix is provided by the data drivers to the mask compare lines.

The segmentation of CAM arrays can be further extended to include groups of CAM array blocks. For example, CAM array blocks 302(1)–302(n) may comprise one group of CAM array blocks, and another group of CAM array blocks 302(n+1)–302(p) may be included in CAM array 302, where p is any number. For this embodiment, device LPM circuit 1902 may receive all of the block prefixes from each of the p CAM array blocks and provide the longest block prefix or an indication of the longest block prefix to block select circuit 1904. Block select circuit 1904 may then provide block select signals BSEL to all p CAM array blocks. For another embodiment, each group of CAM array blocks may have its own device LPM circuit 1902 coupled to block select circuit 1904 or to its own block select circuit 1904.

Figure 20:
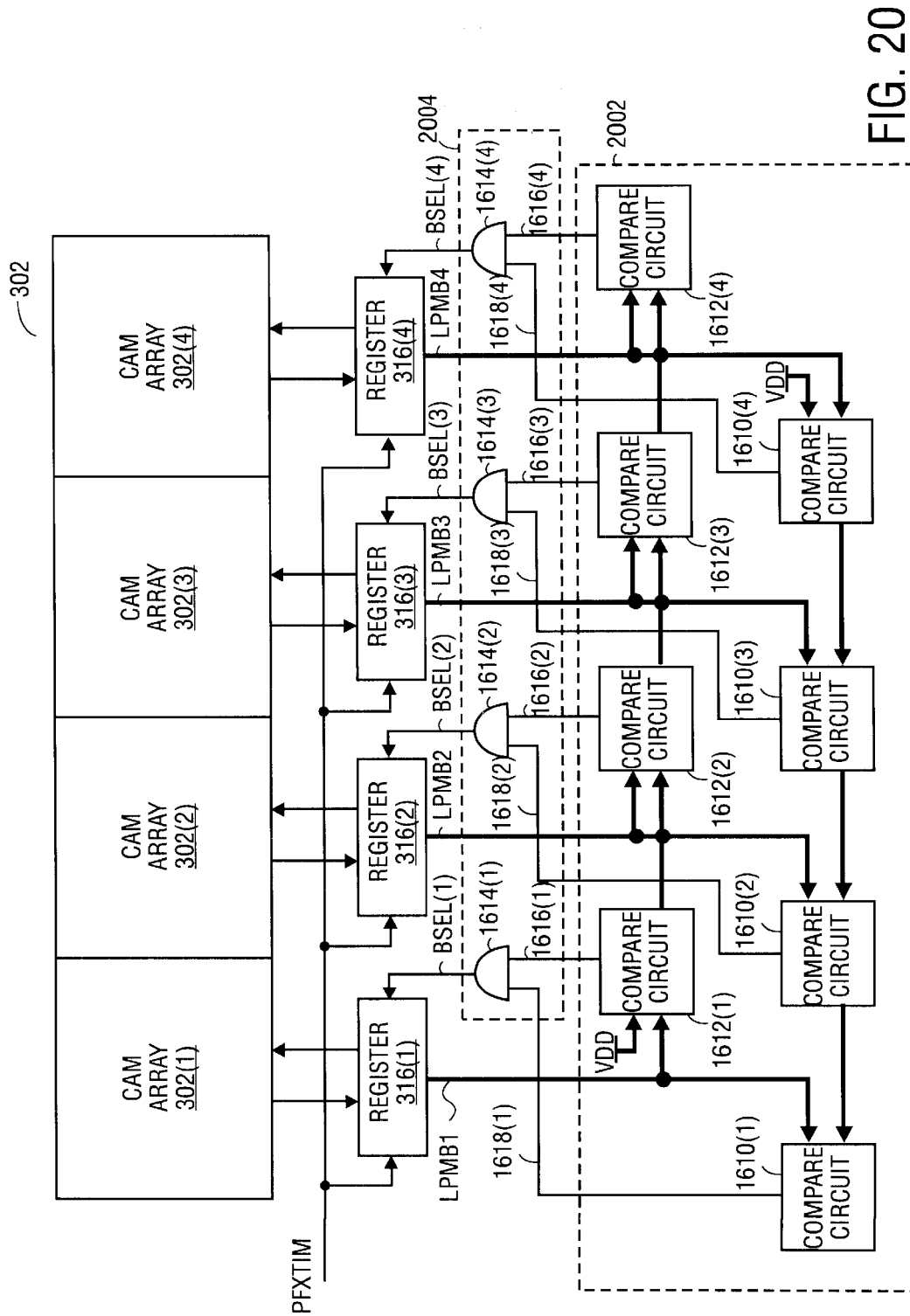
FIG. 20 is a block diagram of one embodiment of the longest prefix match circuitry and the block select circuitry of FIG. 19.

FIG. 20 shows one embodiment of block select circuit 1904 and device LPM circuit 1902 of FIG. 19. For this embodiment, CAM array 302 is segmented or partitioned into four CAM blocks 302(1)–302(4). Any number of CAM array blocks can be used. Device LPM circuit 2002 and block select circuit 2004 include portions of the cascade logic 1600 described above with respect to FIG. 16 such that circuit 2002 includes a pair of compare circuits 1610 and 1612 for each CAM array block, and block select circuit 2004 includes an AND gate for each pair of compare circuits. This embodiment may be considered an intra-device depth cascade configuration.

The operation of the CAM device of FIG. 20 is as follows. Initially, one or more of CAM array blocks 302(1)–302(4) is loaded with addresses and corresponding prefix mask data. In response to a compare instruction each block determines the block prefix for any matching addresses within a block. The block prefixes may then be encoded by one or more prefix encoders or provided directly to compare circuit pairs 1610 and 1612. Compare circuits 1610 and 1612 simultaneously compare the block prefixes LPMB1–LPMB4 such that each CAM array block can determine whether it has the longest block prefix. Each compare circuit 1612(x) compares the block prefix from its corresponding CAM array block 302(x) with the block prefix provided by compare circuit 1612(x−1), where x is any number. If the block prefix from compare circuit 1612(x−1) is greater than (i.e., has more prefix mask bits set to a no mask state) or equal to the block prefix of CAM array block 302(x), then compare circuit 1612(x) asserts signal line 1616(x) to a low logic state and outputs the block prefix provided by compare circuit 1612(x−1) to compare circuit 1612(x+1); otherwise, compare circuit 1612(x) asserts signal line 1616(x) to a high logic state and outputs the block prefix of CAM array 302(x) to compare circuit 1612(x+1). Similarly, each compare circuit 1610(x) compares the block prefix from its corresponding CAM array block 302(x) with the block prefix provided by compare circuit 1610(x+1). If the block prefix from compare circuit 1610(x+1) is greater than the block prefix of CAM array block 302(x), then compare circuit 1610(x) asserts signal line 1618(x) to a low logic state and outputs the block prefix provided by compare circuit 1610 (x+1) to compare circuit 1610(x−1); otherwise, compare circuit 1610(x) asserts signal line 1618(x) to a high logic state and outputs the block prefix of CAM array 302(x) to compare circuit 1610(x−1).

The signals provided on signal lines 1616 and 1618 provide an indication of which CAM array block stores the longest block prefix. AND gates 1614 translate this information into block select signals BSEL(1)–BSEL(4), which are provided to registers 316(1)–316(4), respectively. When signal lines 1616(x) and 1618(x) are both high logic states for a particular CAM array block 302(x), AND gate 1614(x) will drive its block select signal BSEL(x) to a high state to enable register 316(x) to provide the block prefix to CAM array block 302(x) for comparison with its prefix mask data. The logic state of the block select signals BSEL(1)–BSEL (4) may be qualified or timed by signal PFXTIM such that register 316(x) only provides its block prefix to block 302(x) when BSEL(x) has settled to a steady state after all of the comparisons have taken place by compare circuits 1610 and 1612. For alternative embodiments, PFXTIM may be omitted.

Compare circuit 1612(1) compares the block prefix from block 302(1) with predetermined prefix data of all logic one's. The logic one's indicate that there is no mask bit set, such that compare circuit 1612(1) outputs the block prefix of block 302(1). For another embodiment, compare circuit 1612(1) may be omitted and the block prefix of block 302(1) provided directly to compare circuit 1612(2). Similarly, compare circuit 1610(4) compares the block prefix from block 302(4) with predetermined prefix data of all logic one's. The logic one's indicate that there is no mask bit set, such that compare circuit 1612(4) outputs the block prefix of block 302(4). For another embodiment, compare circuit 1612(4) may be omitted and the block prefix of block 302(4) provided directly to compare circuit 1612(3).

For an alternative embodiment, additional compare circuitry (e.g., AND logic or OR logic) may be included to determine the longest block prefix. The longest block prefix may then be provided to the CAM array blocks. For example, the longest block prefix may be provided to data drivers of each CAM array block, and the block select signals BSEL may control whether the longest block prefix is provided by the data drivers to the mask compare lines.

Figure 21:
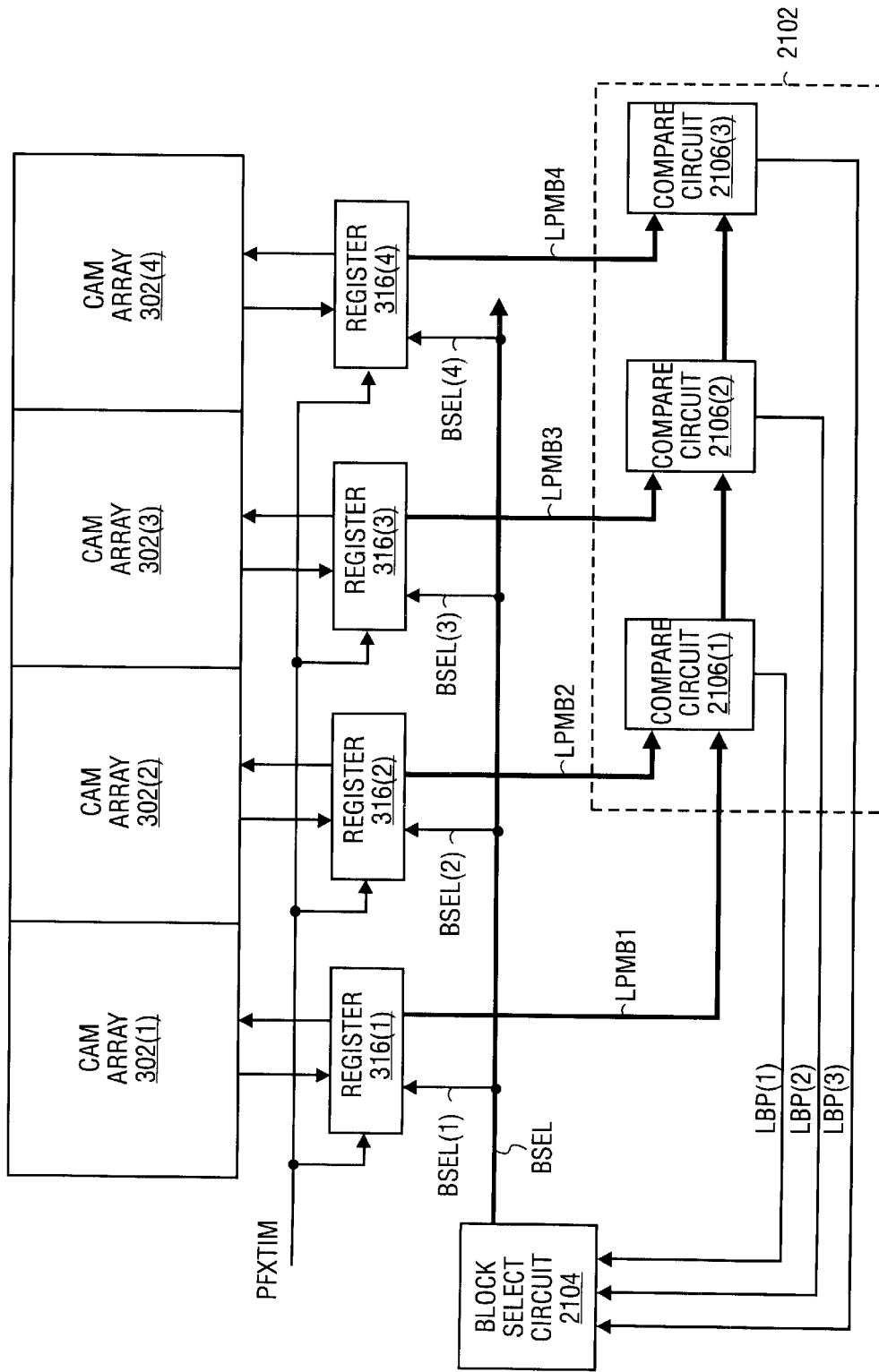
FIG. 21 is a block diagram of another embodiment of the longest prefix match circuitry and the block select circuitry of FIG. 19.

FIG. 21 shows another embodiment of block select circuit 1904 and device LPM circuit 1902 of FIG. 19. For this embodiment, CAM array 302 is also segmented or partitioned into four CAM blocks 302(1)–302(4). Any number of CAM array blocks can be used. Device LPM circuit 2102 includes compare circuits 2106(1)–2106(3) that compare block prefixes LPMB1–LPMB4, and provide an encoded indication of the longest block prefix as signals LBP(1) –LBP(3) to block select circuit 2104. Block select circuit 2104 decodes the LBP signals to generate the block select signals BSEL and select one of the CAM array blocks to perform the comparison of the longest block prefix with its prefix mask data.

The operation of the CAM device of FIG. 21 is as follows. Initially, one or more of CAM array blocks 302(1)–302(4) is loaded with addresses and corresponding prefix mask data. In response to a compare instruction each block determines the block prefix for any matching addresses within a block. The block prefixes may then be encoded by one or more prefix encoders or provided directly to the compare circuit 2106. Compare circuit 2106(1) compares the block prefix from block 302(1) with the block prefix from block 302(2). If the block prefix from block 302(1) is greater than (i.e., has more prefix mask bits set to a no mask state) or equal to the block prefix from block 302(2), then compare circuit 2106 (1) asserts LBP(1) to a low logic state and provides the block prefix of block 302(1) to compare circuit 2106(2); otherwise, compare circuit 2106(1) asserts signal line LBP (1) to a high logic state and provides the block prefix of block 302(2) to compare circuit 2106(2). Compare circuit 2106(2) compares the block prefix from compare circuit 2106(1) with the block prefix from block 302(3). If the block prefix from compare circuit 2106(1) is greater than or equal to the block prefix from block 302(3), then compare circuit 2106(2) asserts LBP(2) to a low logic state and provides the block prefix compare circuit 2106(1) to compare circuit 2106(3); otherwise, compare circuit 2106(2) asserts signal line LBP(2) to a high logic state and provides the block prefix of block 302(3) to compare circuit 2106(3). Similarly, compare circuit 2106(3) compares the block prefix from compare circuit 2106(2) with the block prefix from block 302(4). If the block prefix from compare circuit 2106(2) is greater than or equal to the block prefix from block 302(4), then compare circuit 2106(3) asserts LBP(3) to a low logic state and provides the block prefix from compare circuit 2106(2) to compare circuit 2106(4); otherwise, compare circuit 2106(3) asserts signal line LBP(3) to a high logic state and provides the block prefix of block 302(4) to compare circuit 2106(4).

Block select circuit 2104 decodes the LBP signals to generate the block select signals BSEL and select one of the CAM array blocks to perform the comparison of the longest block prefix with its prefix mask data. The logic state of the block select signals BSEL(1)–BSEL(4) may be qualified or timed by signal PFXTIM. For alternative embodiments, PFXTIM may be omitted.

For an alternative embodiment, additional compare circuitry (e.g., AND logic or OR logic) may be included to determine the longest block prefix. The longest block prefix may then be provided to the CAM array blocks. For example, the longest block prefix may be provided to data drivers of each CAM array block, and the block select signals BSEL may control whether the longest block prefix is provided by the data drivers to the mask compare lines.

Any logic or circuits may be used to implement block select circuit 2104. Table 1 shows one example of a truth table for implementing block select circuit 2104 for three input signals LPB(1)–LPB(3) and four output signals BEL(1)–BSEL(4). Other truth tables may be used (and corresponding logic generated accordingly) including those that logically complement one of more or the signals indicated in Table 1, and those that include more or less inputs and/or outputs.

TABLE 1

| LBP (1) | LBP (2) | LBP (3) | BSEL (1) | BSEL (2) | BSEL (3) | BSEL (4) |
|---|---|---|---|---|---|---|
| 0 | 0 | 0 | 1 | 0 | 0 | 0 |
| 0 | 0 | 1 | 0 | 0 | 0 | 1 |
| 0 | 1 | 0 | 0 | 0 | 1 | 0 |
| 0 | 1 | 1 | 0 | 0 | 0 | 1 |
| 1 | 0 | 0 | 0 | 1 | 0 | 0 |
| 1 | 0 | 1 | 0 | 0 | 0 | 1 |
| 1 | 1 | 0 | 0 | 0 | 1 | 0 |
| 1 | 1 | 1 | 0 | 0 | 0 | 1 |

Figure 22:
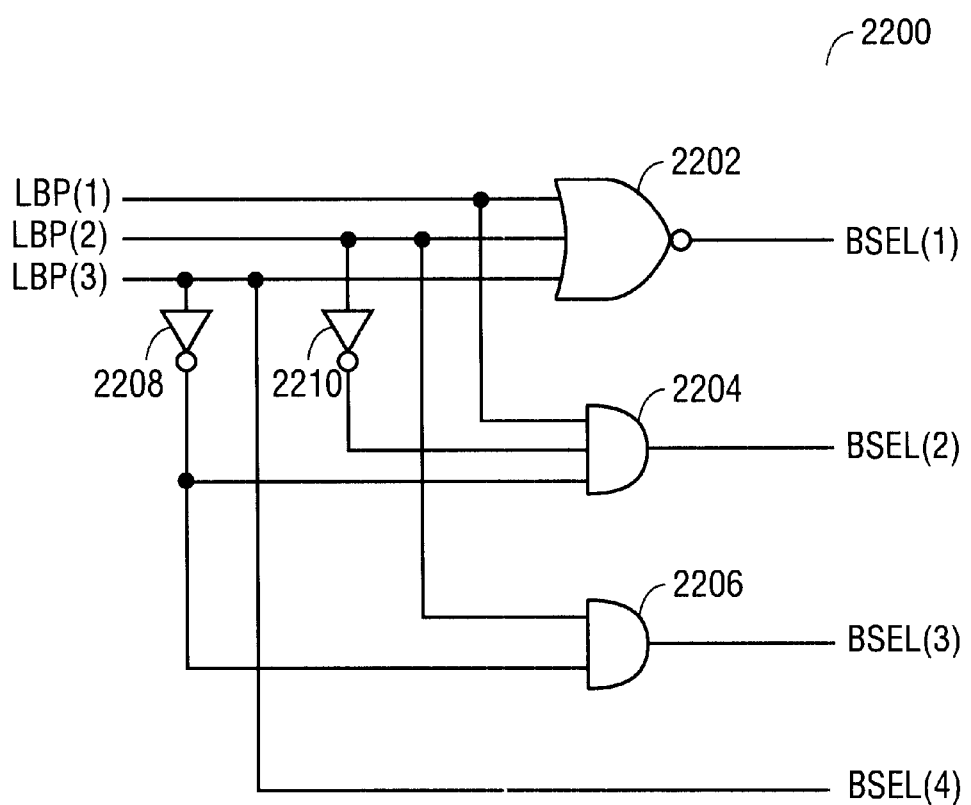
FIG. 22 is a logic diagram of one embodiment of the block select circuitry of FIG. 21.

Any logic or circuitry may be used to implement the truth table of Table 1. FIG. 22 shows block select logic 2200 that is one embodiment of implementing the truth table of Table 1. Logic 2200 includes NOR gate 2202, AND gates 2204 and 2206, and inverters 2208 and 2210. NOR gate 2202 generates BSEL(1) from LBP(1)–LBP(3). AND gate 2204 generates BSEL(2) from LBP(1), LBP(2) as complemented by inverter 2210, and LBP(3) as complemented by inverter 2208. AND gate 2206 generates BSEL(3) from LBP(2) and LBP(3) as complemented by inverter 2208. BSEL(4) is the same signal as LBP(3).

Figure 23:
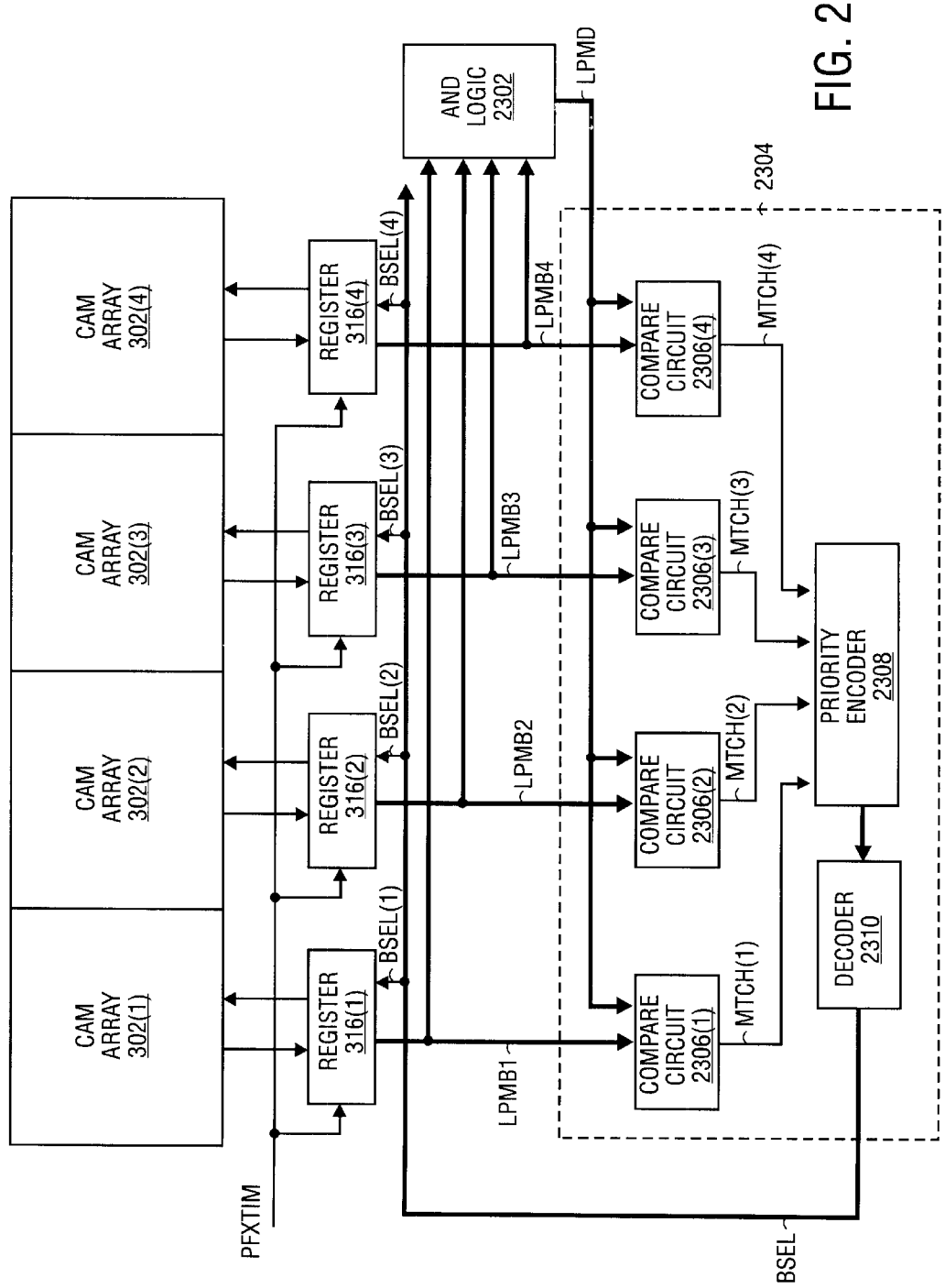
FIG. 23 is a block diagram of another embodiment of the longest prefix match circuitry and the block select circuitry of FIG. 19.

FIG. 23 shows another embodiment of block select circuit 1904 and device LPM circuit 1902 of FIG. 19. For this embodiment, CAM array 302 is also segmented or partitioned into four CAM blocks 302(1)–302(4). Any number of CAM array blocks can be used. AND logic 2302 is one embodiment of device LPM circuit 1902. AND logic 2302 includes one or more AND gates that logically combines or compares the block prefixes LPMB1–LPMB4 on a bit-by-bit basis to generate the longest block prefix LPMD which is a composite of the individual block prefixes. For this embodiment, each block prefix indicates a no-mask state with a logic zero. For other embodiments, each block prefix indicates a no-mask state with a logic one, and AND logic 2302 may be replaced with OR logic.

Block select circuit 2304 includes compare circuits 2306 (1)–2306(4), priority encoder 2308 and decoder 2310. Each compare circuit 2306(x) compares a block prefix LPMBx with LPMD and generates a match signal MTCH(x) that indicates whether the block prefix matches the longest block prefix. Priority encoder 2308 and decoder 2310 translate the MTCH signals into the block select signals BSEL to select one of the CAM array blocks to perform the comparison of the longest block prefix with its prefix mask data. The logic state of the block select signals BSEL(1)–BSEL(4) may be qualified or timed by signal PFXTIM. For alternative embodiments, PFXTIM may be omitted. If each block prefix indicates a different number of contiguous higher-order prefix mask bits set to a no mask state, then only one match signal MTCH will be asserted, and the MTCH signals can be used directly as the block select signals BSEL. If, however, more than one block prefix matches LPMD, multiple MTCH signals are asserted. For another embodiment, priority encoder 2310 itself may generate the select signals BSEL.

For another embodiment, encoding circuitry may be provided for LPMB1–LPMB4 prior to providing LPMB1–LPMB4 to AND logic 2302 and/or compare circuits 2306(1)–2306(4), and AND logic 2302 altered accordingly to determine LPMD. For example, AND logic 2302 may be replaced by one or more compare circuits.

LPMD may also be provided directly to the CAM array blocks or to one or more registers other than registers 316. For example, LPMD may be provided to data drivers of each CAM array block, and the block select signals BSEL may control whether the longest block prefix is provided by the data drivers to the mask compare lines.

Figure 24:
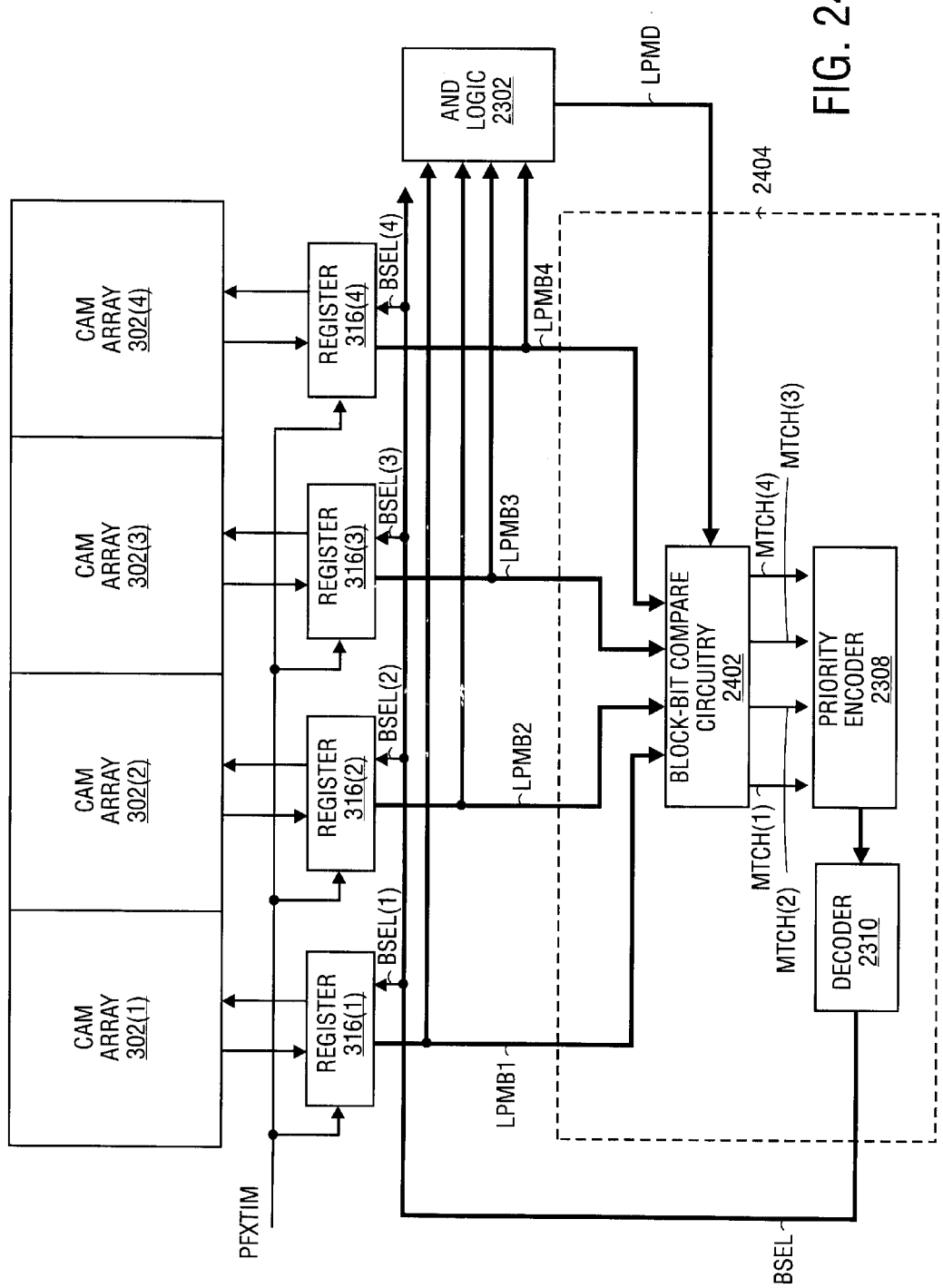
FIG. 24 is a block diagram of another embodiment of the longest prefix match circuitry and the block select circuitry of FIG. 19.

FIG. 24 shows another embodiment of block select circuit 1904 and device LPM circuit 1902 of FIG. 19. For this embodiment, CAM array 302 is also segmented or partitioned into four CAM blocks 302(1)–302(4). Any number of CAM array blocks can be used. Block select circuit 2404 includes block-bit compare circuitry 2402, priority encoder 2308 and decoder 2310. Block-bit compare circuitry 2402 compares one bit from each of the block prefixes LPMB1–LPMB4 with a corresponding bit from LPMD to generate signals MTCH(1)–MTCH(4). MTCH(1)–MTCH (4) indicate whether LPMB1–LPMB4, respectively, match LPMD. Priority encoder 2308 and decoder 2310 translate the MTCH signals into the block select signals BSEL to select one of the CAM array blocks to perform the comparison of the longest block prefix with its prefix mask data. For another embodiment, priority encoder 2310 itself may generate the select signals BSEL. The logic state of the block select signals BSEL(1)–BSEL(4) may be qualified or timed by signal PFXTIM. For alternative embodiments, PFXTIM may be omitted.

For another embodiment, encoding circuitry may be provided for LPMB1–LPMB4 prior to providing LPMB1–LPMB4 to AND logic 2302 and/or block-bit compare circuitry 2402, and AND logic 2302 altered accordingly to determine LPMD.

Figure 25:
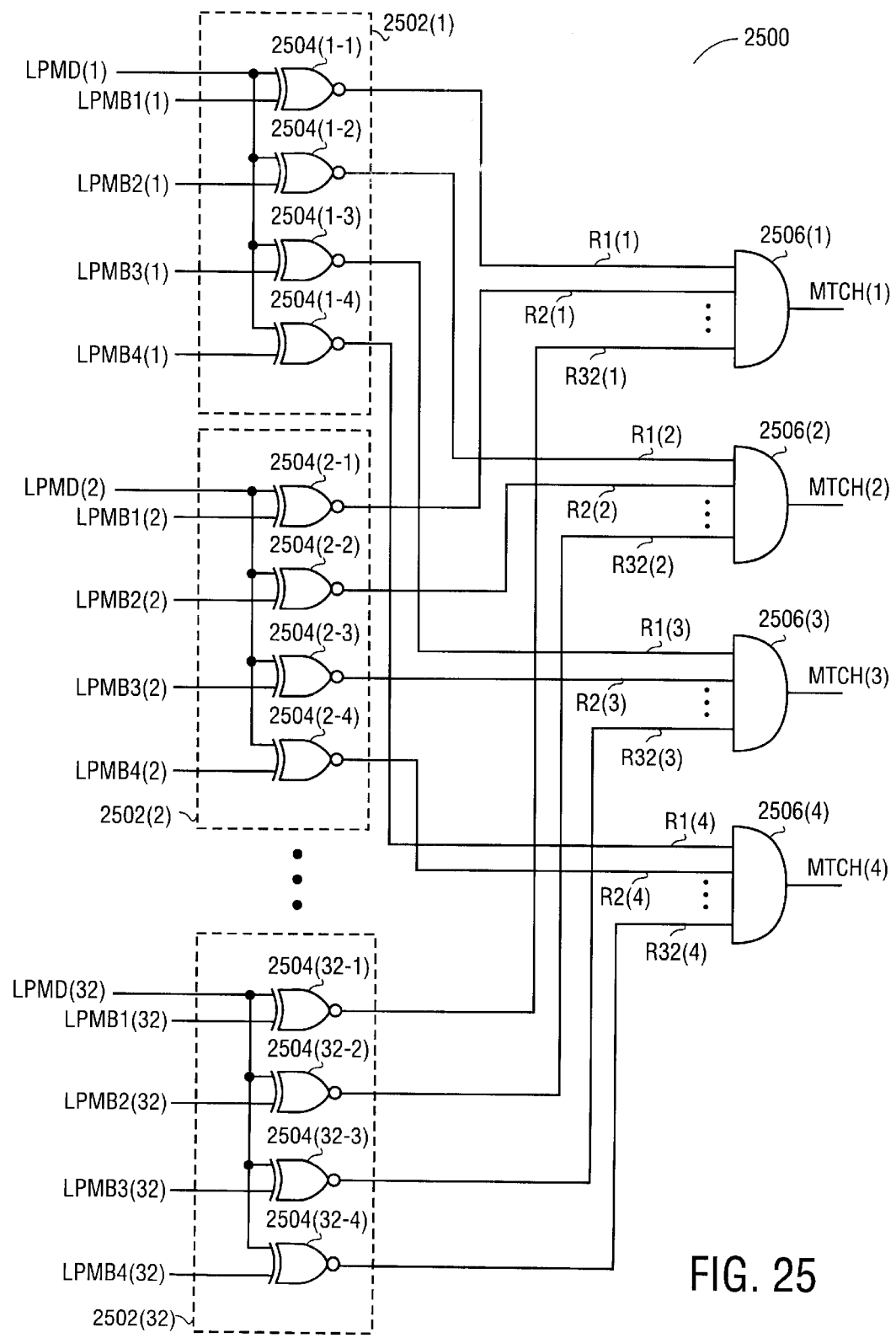
FIG. 25 is a logic diagram of one embodiment of the block-bit compare circuitry of FIG. 24.

FIG. 25 shows block-bit compare circuitry 2500 that is one embodiment of block-bit compare circuitry 2402. Other embodiments may be used. For this embodiment, each block prefix and LPMD have 32 bits. For other embodiments, each block prefix and LPMD may have any number of bits. Block-bit compare circuitry 2500 includes exclusive-NOR (XNOR) circuit blocks 2502(1)–2502(32) and AND gates 2506(1)–2506(4). XNOR circuit blocks 2502 each include XNOR circuitry to compare a bit from each of the block prefixes LPMB1–LPMB4 with a corresponding bit from LPMD. For example, XNOR circuit block 2502(1) includes XNOR gates 2504(1-1), 2504(1-2), 2504(1-3), and 2502 (14). XNOR gate 2504 compares LPMD(1) with LPMB1(1) and generates result signal R1(1). XNOR gate 2504(1-2) compares LPMD(1) with LPMB2(1) and generates result signal R1(2). XNOR gate 2504(1-3) compares LPMD(1) with LPMB3(1) and generates result signal R1(3). XNOR gate 2504(1-4) compares LPMD(1) with LPMB4(1) and generates result signal R1(4). XNOR circuits 2502(2)–2504(4) are similarly configured to compare LPMD(2)–LPMD(4) with corresponding bits from LPMB2–LPMB4 and generate result signals R2(1)–R2(4) through R32(1)–R32(4), respectively.

AND gates 2506(1)–2506(4) generate MTCH(1)–MTCH(4), respectively. Each AND gates receives a compare result signal from one of the XNOR gates from each of the XNOR circuit blocks. For example, AND gate 2506(1) receives R1(1)–R32(1); AND gate 2506(2) receives R1(2)–R32(2); AND gate 2506(3) receives R1(3)–R32(3); and AND gate 2506(4) receives R1(4)–R32(4). The result signals provide an indication of which block prefixes LPMB1–LPMB4 match LPMD. For example, the result signals R1(1)–R1(32) that are all in a high logic state indicate that block prefix LPMB1 matches LPMD.

Figure 26:
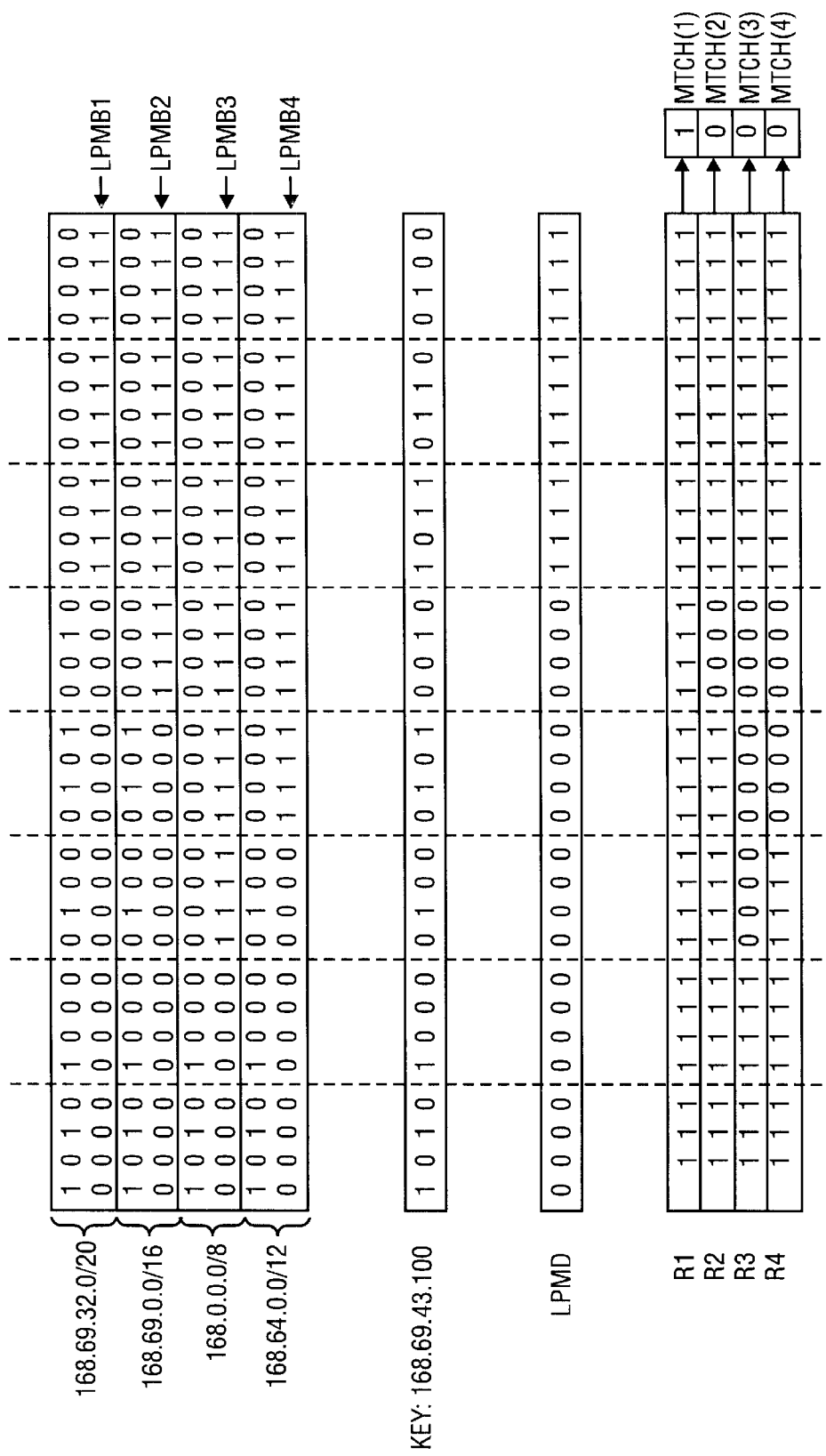
FIG. 26 is one example of the operation of the block-bit compare circuitry of FIG. 24.

An example of the operation of the block-bit compare circuitry 2500 is shown in FIG. 26. In this example, each of CAM array blocks 302(1)–302(4) has a CIDR address that matches the search key 168.69.43.100. The highest priority matching CIDR addresses (i.e., the ones with the longest matching prefix or block prefix) are shown as 168.69.32.0/20 for block 302(1), 168.69.0.0/16 for block 302(2), 168.0.0.0/8 for block 302(3), and 168.64.0.0/12 for block 302(4). AND logic 2302 logically ANDs LPMB1–LPMB4 on a bit-for-bit basis to generate LPMD of 00000000000000000000111111111111. The XNOR circuit blocks then determine that LPMB1 is the longest block prefix by setting R1(1)–R1(32) to all logic one states such that AND gate 2506(1) sets MTCH(1) to a high logic state. Conversely, the XNOR circuit blocks also determine that LPMB2–LPMB4 are not the longest block prefixes by setting at least one bit of each of R2(1)–R2(32), R3(1)–R3(32) and R4(1)–R4(32) to a low logic state such that MTCH(2)–MTCH(4) are low logic states. If more than one of LPMB1–LPMB4 have identical matching entries and block prefixes, then more than one MTCH signal will be asserted to a high logic state and priority encoder 2308 will determine which CAM array block has the highest priority.

Figure 27:
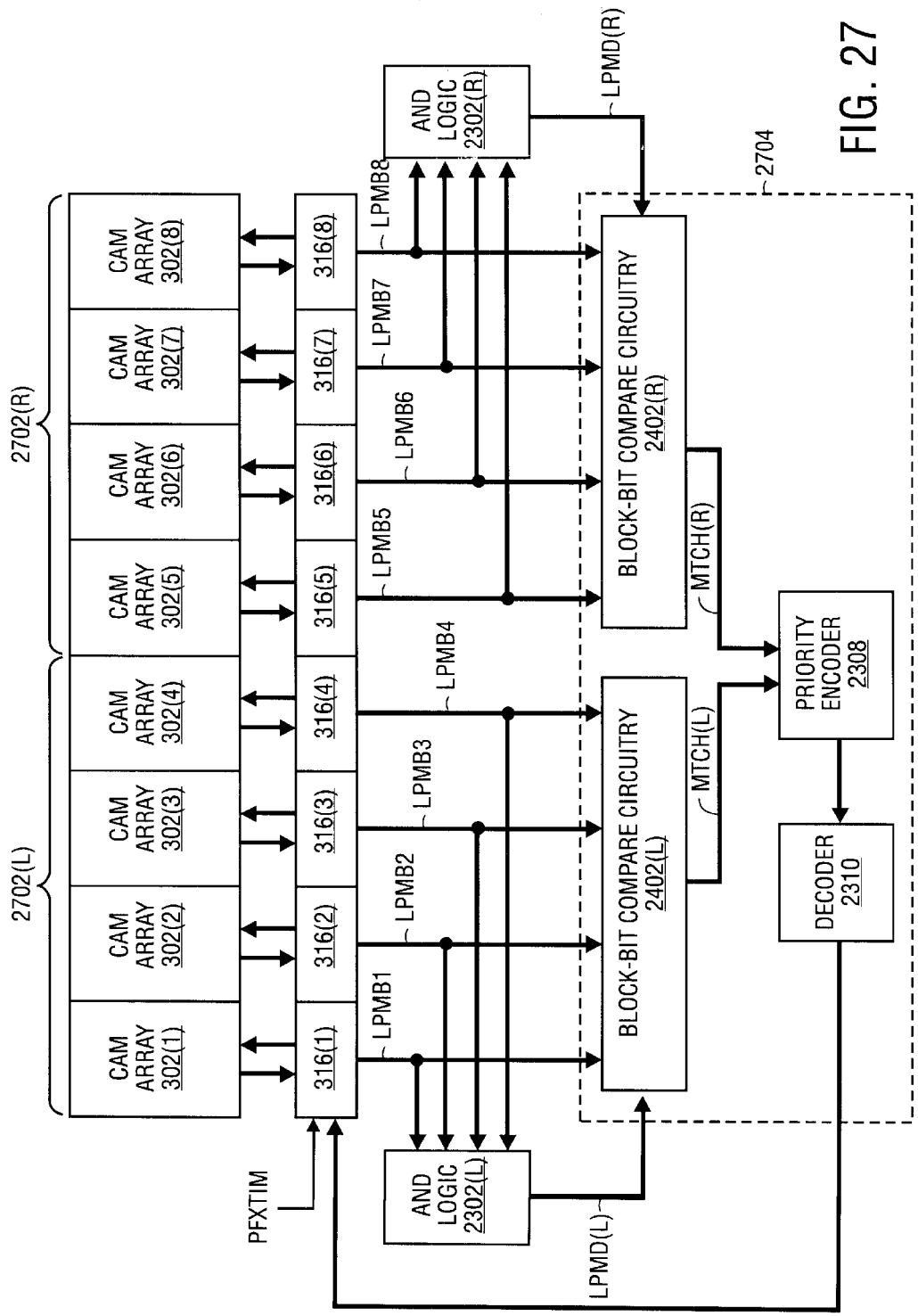
FIG. 27 is a block diagram of one embodiment of two groups of longest prefix match circuitry and block select circuitry of FIG. 24.

As described previously, the segmentation of CAM arrays can be further extended to include groups of CAM array blocks. FIG. 27 shows one example of extending the embodiment of FIG. 24 to include groups of CAM array blocks. As shown in FIG. 27, a left CAM array block group 2702(L) and a right CAM array block group 2702(R) provide block prefixes to left and right AND logic blocks 2302(L) and 2302(R), respectively. AND logic 2302(L) generates a longest block prefix LPMD(L) for the left group of CAM array blocks, and AND logic 2302(R) generates a longest block prefix LPMD(R) for the right group of CAM array blocks. Block select circuit 2704 includes block-bit compare circuit 2402(L) that generates MTCH(L) signals in response to LPMD(L) and block prefixes LPMB1–LPMB4. Block select circuit 2704 also includes block-bit compare circuit 2402(R) that generates MTCH(R) signals in response to LPMD(R) and block prefixes LPMB5–LPMB8. Priority encoder 2308 and decoder 2310 translate the MTCH signals into block select signals BSEL that indicate which block prefix is the longest block prefix. The block select signals BSEL also enable the longest block prefix to be provided to the appropriate CAM array block for comparison with the prefix mask data stored in that CAM array block.

For an alternative embodiment, additional compare circuitry(e.g., AND logic or OR logic) may be included to compare LPMD(L) and LPMD(R) and generate a composite longest block prefix that is the longest block prefix for the entire CAM array 302. The composite longest block prefix may then be provided to the CAM array blocks. For example, the composite longest block prefix may be provided to data drivers of each CAM array block, and the block select signals BSEL may control whether the composite longest block prefix is provided by the data drivers to the mask compare lines.

Block select circuit 2704 includes one priority encoder logic block 2308 that determines the highest priority block prefix. FIG. 28 shows another embodiment of a block select circuit in which separate priority encoders 2308(L) and 2308(R) are used for each of the left and right block-bit compare circuits. As shown in FIG. 28, block select circuit 2804 includes multiplexer 2812 that selects either the encoded MTCH signals (EMTCH(L) and EMTCH(R)) output from priority encoder 2308(L) or 2308(R) to provide to decoder 2310 in response to a select signal SEL. Select logic 2810 generates SEL in response to MTCH(C) signals output by block-bit compare circuitry 2806. Block-bit compare circuitry 2806 compares LPMD(L) and LPMD(R) on a bit-by-bit basis with a composite block prefix LPMD(C). For one embodiment, block-bit compare circuitry 2806 may include XNOR circuit blocks and AND gates as shown in FIG. 25. LPMD(C) is a composite block prefix of LPMD(L) and LPMD(R) that represents the longest block prefix for the entire CAM array 302. The MTCH(C) signals output by block-bit compare circuitry 2806 indicate whether LPMD(L) or LPMD(R) has the longest block prefix or whether they are the same. Select logic 2810 encodes the MTCH(C) signals into the SEL to select the encoded MTCH(L) or MTCH(R) signals to provide to decoder 2310. Additionally, SEL is provided as a bit of the encoded signals input to decoder 2310.

For the example shown in FIG. 28, there are two groups of four CAM array blocks. Block-bit compare circuitry 2402(L) outputs on four MTCH(L) signal lines an indication of which block prefix is the longest in the group LPMB1–LPMB4. Priority encoder 2308(L) encodes the four MTCH(L) signals to two EMTCH(L) signals, and provides them to multiplexer 2812. Similarly, Block-bit compare circuitry 2402(R) outputs on four MTCH(R) signal lines an indication of which block prefix is the longest in the group LPMB5–LPMB8. Priority encoder 2308(R) encodes the four MTCH(R) signals to two EMTCH(R) signals, and provides them to multiplexer 2812. Multiplexer 2812 provides either the two EMTCH(L) signals or the two EMTCH(R) signals to decoder 2310 to determine the BSEL signals. The two signals output by multiplexer 2812, however, are not enough for decoder 2310 to determine eight block select signals for the eight CAM array blocks 302(1)–302(8). SEL is the third signal provided to decoder 2310 such that decoder 2310 can generate eight BSEL signals. Thus, SEL provides a dual-role of selecting whether EMTCH(L) or EMTCH(R) is output by multiplexer 2812, and being the third encoded bit provided to decoder 2810.

Any logic or circuits may be used to implement select logic 2810 to generate SEL. Table 2 shows one example of a truth table for implementing select logic 2810. Other truth tables may be used (and corresponding logic generated accordingly) including those that logically complement one of more or the signals indicated in Table 2.

TABLE 2

| MTCH (C) (1) | MTCH (C) (2) | SEL |
| --- | --- | --- |
| 0 | 0 | X |
| 0 | 1 | 1 |
| 1 | 0 | 0 |
| 1 | 1 | 0 |

MTCH(C)(1) indicates whether LPMD(L) matches LPMD(C), and MTCH(C)(2) indicates whether LPNFD(R) matches LPMD(C). If MTCH(C)(1) is in a high logic state, then one of block prefixes LPMB1–LPMB4 is the longest block prefix and SEL is set to a low logic state. If, however, MTCH(C)(1) is in a low logic state and MTCH(C)(2) is in a high logic state, then one of block prefixes LPMB5–LPMB8 is the longest block prefix and SEL is set to a high logic state. When MTCH(C)(1) and MTCH(C)(2) are both in a low logic state, a compare operation is not being performed, and SEL may be any logic state. Any logic or circuitry may be used to implement the truth table of Table 2.

The embodiment illustrated in FIG. 28 may be extended to groups having any number of CAM array blocks, or to any number of groups of CAM array blocks.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A ternary content addressable memory (CAM) device comprising:

a first ternary CAM array block having a plurality of rows of CAM cells coupled to a corresponding row of mask cells and a first plurality of signal lines to provide first mask data from one of the rows of mask cells;

a second ternary CAM array block having a plurality of rows of CAM cells coupled to a corresponding row of mask cells and a second plurality of signal lines to provide second mask data from one of the rows of mask cells;

means for determining that the first mask data indicates more unmasked bits than the second mask data; and means for selecting the first ternary CAM array block to compare the first mask data with mask data stored in its plurality of rows of mask cells.

2. The ternary CAM device of claim 1, wherein the selecting means further comprises means for deselecting the second ternary CAM array block from comparing the second mask data with mask data stored in its plurality of rows of mask cells.

3. The ternary CAM device of claim 1, wherein the determining means determines that the first mask data indicates more contiguous unmasked bits than the second masked data.

4. The ternary CAM device of claim 1, wherein the determining means comprises compare circuitry configured to compare the first and second mask data.

5. A ternary content addressable memory (CAM) device comprising:

a plurality of ternary CAM array blocks each having a plurality of rows of ternary CAM cells coupled to a plurality of signal lines that provide mask data from one of the rows of ternary CAM cells; and compare circuitry having inputs coupled to receive the mask data from each of the plurality of signal lines, and having outputs to provide an indication of the mask data that indicates the most unmasked bits.

6. The ternary CAM device of claim 5, further comprising a block select circuit coupled to receive the indication from the compare circuitry, the block select circuit having outputs to provide a plurality of select signals to select one of the plurality of ternary CAM array blocks.

7. The ternary CAM device of claim 6, wherein the selected CAM array block is configured to compare its mask data provided to the compare circuitry with mask data stored in its plurality of rows of ternary CAM cells.

8. The ternary CAM device of claim 6, wherein the compare circuitry provides an indication of the mask data that indicates the largest number of contiguous unmasked bits.

9. The ternary CAM device of claim 5, wherein each of the plurality of ternary CAM array blocks comprises circuitry to identify which rows of ternary CAM cells stores data matches comparand data and has the most unmasked bits.

10. A ternary content addressable memory (CAM) device comprising:

a plurality of ternary CAM array blocks each having a plurality of rows of CAM cells coupled to a corresponding row of mask cells and a plurality of signal lines that provide mask data from one of the rows of mask cells;

compare circuitry having inputs coupled to receive the mask data from each of the plurality of signal lines, and having outputs to provide composite mask data, wherein the composite mask data comprises the mask data that indicates the most unmasked bits; and a block select circuit having inputs coupled to the compare circuitry to receive the composite mask data, the block select circuit having outputs to provide a plurality of select signals to select one of the plurality of CAM array blocks.

11. The ternary CAM device of claim 10, wherein the selected CAM array block is configured to compare its mask data provided to the compare circuitry with mask data stored in its plurality of rows of mask cells.

12. The ternary CAM device of claim 10, wherein the compare circuitry provides the mask data that indicates the largest number of contiguous unmasked bits.

13. The ternary CAM device of claim 10, wherein the compare circuitry comprises a plurality of logic gates for logically combining the mask data from each of the plurality of signal lines of the CAM array blocks to form the composite mask data.

14. The ternary CAM device of claim 10, wherein the block select circuit comprises:

a plurality of compare circuits each having first inputs to receive the composite mask data, second inputs to receive mask data from a respective one of the plurality of ternary CAM array blocks, and an output to provide a signal indicating whether the composite mask data matches the mask data received from a respective one of the plurality of ternary CAM array blocks.

15. The ternary CAM device of claim 14, wherein the block select circuit further comprises:

an encoder having a plurality of inputs each coupled to receive one of the signals output by one of the plurality of compare circuits, and having a plurality of outputs; and a decoder having inputs coupled to the outputs of the encoder, and outputs to provide the plurality of select signals.

16. The ternary CAM device of claim 10, wherein the block select circuit comprises:

a plurality of compare circuits each having a first input coupled to receive one bit from the composite mask data, a plurality of second inputs each coupled to receive one bit of the mask data provided by each of the plurality of signal lines from each ternary CAM array block, and an output to provide a signal indicating whether the composite mask data matches the mask data received from the plurality of ternary CAM array blocks.

17. The ternary CAM of claim 16, wherein the plurality of compare circuits comprise exclusive OR (XOR) gates.

18. The ternary CAM of claim 17, wherein the plurality of compare circuits further comprise AND gates coupled to the XOR gates.

19. The ternary CAM of claim 16, wherein the block select circuit further comprises:

an encoder having a plurality of inputs each coupled to receive one of the signals output by one of the plurality of compare circuits, and having a plurality of outputs; and a decoder having inputs coupled to the outputs of the encoder, and outputs to provide the plurality of select signals.

20. A ternary content addressable memory (CAM) device comprising:

a first group of ternary CAM array blocks, each ternary CAM array block having a plurality of rows of CAM cells coupled to a corresponding row of mask cells and a plurality of signal lines that provide mask data from one of the rows of mask cells;

a second group of ternary CAM array blocks, each ternary CAM array block having a plurality of rows of CAM cells coupled to a corresponding row of mask cells and a plurality of signal lines that provide mask data from one of the rows of mask cells;

first compare circuitry having inputs coupled to receive mask data from each of the plurality of signal lines of the CAM array blocks in the first group, and having outputs to provide first composite mask data, wherein the first composite mask data comprises the mask data from the plurality of CAM array blocks in the first group that indicates the most unmasked bits;

second compare circuitry having inputs coupled to receive mask data from each of the plurality of signal lines of the CAM array blocks in the second group, and having outputs to provide second composite mask data, wherein the second composite mask data comprises the mask data from the plurality of CAM array blocks in the second group that indicates the most unmasked bits; and a block select circuit having first inputs coupled to the first compare circuitry to receive the first composite mask data, second inputs coupled to the second compare circuitry to receive the second composite mask data, third inputs to receive mask data from each of the plurality of ternary CAM array blocks in each of the first and second groups, and outputs to provide a plurality of select signals to select one of the plurality of CAM array blocks.

21. The ternary CAM device of claim 20, wherein the selected CAM array block is configured to compare its mask data provided to the first or second compare circuitry with mask data stored in its plurality of rows of mask cells.

22. The ternary CAM device of claim 20, wherein the first composite mask data comprises the mask data from the plurality of CAM array blocks in the first group that indicates the largest number of contiguous unmasked bits.

23. The ternary CAM device of claim 20, wherein the second composite mask data comprises the mask data from the plurality of CAM array blocks in the second group that indicates the largest number of contiguous unmasked bits.

24. The ternary CAM device of claim 23, wherein the block select circuit comprises:

a first plurality of compare circuits each having inputs coupled to receive one bit from the first composite mask data and one bit from the mask data provided by each of the plurality of signal lines of the ternary CAM array blocks in the first group, and each further having an output to provide a signal indicating whether the first composite mask data matches the mask data received from the plurality of ternary CAM array blocks in the first group;

a second plurality of compare circuits each having inputs coupled to receive one bit from the second composite mask data and one bit from the mask data provided by each of the plurality of signal lines of the ternary CAM array blocks in the second group, and each further having an output to provide a signal indicating whether the second composite mask data matches the mask data received from the plurality of ternary CAM array blocks in the second group; and a third plurality of compare circuits each having inputs coupled to receive one bit from the first composite mask data, one bit from the second composite mask data, and one bit from the third composite mask data, and each further having an output to provide a signal indicating whether the third composite mask data matches the first composite mask data or the second composite mask data;

a first encoder having a plurality of inputs each coupled to receive one of the signals output by one of the first plurality of compare circuits, and having a plurality of outputs;

a second encoder having a plurality of inputs each coupled to receive one of the signals output by one of the second plurality of compare circuits, and having a plurality of outputs;

select logic having inputs coupled to the outputs of the third plurality of compare circuits, and having an output to provide a multiplexer select signal;

a multiplexer having first inputs coupled to the plurality of outputs of the first encoder, second inputs coupled to the plurality of outputs of the second encoder, a select input coupled to receive the multiplexer select signal, and a plurality of outputs; and a decoder having inputs coupled to the plurality of outputs of the multiplexer and the output of the select logic, and outputs to provide the plurality of select signals.

25. The ternary CAM device of claim 24, wherein the block select circuit comprises:
- a first encoder having a plurality of inputs each coupled to receive one of the signals output by one of the first plurality of compare circuits, and having a plurality of outputs;
- a second encoder having a plurality of inputs each coupled to receive one of the signals output by one of the second plurality of compare circuits, and having a plurality of outputs;
- select logic having inputs coupled to the outputs of the third plurality of compare circuits, and having an output to provide a multiplexer select signal;
- a multiplexer having first inputs coupled to the plurality of outputs of the first encoder, second inputs coupled to the plurality of outputs of the second encoder, a select input coupled to receive the multiplexer select signal, and a plurality of outputs; and
- a decoder having inputs coupled to the plurality of outputs of the multiplexer and the output of the select logic, and outputs to provide the plurality of select signals.

26. The ternary CAM device of claim 20, wherein the first compare circuitry comprises a first plurality of logic gates for logically combining the mask data from each of the plurality of signal lines of the CAM array blocks in the first group to form the first composite mask data, and wherein the second compare circuitry comprises a second plurality of logic gates for logically combining the mask data from each of the plurality of signal lines of the CAM array blocks in the second group to form the second composite mask data.

27. The ternary CAM device of claim 20, wherein the block select circuit comprises:
- a first plurality of compare circuits each having inputs coupled to receive one bit from the first composite mask data and one bit from the mask data provided by each of the plurality of signal lines of the ternary CAM array blocks in the first group, and each further having an output to provide a signal indicating whether the first composite mask data matches the mask data received from the plurality of ternary CAM array blocks in the first group;
- a second plurality of compare circuits each having inputs coupled to receive one bit from the second composite mask data and one bit from the mask data provided by each of the plurality of signal lines of the ternary CAM array blocks in the second group, and each further having an output to provide a signal indicating whether the second composite mask data matches the mask data received from the plurality of ternary CAM array blocks in the second group;
- an encoder having a first plurality of inputs each coupled to receive one of the signals output by one of the first plurality of compare circuits, a second plurality of inputs each coupled to receive one of the signals output by one of the second plurality of compare circuits, and having a plurality of outputs; and
- a decoder having inputs coupled to the outputs of the encoder, and outputs to provide the plurality of select signals.

28. The ternary CAM device of claim 20, further comprising third compare circuitry having first inputs coupled to receive the first composite mask data, second inputs coupled to receive the second composite mask data, and outputs to provide third composite mask data to the block select circuit, wherein the third composite mask data comprises the mask data from the first and second composite mask data that indicates which ternary CAM array block in the first or second group has mask data with the most unmasked bits.

29. A method of operating a ternary content addressable memory (CAM) device having first and second ternary CAM array blocks, comprising:
- determining first mask data for a row of CAM cells in the first ternary CAM array block that stores data matching comparand data;
- determining second mask data for a row of CAM cells in the second ternary CAM array block that stores data matching the comparand data;
- determining that the first mask data indicates more unmasked bits than the second mask data; and
- determining a location of the first mask data in the first ternary CAM array block.

30. The method of claim 29, wherein determining the location of the first mask data in the first ternary CAM array block comprises:
- selecting the first ternary CAM array block; and
- comparing the first mask data with mask data stored in rows of mask cells, each row of mask cells coupled to a corresponding row of CAM cells in the first ternary CAM array block.

31. The method of claim 30, further comprising deselecting the second ternary CAM array block.

32. The method of claim 30, further comprising determining logical states of a plurality of match lines in response to the comparing of the first mask data with data stored in the rows of mask cells.

33. The method of claim 29, wherein the rows of CAM cells in the first and second ternary CAM arrays store Internet Protocol (IP) addresses.

34. The method of claim 33, wherein the first and second mask data comprise prefix mask data for the IP addresses.

35. The method of claim 29, wherein determining that the first mask data indicates more unmasked bits comprises logically combining the first and second mask data.

36. The method of claim 29, wherein determining that the first mask data indicates more unmasked bits comprises logically combining the first and second mask data to form composite mask data, and wherein determining a location of the first mask data in the first ternary CAM array block comprises:
- determining that the composite mask data is the first mask data from the first ternary CAM array block;
- selecting the first ternary CAM array block; and
- comparing the first mask data with mask data stored in rows of mask cells, each row of mask cells coupled to a corresponding row of CAM cells in the first ternary CAM array block.

37. A method of determining the location of an entry in one of plurality of ternary content addressable memory CAM array blocks, each CAM array block having a plurality of ternary CAM cells, wherein the located entry has the most unmasked bits among the CAM cells of all CAM array blocks, the method comprising:
- determining which locations in each CAM array block match comparand data;
- determining the largest number of unmasked bits among the matching entries in each ternary CAM array block;
- comparing the largest numbers of unmasked bits from each of the ternary CAM array blocks to select one of the largest numbers of unmasked bits; and
- comparing the selected largest number of unmasked bits with mask data stored in the ternary CAM array block associated with the selected largest number of unmasked bits.

* * * * *